(12) United States Patent
Webster et al.

(10) Patent No.: US 8,114,567 B2
(45) Date of Patent: Feb. 14, 2012

(54) POLYOL PHOTOSENSITIZERS, CARRIER GAS UV LASER ABLATION SENSITIZERS, AND OTHER ADDITIVES AND METHODS FOR MAKING AND USING SAME

(75) Inventors: Dean C. Webster, Fargo, ND (US); Zhigang Chen, Fargo, ND (US)

(73) Assignee: NDSU Research Foundation, Fargo, ND (US)

( * ) Notice: Subject to any disclaimer, the term of this patent is extended or adjusted under 35 U.S.C. 154(b) by 473 days.

(21) Appl. No.: 12/226,555

(22) PCT Filed: Apr. 21, 2007

(86) PCT No.: PCT/US2007/009687
§ 371 (c)(1),
(2), (4) Date: Oct. 21, 2008

(87) PCT Pub. No.: WO2007/124073
PCT Pub. Date: Nov. 1, 2007

(65) Prior Publication Data
US 2009/0184417 A1   Jul. 23, 2009

Related U.S. Application Data

(60) Provisional application No. 60/793,913, filed on Apr. 21, 2006, provisional application No. 60/793,768, filed on Apr. 21, 2006.

(51) Int. Cl.
*G03F 7/00* (2006.01)
*G03F 7/004* (2006.01)
*C07D 303/00* (2006.01)
*A01N 43/20* (2006.01)
*A01N 43/24* (2006.01)

(52) U.S. Cl. ............ 430/270.1; 430/913; 549/547; 514/475

(58) Field of Classification Search ........ 430/270.1, 430/913; 549/547; 514/475
See application file for complete search history.

(56) References Cited

U.S. PATENT DOCUMENTS
3,907,865 A   9/1975   Miyata et al.
6,106,999 A   8/2000   Ogiso et al.
(Continued)

FOREIGN PATENT DOCUMENTS
JP   2002309139 A * 10/2002
(Continued)

OTHER PUBLICATIONS

Blanchet, "Laser ablation and the unzipping of addition polymer," Oct. 1, 1996 *J. Appl. Phys.* 80(7):4082-4089.
(Continued)

*Primary Examiner* — Amanda C. Walke
(74) *Attorney, Agent, or Firm* — Mueting, Raasch & Gebhardt, P.A.

(57) ABSTRACT

Disclosed are photosensitizers that include a polyol moiety covalently bonded to a fused aromatic moiety. Also disclosed is a method for improving UV laser ablation performance of a coating, such as a cationic UV curable coating, by incorporating an oxalyl-containing additive into the cationic UV curable or other coating. Oxalyl-containing sensitizers having the formula Q-O—C(O)—C(O)—O—$R^1$, wherein Q represents a fused aromatic moiety and R1 is an alkyl or aryl group, are also disclosed, as are oxalyl-containing oxetane resins, oxalyl-containing polyester polyols, and cationic UV curable coating formulations that include oxalyl-containing additives.

36 Claims, 13 Drawing Sheets

U.S. PATENT DOCUMENTS

| | | | |
|---|---|---|---|
| 6,417,025 | B1 | 7/2002 | Gengel |
| 6,566,744 | B2 | 5/2003 | Gengel |
| 6,593,388 | B2 | 7/2003 | Crivello |
| 6,816,380 | B2 | 11/2004 | Credelle et al. |
| 6,863,701 | B2 | 3/2005 | Crivello |
| 7,902,305 | B2 * | 3/2011 | Kong .......................... 525/523 |
| 2002/0025991 | A1 | 2/2002 | Crivello |
| 2002/0153606 | A1 | 10/2002 | Gengel |
| 2003/0176519 | A1 | 9/2003 | Crivello |
| 2003/0214792 | A1 | 11/2003 | Credelle et al. |
| 2006/0264529 | A1 * | 11/2006 | Sasa .............................. 522/170 |

FOREIGN PATENT DOCUMENTS

WO    WO 2008111640 A1 * 9/2008

OTHER PUBLICATIONS

Chen et al., "Synthesis of multihydroxyl branched polyethers by cationic copolymerization of 3,3-Bis(hydroxymethyl)oxetane and 3-ethyl-3-(hydroxymethyl)oxetane," 2002 *J. Polymer Sci, Part A: Polymer Chem.* 40(12):1991-2002.

Chen et al., "Study of cationic UV curing and UV laser ablation behavior of coatings sensitized by novel sensitizers," May 17, 2006 *Polymer* 47(11):3715-3726. Available online Apr. 18, 2006.

Chen and Webster, "Synthesis and study of novel polyol-bound photosensitizers for cationic UV-curable systems," Aug. 1, 2006 *J. Polym. Sci. Part A: Polym. Chem.*, 44(15):4435-4449. Available online on Jun. 20, 2006.

Chen and Webster, "Novel intramolecular hydrogen abstraction photosensitizers (IHA-PS) for cationic UV curable systems," Conference Proceedings Paper. Presented at the *RadTech & e\5 UV & EB Technology Expo & Conference.* Chicago, Illinois; Apr. 24-26, 2006.

Chen et al., "Carrier gas UV laser ablation sensitizers for photopolymerized thin films," 2007 *J. Photochem. Photobiol. A: Chem.* 185(2-3):115-126. Available online on Jul. 7, 2006.

Cho et al., "Dual curing of cationic UV-curable clear and pigmented coating systems photosensitized by thioxanthone and anthracene," Sep. 2003 *Polymer Testing* 22(6):633-645. Available online on Feb. 13, 2003.

Crivello, "Photoinitiated cationic polymerization," Aug. 1983 *Ann. Rev. Mater. Sci.* 13:173-190.

Crivello et al., "Preparation and cationic photopolymerization of organic-inorganic hybrid matrixes," 1997 *Chem. Mater.* 9(7):1562-1569. Abstract published ahead of print in Advance ACS Abstracts on Jun. 1, 1997.

Crivello et al., "Visible and long-wavelength photoinitiated cationic polymerization," Feb. 1, 2001 *J. Polymer Sci., Part A: Polymer Chem.* 39(3):343-356. Available online on Dec. 19, 2000.

Crivello et al., "Development of pyrene photosensitizers for cationic photopolymerizations," 2002 *Chem. Mater.* 14(11):4858-4866. Available online on Oct. 15, 2002.

Crivello et al., "Anthracene electron-transfer photosensitizers for onium salt induced cationic photopolymerizations," Jul. 14, 2003 *J. Photochem. Photobiol. A: Chemistry* 159(2):173-185. Available online on May 21, 2003.

Crivello et al., "Curcumin: a naturally occurring long-wavelength photosensitizer for diaryliodonium salts," Nov. 1, 2005 *J. Polymer Sci. Part A: Polymer Chem.* 43(21):5217-5231. Available online on Sep. 23, 2005.

Fukumura et al., "The mechanism of dopant-induced laser ablation. Possibility of cyclic multiphotonic absorption in excited states," Apr. 29, 1994 *Chem. Phys. Lett.* 221(5-6):373-378.

Goldberg and Eaton, "Caprolactone polyols as reactive diluents for high-solids," Nov. 1992 *Modern Paint and Coatings* 82:36, 39-40, 42.

Gomurashvili et al., "Phenothiazine photosensitizers for onium salt photoinitiated cationic polymerization," Apr. 15, 2001 *J. Polymer Sci. Part A: Polymer Chem.* 39(8):1187-1197. Available online on Feb. 28, 2001.

Hua et al., "Photosensitized onium-salt-induced cationic polymerization with hydroxymethylated polynuclear aromatic hydrocarbons," 2002 *Chem. Mater.* 14(5):2369-2377. Available online on Apr. 5, 2002.

Jang et al., "Synthesis and cationic photopolymerization of epoxy-functional siloxane monomers and oligomers," Oct. 1, 2003 *J. Polymer Sci. Part A: Polymer Chem.* 41(19):3056-3073. Available online on Aug. 20, 2003.

Kasapoglu et al., "Photosensitized cationic polymerization of cyclohexene oxide using a phenacylanilinium salt," 2002 *Macromol. Rapid Comm.* 23(9):567-570.

Koleske et al., "UV-cured cycloaliphatic epoxide coatings," presented at the 14th National SAMPE® Technical Conference held Oct. 12-14, 1982; *National Society for the Advancement of Material and Process Engineering (SAMPE®) Technical Conference Proceedings* 14:249-256.

Koleske et al., "Technology of cationic, UV-cured cycloaliphatic epoxides," presented at the 16th National SAMPE® Technical Conference held Oct. 9-11, 1984 *National Society for the Advancement of Material and Process Engineering (SAMPE®) Technical Conference Proceedings* 16:529-536.

Krüger et al., "Femtosecond-pulse visible laser processing of transparent materials," 1996 *Appl. Surface Sci.* 96-98:430-438.

Krüger et al., "Ultrashort pulse laser interaction with dielectrics and polymers," 2004 *Adv. Polymer Sci.* 168:247-289.

Kunz et al., "Photoablation and microstructuring of polyestercarbonates and their blends with a XeCl excimer laser," 1998 *Appl. Phys. A.* 67(3):347-352.

Lazauskaite et al., "Cationic photoinduced polymerization. Photoinitiators and monomers," 2002 *Environmental and Chemical Physics* 24(2):98-117.

Lippert et al., "Chemical and spectroscopic aspects of polymer ablation: special features and novel directions," 2003 *Chem. Rev.* 103(2):453-485. Available online on Jan. 4, 2003.

Lippert et al., "Fundamentals and applications of polymers designed for laser ablation," 2003 *Appl. Phys. A.* 77(2):259-264. Available online on May 28, 2003.

Lippert, "Laser application of polymers," 2004 *Adv. Polymer Sci.* 168:51-246.

Moorjani et al., "Effect of viscosity on the rate of photosensitization of diaryliodonium salts by anthracene," in Scranton et al., (Eds.). *Photopolymerization: Fundamentals and Applications, No. 673, ACS Symposium Series.* Published on Nov. 1, 1997. Symposium held in New Orleans, LA: Mar. 24-28, 1996. Oxford University Press: New York, NY; 1997. Title page, publishers page, and pp. 95-106.

Nelson et al., "Photosensitization of cationic photopolymerizations by anthracene and its derivatives," Paper presented at the American Chemical Society Division of Polymeric Materials: Science and Engineering 1993 Fall Meeting; held in Chicago, IL. Proceedings published in: 1993 *Polym. Mater. Sci. Engin.* 69:363-364.

Nuyken et al., "Excimer laser ablation of triazene-containing polyesters with different topologies," 1998 *Acta Polymer* 49(8):427-432.

Pappas et al. "Photoinitiation of cationic polymerization. III. Photosensitization of diphenyliodonium and triphenylsulfonium salts," 1984 *J. Polymer Sci.: Polymer Chemistry Ed.* 22(1):77-84.

Pugmire et al., "Surface characterization of laser-ablated polymers used for microfluidics," Feb. 15, 2002 *Anal. Chem.* 74(4):871-878. Available online on Jan. 9, 2002.

Sangermano et al., "Coatings obtained through cationic UV curing of epoxide systems in the presence of epoxy functionalized polybutadiene," 2002 *J. Mater. Sci.* 37(22):4753-4757.

Sangermano et al., "Visible and long-wavelength cationic photopolymerization," in Belfield et al. (Eds.) *Photoinitiated Polymerization, No. 847 of the ACS Symposium Series.* Oxford University Press: New York, NY; 2003. Title page, publishers page, and pp. 242-252.

Serafetinides et al., "Ultra-short pulsed laser ablation of polymers," 2001 *Appl. Surface Sci.* 180(1-2):42-56.

Soucek and Chen , "Model for the effects of water on the cationic UV-curing of cyclohexyl epoxides," Feb. 1, 2003 *J. Coatings Tech.* 75(937):49-58.

* cited by examiner

CG-(1-Na-OH) at pulse 16

CG-(Na-MOC) at pulse 2

CG-(P-Na) at pulse 4

CG-(P-MOC+1-Na-OH) at pulse 1

CG-(P-MOC-Na) at pulse 1

POLYOL PHOTOSENSITIZERS, CARRIER GAS UV LASER ABLATION SENSITIZERS, AND OTHER ADDITIVES AND METHODS FOR MAKING AND USING SAME

The present application claims the benefit of U.S. Provisional Patent Application Ser. No. 60/793,768, filed Apr. 21, 2006, and of U.S. Provisional Patent Application Ser. No. 60/793,913, filed Apr. 21, 2006, which provisional patent applications are hereby incorporated by reference.

Certain aspects of the present invention were made with the support of the Department of Defense's Defense Microelectronics Activity Grant Nos. DMEA H94003-04-2-0406 and DMEA H94003-06-2-0601; and certain aspects of the present invention were made with the support of the Department of Defense's Defense Microelectronics Activity Grant Nos. DMEA 90-03-2-0303 and DMEA 90-02-C-0224. The Federal Government has certain rights in the present invention.

FIELD OF THE INVENTION

The present invention relates, generally, to polymer films and to additives that can be used in such polymer films and, more particularly, to polyol photosensitizers, carrier gas UV laser ablation sensitizers, and other additives that can be used in the preparation of such polymer films.

BACKGROUND OF THE INVENTION

In recent years, a significant amount of research and development effort has focused on improving methods for preparing polymeric materials and on polymeric materials having improved laser ablation properties.

Illustratively, cationic UV curable systems have received considerable attention and are experiencing rapid development due to advantages, such as lack of oxygen inhibition, low energy requirement, a solvent free process, and high polymerization rate (Lazauskaite et al., "Cationic Photoinduced Polymerization. Photoinitiators and Monomers," Environmental and Chemical Physics, 24(2): 98-117 (2002) ("Lazauskaite"); and Sangermano et al., "Coatings Obtained Through Cationic UV Curing of Epoxide Systems in the Presence of Epoxy Functionalized Polybutadiene," J. Mater. Sci., 37(22):4753-4757 (2002), which are hereby incorporated by reference). Among the many monomer-photoinitiator combinations for cationic UV curable formulations, the combination of cycloaliphatic epoxide monomer and onium salt (especially sulfonium salt photoinitiators) have been widely explored since these are believed to provide, for example, higher reactivity, higher thermal stability, and good coating properties (Lazauskaite; Crivello et al., "Preparation and Cationic Photopolymerization of Organic-Inorganic Hybrid Matrixes," Chem. Mater., 9(7):1562-1569 (1997); and Crivello, "Photoinitiated Cationic Polymerization," Ann. Rev. Mater. Sci., 13:173-190 (1983) ("Crivello I"), which are hereby incorporated by reference). However, the curing speed and reactive functional group conversion for these cationic UV curable systems are still not as high as free radical systems (Lazauskaite, which is hereby incorporated by reference). It is believed that one of the important reasons for this is that the onium salt photoinitiators have a confined absorption in the long wavelength region of the UV spectrum. Thus, much of the energy emitted by broadband light sources, such as the commonly used mercury arc lamps, is wasted (Crivello et al., "Anthracene Electron-Transfer Photosensitizers for Onium Salt Induced Cationic Photopolymerizations," Journal of Photochemistry and Photobiology A: Chemistry, 159 (2):173-188 (2003) ("Crivello II"), which is hereby incorporated by reference). To overcome this drawback, the addition of photosensitizers may be used to extend the sensitivity of the coating system at longer UV wavelengths (Crivello et al., "Visible and Long-Wavelength Photoinitiated Cationic Polymerization," Journal of Polymer Science: Part A: Polymer Chemistry, 39(3):343-356 (2001); Gomurashvili et al., "Phenothiazine Photosensitizers for Onium Salt Photoinitiated Cationic Polymerization," Journal of Polymer Science. Part A: Polymer Chemistry, 39(8):1187-1197 (2001); and Sangermano et al., "Visible and Long-Wavelength Cationic Photopolymerization," pp. 242-252 in Belfield et al., eds., Photoinitiated Polymerization, No. 847, ACS Symposium Series, New York: Oxford University Press (2003), which are hereby incorporated by reference). Electron transfer photosensitization is considered the most efficient and generally applicable process for onium salt photoinitiators, which is in essence a photoinduced redox process (Crivello II; Pappas et al., "Photoinitiation of Cationic Polymerization. III. Photosensitization of Diphenyliodonium and Triphenylsulfonium Salts," Journal of Polymer Science: Polymer Chemistry Ed., 22(1): 77-84 (1984); and Kasapoglu et al., "Photosensitized Cationic Polymerization of Cyclohexene Oxide Using a Phenacylanilinium Salt," Macromolecular Rapid Communications, 23(9):567-570 (2002) ("Kasapoglu"), which are hereby incorporated by reference). A generalized photosensitization mechanism for onium salts is shown in Scheme 1 (Crivello II, which is hereby incorporated by reference) using a diaryliodonium salt as an example; similar mechanisms can be written for the photosensitization of other onium salt photoinitiators such as triarylsulfonium and dialkylphenacylsulfonium salts.

SCHEME 1

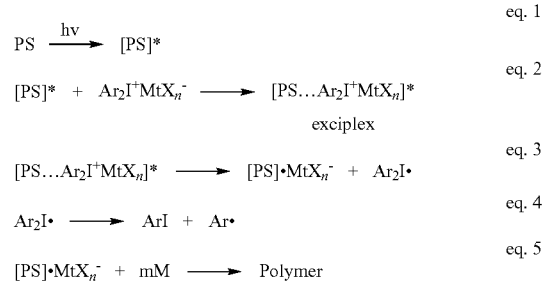

As illustrated in Scheme 1, the photosensitizer ("PS") is first raised to the excited state after the absorption of light (eq. 1); then, an excited state complex (exciplex) is formed as an intermediate between the onium salt and the excited photosensitizer (eq. 2). Subsequently, an electron is transferred from the PS to the photoinitiator, which induces its decomposition and yields a diaryliodine free radical and the photosensitizer cation radical paired with the anion $MtX_n^-$ (eq. 3). The rapid decomposition of the resulting unstable diaryliodine free radical (eq. 4) prevents the back electron transfer and renders the overall process essentially irreversible. The cationic polymerization (eq. 5) takes place either by the direct interaction of the monomer with the photosensitizer cation radical or by first radical dimerization and then polymerization by the resulting dication. During electron transfer photosensitization, both the onium salt and the photosensitizer are irreversibly consumed (Crivello II; and Crivello et al., "Curcumin: a Naturally Occurring Long-Wavelength Photosensitizer for Diaryliodonium Salts," Journal of Polymer Science: Part A: Polymer Chemistry, 43(21):5217-5231 (2005), which are hereby incorporated by reference). Due to their higher reduction potential, sulfonium salt photoinitiators, unlike diaryliodonium salts, are most effectively sensitized by electron rich polynuclear aromatic compounds such as anthracene, pyrene and perylene (Kasapoglu; Hua et al., "Photosensitized Onium-Salt-Induced Cationic Polymerization with Hydroxymethylated Polynuclear Aromatic Hydrocarbons," Chem. Mater., 14(5):2369-2377 (2002) ("Hua"); and Pappas et al., "Cationic UV curing," Advances in Organic Coatings Science and Technology Series, 4(Int. Conf. Org. Coat. Sci. Technol., Proc., 6th, 1980):1.03-107 (1982), which are hereby incorporated by reference). However, such electron rich polynuclear aromatic compounds have properties and toxicities that can render them unsuitable or otherwise limit their effectiveness as photosensitizers in the coating matrix. For this and other reasons, new electron rich polynuclear aromatic photosensitizers are needed, and the present invention, in part, is directed to addressing this need.

As noted above, polymeric materials having improved laser ablation properties continues to be a focus of much research and development effort. Laser ablation of polymeric materials is receiving more and more attention due to its advantages in many potential applications, such as the fabrication of microfluidic devices (Pugmire et al., "Surface Characterization of Laser-Ablated Polymers Used for Microfluidics," Anal. Chem., 74(4):871-878 (2002), which is hereby incorporated by reference) and microelectronic/optical parts (Kunz et al., "Photoablation and Microstructuring of Polyestercarbonates and Their Blends with a XeCl Excimer Laser," Appl. Phys. A., 67(3):347-352 (1998) ("Kunz"), which is hereby incorporated by reference), polymer fuel in laser plasma thrusters (Lippert et al., "Fundamentals and Applications of Polymers Designed for Laser Ablation," Appl. Phys. A., 77(2):259-264 (2003) ("Lippert I"), which is hereby incorporated by reference), and the like. The mechanism of laser ablation involves both pyrolysis (thermal decomposition) and photolysis (photochemical decomposition) of the material (Lippert, "Laser Application of Polymers," Adv. Polym. Sci., 168:51-246 (2004), which is hereby incorporated by reference). Photolysis is the preferred mechanism in terms of ablation resolution since the involvement of thermal processes can lead to unwanted deviation from the optimum quality of the structure (Kruger et al., "Ultrashort Pulse Laser Interaction with Dielectrics and Polymers," Adv. Polym. Sci., 168:247-289 (2004) ("Kruger I"), which is hereby incorporated by reference). Cleaner, higher resolution laser ablation is made possible by advances in laser technology and novel material development. The use of an ultrashort pulse laser such as a femtosecond laser provides a much higher ablation resolution due to the minimization of laser induced heat effects (Kruger I; Kruger et al., "Femtosecond-Pulse Visible Laser Processing of Transparent Materials," Applied Surface Science, 96-98:430-438 (1996); and Serafetinides et al., "Ultra-Short Pulsed Laser Ablation of Polymers," Applied Surface Science, 180(1-2):42-56 (2001), which are hereby incorporated by reference). On the material side, new photopolymers have been designed and synthesized. For example, polymers containing the triazene group in the backbone have been synthesized. The photosensitive triazene group absorbs the incident laser energy and photochemically decomposes into gaseous nitrogen, causing the fracture of the polymer backbone; following which, the nitrogen generated (called "carrier gas") ejects out of the ablation site with supersonic velocity, carrying away polymer fragments and ablation debris, resulting in a cleaner, higher resolution ablation structure (Lippert I; and Nuyken et al., "Excimer Laser Ablation of Triazene-Containing Polyesters with Different Topologies," Acta Polym., 49(8):427-432 (1998) ("Nuyken"), which are hereby incorporated by reference). Polyestercarbonates have also been synthesized and ablated by a 308 nm Excimer laser. Because of their absorption at the incident laser wavelength and the gaseous photochemical decomposition products of ester group such as CO and $CO_2$, they were reported to be ablated faster with a higher resolution of the ablated microstructure (Kunz, which is hereby incorporated by reference).

Cycloaliphatic epoxide based cationic UV curable coatings can be advantageous candidates for microelectronic packaging materials, for example, due to good electrical properties (Koleske et al., "UV-Cured Cycloaliphatic Epoxide Coatings," National SAMPE Technical Conference, 14(Mater. Process Adv. 1982):249-256 (1982); and Koleske et al., "Technology of Cationic, UV-Cured Cycloaliphatic Epoxides," National SAMPE Technical Conference, 16(Hi-Tech. Rev. 1984):529-536 (1984), which are hereby incorporated by reference) and low shrinkage rate during UV curing. Using a 355 nm laser to ablate through vias in such coatings is one of the steps in a specific microelectronic fabrication process, but few reports can be found on either 355 nm laser ablation of polymers or laser ablation of UV curable materials. Previously in this lab the 355 nm laser ablation performance of cationic UV curable coatings was successfully improved by incorporating ~1 wt % of reactive laser ablation sensitizers as an additive. However, a need continues to exist for methods and materials which can be used to make polymers that have improved laser ablation properties, and the present invention is directed, in part, to addressing this need.

SUMMARY OF THE INVENTION

The present invention relates to a photosensitizer comprising a polyol moiety covalently bonded to a fused aromatic moiety.

The present invention also relates to a method for improving UV laser ablation performance of a coating. The method includes incorporating an oxalyl-containing additive into the coating.

The present invention also relates to an oxalyl-containing sensitizer having the formula:

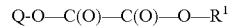

wherein Q represents a fused aromatic moiety and $R^1$ is an alkyl or aryl group.

The present invention also relates to an oxalyl-containing oxetane resin having the formula:

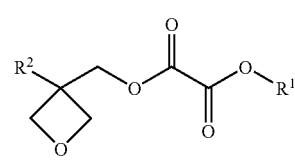

wherein $R^2$ represents a hydrogen atom or a substituted or unsubstituted alkyl group and wherein $R^1$ represents an alkyl or aryl group.

The present invention also relates to an oxalyl-containing polyester polyol having the formula:

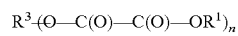

wherein $R^3$ represents a polyester polyol, wherein $R^1$ represents a lower alkyl group, and wherein n is an integer equal to or greater than 1.

The present invention also relates to a coating formulation comprising an oxalyl-containing additive.

DETAILED DESCRIPTION OF THE INVENTION

Figure 1:
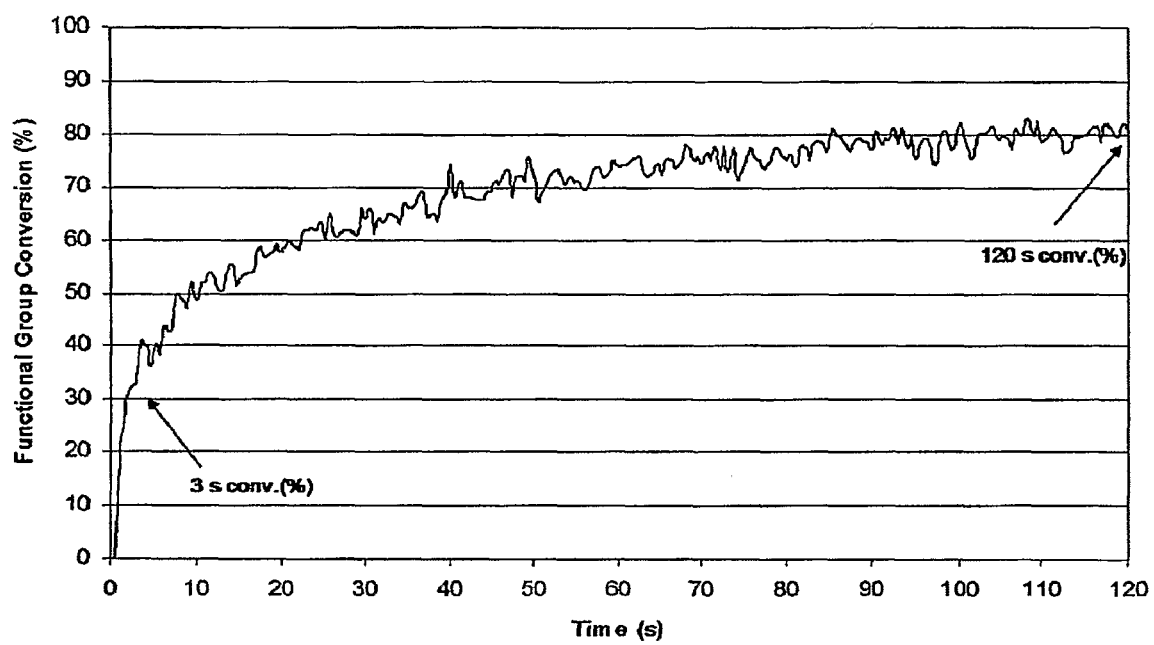
FIG. 1 is a typical reactive functional group conversion-time plot obtained in a real time FTIR experiment showing the UV curing behavior of coatings formulated with a polyol-containing photosensitizer of the present invention.
Figure 2A:
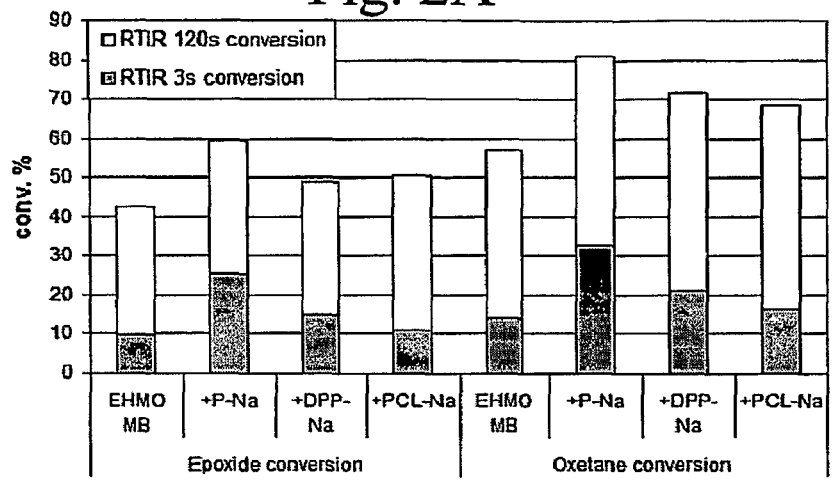
FIGS. 2A-2C are bar graphs of the results of real time FTIR experiments showing functional group conversion of coatings sensitized by polyol photosensitizers of the present invention (P—Na and DPP—Na) and by photosensitizer PCL-Na in system ECC-EHMO (FIG. 2A), system ECC-DOX (FIG. 2B), and system ECC-PCL (FIG. 2C).
Figure 2B:
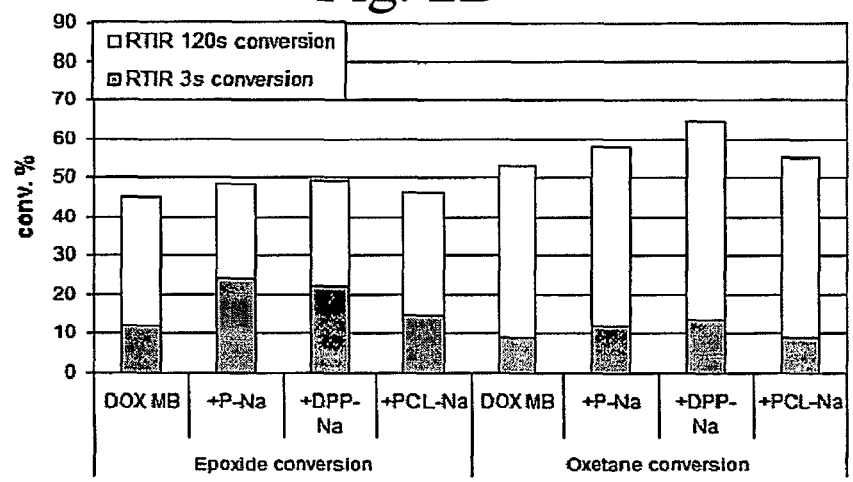
Figure 2C:
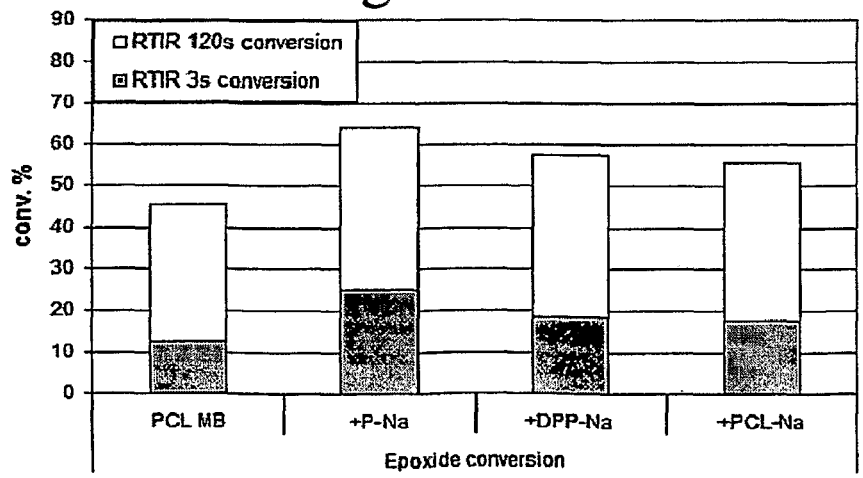
Figure 2D:
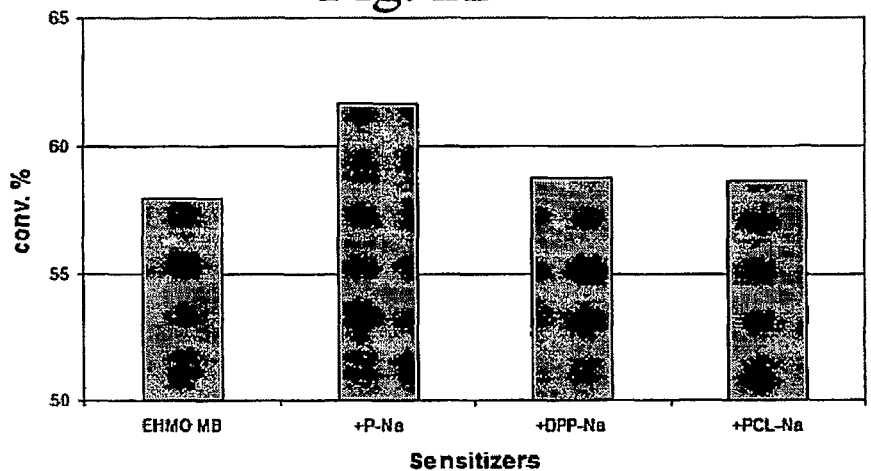
FIGS. 2D-2F are bar graphs of the results of PhotoDSC experiments showing functional group conversion of coatings sensitized by polyol photosensitizers of the present invention (P—Na and DPP—Na) and by photosensitizer PCL-Na in system ECC-EHMO (FIG. 2D), system ECC-DOX (FIG. 2E), and system ECC-PCL (FIG. 2F).
Figure 2E:
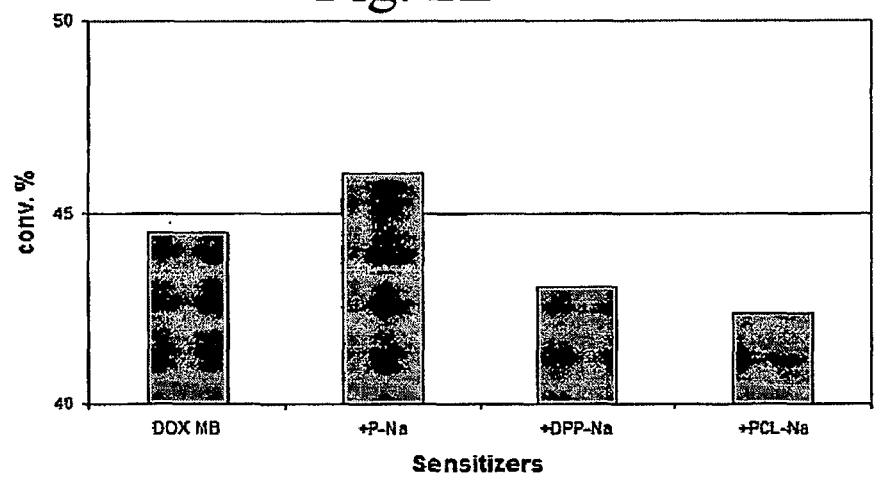
Figure 2F:
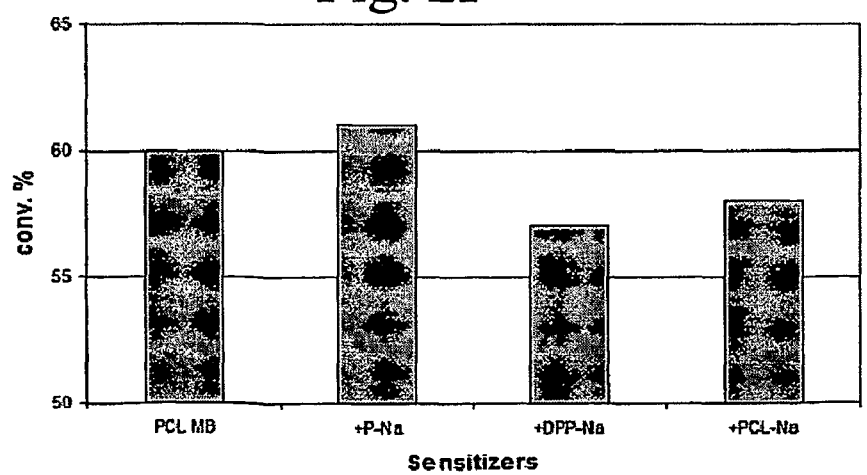
Figure 3A:
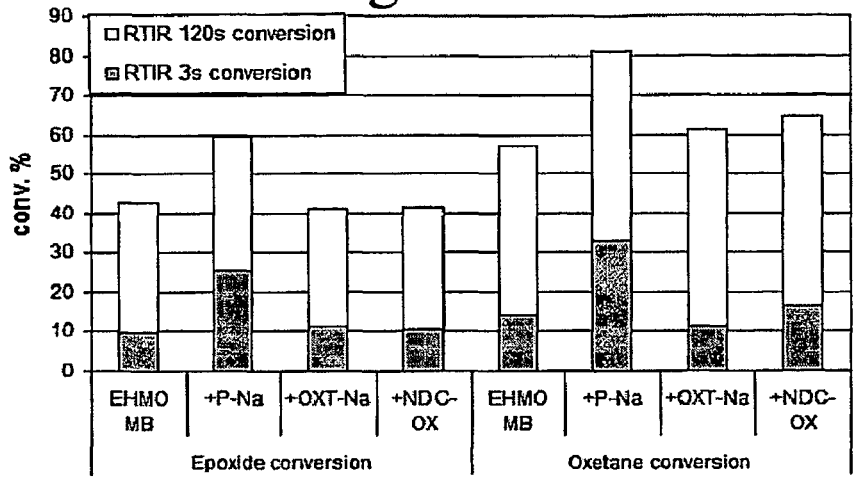
FIGS. 3A-3C are bar graphs of the results of real time FTIR experiments showing functional group conversion of coatings sensitized by a polyol photosensitizer of the present invention (P—Na) and by photosensitizers OXT-Na and NDC—Na in system ECC-EHMO (FIG. 3A), system ECC-DOX (FIG. 3B), and system ECC-PCL (FIG. 3C).
Figure 3B:
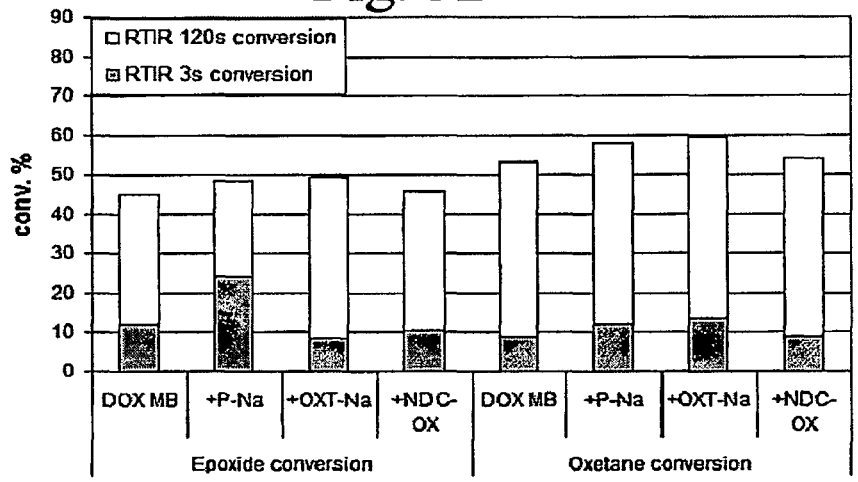
Figure 3C:
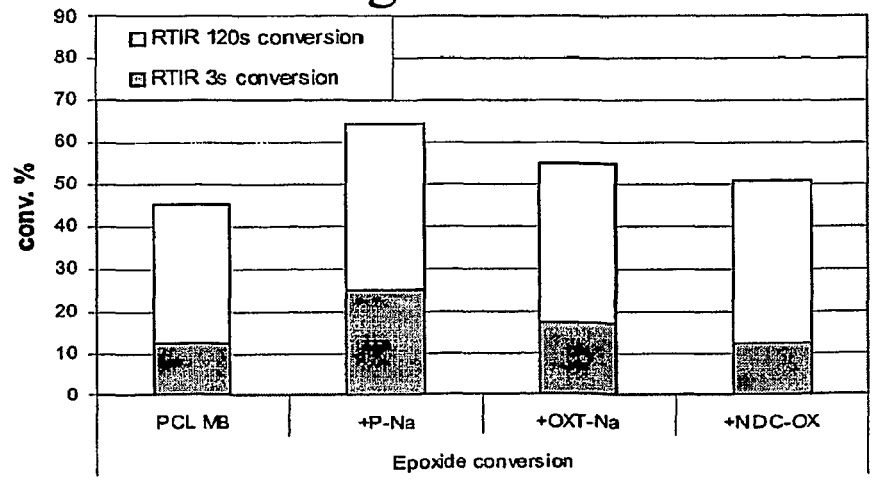
Figure 3D:
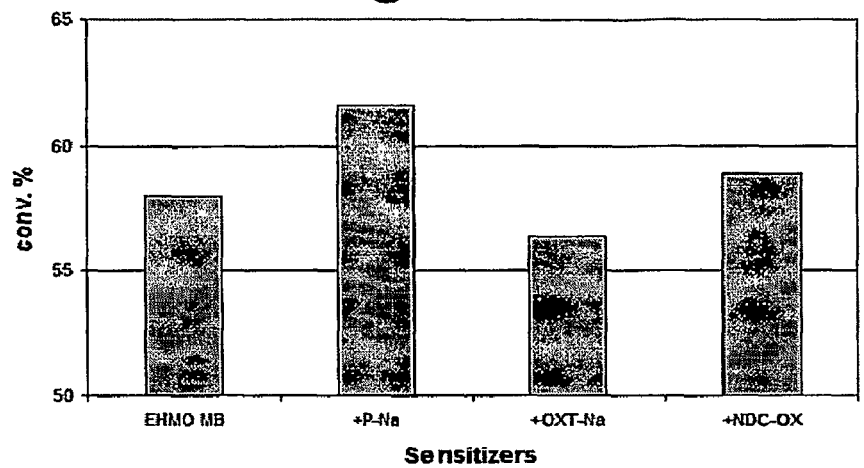
FIGS. 3D-3F are bar graphs of the results of PhotoDSC experiments showing functional group conversion of coatings sensitized by a polyol photosensitizer of the present invention (P—Na) and by photosensitizers OXT-Na and NDC—Na in system ECC-EHMO (FIG. 3D), system ECC-DOX (FIG. 3E), and system ECC-PCL (FIG. 3F).
Figure 3E:
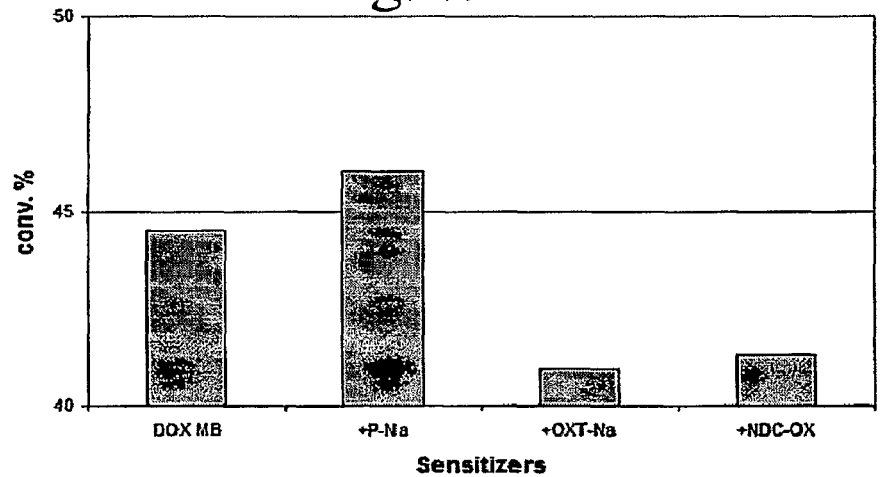
Figure 3F:
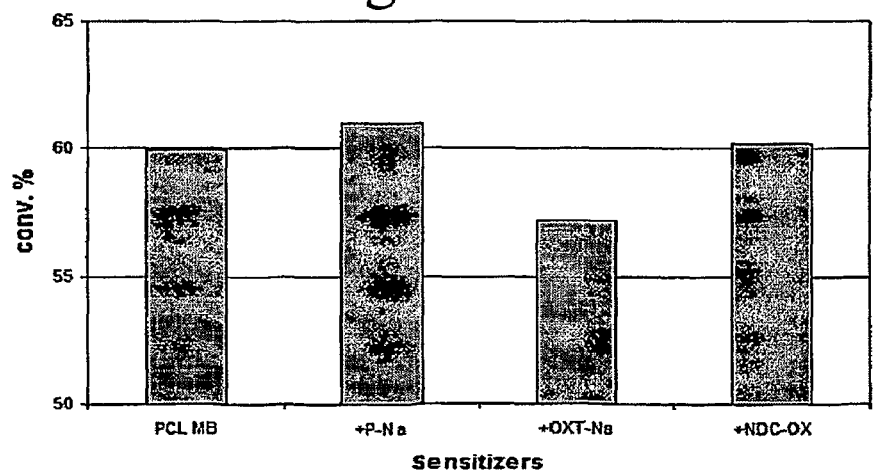

The present invention, in one aspect thereof, relates to photosensitizers which include a polyol moiety covalently bonded to a fused aromatic moiety.

As used herein, "polyol moiety" refers to a moiety bearing 3 or more hydroxyl groups. Illustratively, the polyol moiety can be a moiety bearing 3 hydroxyl groups, 4 hydroxyl groups, 5 hydroxyl groups, 6 hydroxyl groups, 7 hydroxyl groups, 8 hydroxyl groups, 9 hydroxyl groups, more than 3 hydroxyl groups, more than 4 hydroxyl groups, more than 5 hydroxyl groups, more than 6 hydroxyl groups, more than 7 hydroxyl groups, more than 8 hydroxyl groups, etc.

"Fused aromatic moiety", as used herein, is meant to refer to a ring system containing at least two (e.g., 2, 3, 4, etc.) unsaturated homocyclic or heterocyclic rings that are fused together so that the ring system, as a whole, is aromatic (i.e., electrons in the fused rings are delocalized). As illustrative examples of such fused aromatic moieties, there can be mentioned ring systems such as naphthalene, anthracene, phenanthrene, azulene, pyrene, quinoline, isoquinoline, acridine, and the like. The fused aromatic moiety can unsubstituted, or it can be substituted, for example, with halogen atoms, alkyl groups, aralkyl groups, aryl groups, and the like.

As one skilled in the art will appreciate, the photosensitizers of the present invention can include more than one polyol moiety, for example, as in the case where two polyol moieties are covalently bonded to the fused aromatic moiety at different positions of the fused aromatic moiety.

As discussed above, the polyol moiety is covalently bonded to the fused aromatic moiety. Illustratively, the polyol moiety can be covalently bonded to the fused aromatic moiety via a linking moiety, such as a linking moiety that includes 2 or more atoms that are covalently bonded to one another in a linear fashion.

In certain illustrative embodiments, the photosensitizers of the present invention have the following formula:

Q-L-P where Q represents a fused aromatic moiety, L represents a linking moiety, and P represents a polyol moiety. Q, for example, can be a naphthalene ring system, and the linking moiety, L, can be covalently bonded to the naphthalene ring system at the naphthalene ring system's 1 position. Illustrative examples of suitable linking moieties include those having one or more of the following formulae:

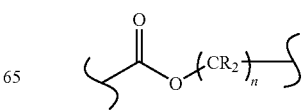

-continued

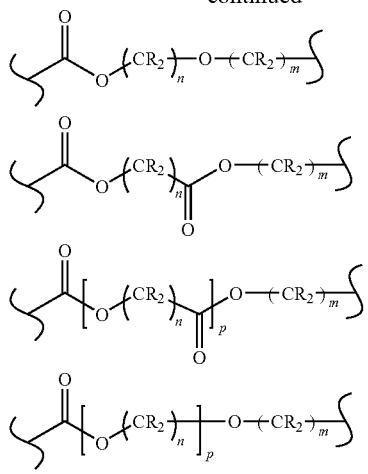

where n represents an integer from 1 to 9 (such as 1, 2, 3, 4, 5, 6, 7, 8, or 9), m represents an integer from 1 to 9 (such as 1, 2, 3, 4, 5, 6, 7, 8, or 9), and p represents an integer from 0 to 9 (such as 0, 1, 2, 3, 4, 5, 6, 7, 8, or 9); and each R is independently selected from H or a substituted or unsubstituted alkyl group (such as a methyl group, an ethyl group, a propyl group, a hydroxymethyl group, an acylalkyl group etc.).

Examples of suitable linking moieties include those having the following formulae:

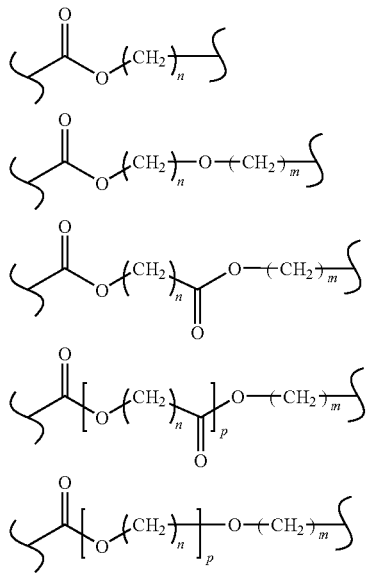

A variety of polyol moieties, P, can be used in the practice of the present invention.

For example, suitable polyol moieties include those having the formulae:

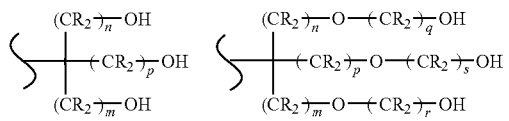

as well as polyol moieties having the formulae:

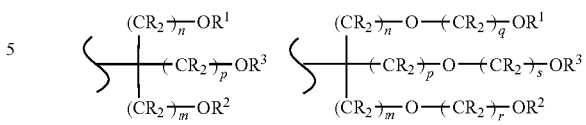

where n represents an integer from 1 to 9 (such as 1, 2, 3, 4, 5, 6, 7, 8, or 9), m represents an integer from 1 to 9 (such as 1, 2, 3, 4, 5, 6, 7, 8, or 9), p represents an integer from 1 to 9 (such as 1, 2, 3, 4, 5, 6, 7, 8, or 9), q represents an integer from 1 to 9 (such as 1, 2, 3, 4, 5, 6, 7, 8, or 9), r represents an integer from 1 to 9 (such as 1, 2, 3, 4, 5, 6, 7, 8, or 9), and s represents an integer from 1 to 9 (such as 1, 2, 3, 4, 5, 6, 7, 8, or 9); each R is independently selected from H or a substituted or unsubstituted alkyl group (such as a methyl group, an ethyl group, a propyl group, a hydroxymethyl group, an acylalkyl group etc.); and each of $R^1$, $R^2$, and $R^3$ is independently selected from moieties having the formulae:

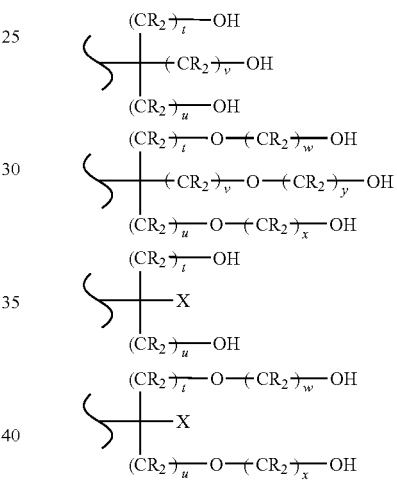

where t represents an integer from 1 to 9 (such as 1, 2, 3, 4, 5, 6, 7, 8, or 9), u represents an integer from 1 to 9 (such as 1, 2, 3, 4, 5, 6, 7, 8, or 9), v represents an integer from 1 to 9 (such as 1, 2, 3, 4, 5, 6, 7, 8, or 9), w represents an integer from 1 to 9 (such as 1, 2, 3, 4, 5, 6, 7, 8, or 9), x represents an integer from 1 to 9 (such as 1, 2, 3, 4, 5, 6, 7, 8, or 9), and y represents an integer from 1 to 9 (such as 1, 2, 3, 4, 5, 6, 7, 8, or 9); X is H, an alkoxy group, a hydroxy group, or a substituted or unsubstituted alkyl group (such as a methyl group, an ethyl group, a propyl group, a hydroxymethyl group, an acylalkyl group etc.); and each R is independently selected from H or a substituted or unsubstituted alkyl group (such as a methyl group, an ethyl group, a propyl group, a hydroxymethyl group, an acylalkyl group etc.).

As examples of such polyol moieties, there may be mentioned polyol moieties having the following formulae:

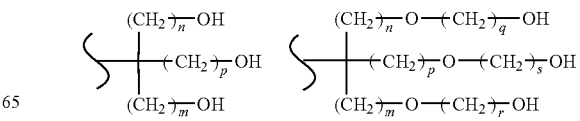

as well as polyol moieties having the formulae:

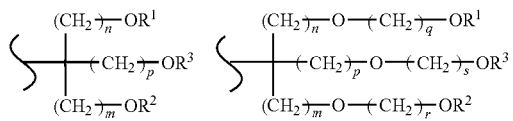

and, as examples of suitable $R^1$, $R^2$, and $R^3$ groups, there may be mentioned those having the formula:

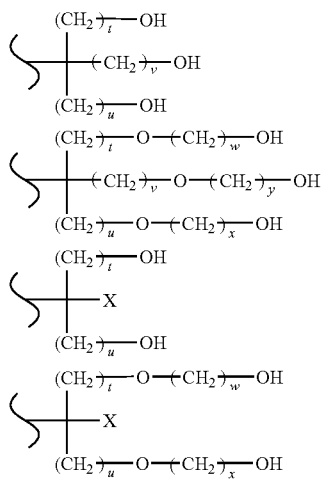

Suitable polyol moieties also include those having the formulae:

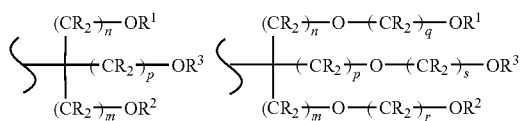

where n represents an integer from 1 to 9 (such as 1, 2, 3, 4, 5, 6, 7, 8, or 9), m represents an integer from 1 to 9 (such as 1, 2, 3, 4, 5, 6, 7, 8, or 9), p represents an integer from 1 to 9 (such as 1, 2, 3, 4, 5, 6, 7, 8, or 9), q represents an integer from 1 to 9 (such as 1, 2, 3, 4, 5, 6, 7, 8, or 9), r represents an integer from 1 to 9 (such as 1, 2, 3, 4, 5, 6, 7, 8, or 9), and s represents an integer from 1 to 9 (such as 1, 2, 3, 4, 5, 6, 7, 8, or 9); each R is independently selected from H or a substituted or unsubstituted alkyl group (such as a methyl group, an ethyl group, a propyl group, a hydroxymethyl group, an acylalkyl group etc.); and each of $R^1$, $R^2$, and $R^3$ is independently selected from moieties having the formula:

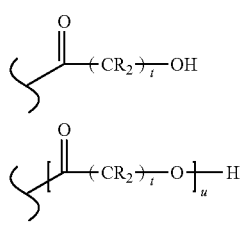

-continued

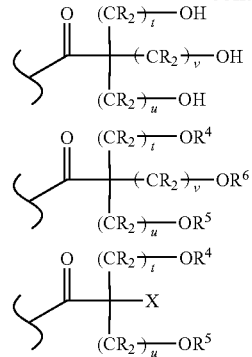

where t represents an integer from 1 to 9 (such as 1, 2, 3, 4, 5, 6, 7, 8, or 9), u represents an integer from 1 to 9 (such as 1, 2, 3, 4, 5, 6, 7, 8, or 9), v represents an integer from 1 to 9 (such as 1, 2, 3, 4, 5, 6, 7, 8, or 9); X is H, an alkoxy group, a hydroxy group, or a substituted or unsubstituted alkyl group (such as a methyl group, an ethyl group, a propyl group, a hydroxymethyl group, an acylalkyl group etc.); and each R is independently selected from H or a substituted or unsubstituted alkyl group (such as a methyl group, an ethyl group, a propyl group, a hydroxymethyl group, an acylalkyl group etc.); and each of $R^4$, $R^5$, and $R^6$ is independently selected from moieties having the formulae:

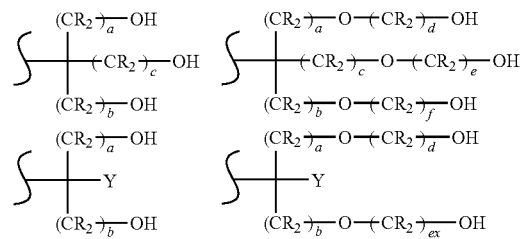

where a represents an integer from 1 to 9 (such as 1, 2, 3, 4, 5, 6, 7, 8, or 9), b represents an integer from 1 to 9 (such as 1, 2, 3, 4, 5, 6, 7, 8, or 9), c represents an integer from 1 to 9 (such as 1, 2, 3, 4, 5, 6, 7, 8, or 9), d represents an integer from 1 to 9 (such as 1, 2, 3, 4, 5, 6, 7, 8, or 9), e represents an integer from 1 to 9 (such as 1, 2, 3, 4, 5, 6, 7, 8, or 9), and f represents an integer from 1 to 9 (such as 1, 2, 3, 4, 5, 6, 7, 8, or 9); Y is H, an alkoxy group, a hydroxy group, or a substituted or unsubstituted alkyl group (such as a methyl group, an ethyl group, a propyl group, a hydroxymethyl group, an acylalkyl group etc.); and each R is independently selected from H or a substituted or unsubstituted alkyl group (such as a methyl group, an ethyl group, a propyl group, a hydroxymethyl group, an acylalkyl group etc.).

As examples of such polyol moieties, there may be mentioned polyol moieties having the following formulae:

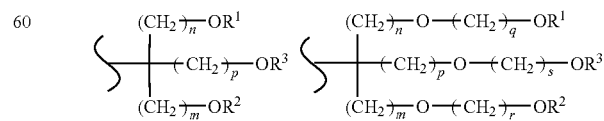

As, examples of suitable $R^1$, $R^2$, and $R^3$ groups, there may be mentioned those having the formula:

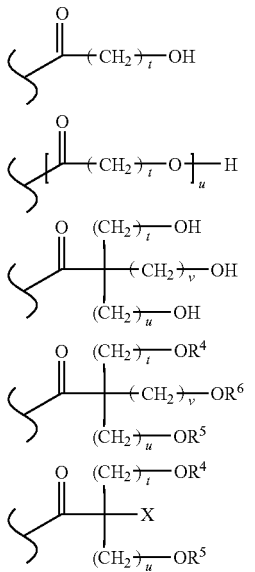

As examples of suitable $R^4$, $R^5$, and $R^6$ groups, there may be mentioned those having the formula:

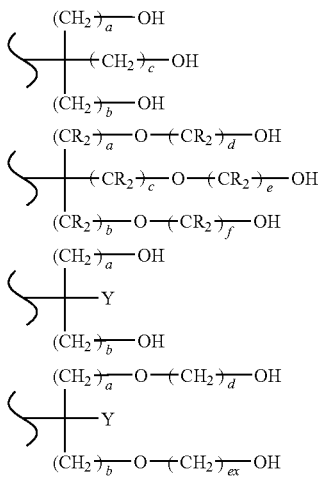

As will be noted from the above discussion, in certain embodiments, $R^1$, $R^2$, $R^3$, $R^4$, $R^5$, and $R^6$ call for a direct linkage to the central carbon atom of $R^1$, $R^2$, $R^3$, $R^4$, $R^5$, and $R^6$; and in other embodiments, linkage to the central carbon atom of $R^1$, $R^2$, $R^3$, $R^4$, $R^5$, and $R^6$ is made via a carbonyl linkage (i.e., a —C(O)—). Other linkages can be used in place of the direct linkage and the carbonyl linkage. Thus, for example, still other suitable polyols include those having the aforementioned formulae in which the carbonyl moiety (that is, the carbonyl moiety bonded to the central carbon atom) in $R^1$, $R^2$, $R^3$, $R^4$, $R^5$, and/or $R^6$ is replaced with a different linkage, such as in the case where the —C(O)— linkage in $R^1$, $R^2$, $R^3$, $R^4$, $R^5$, and/or $R^1$ is replaced with a linkage having the formulae $-R^{20}-C(O)-R^{21}-$, $-C(O)-R^{21}-$, $-R^{20}-C(O)-$, $-R^{20}-O-R^{21}-$, and/or $-R^{20}-$, in which each of $R^{20}$ and $R^{21}$ is independently selected from a substituted or unsubstituted alkyl moiety, such as a substituted or unsubstituted lower alkyl (e.g., methyl, ethyl, propyl, —CH$_2$—, —CH$_2$CH$_2$—, —CH$_2$CH$_2$CH$_2$—, etc.). By way of illustration, each of $R^1$, $R^2$, and $R^3$ in the aforementioned polyols can be independently selected from moieties having the formulae:

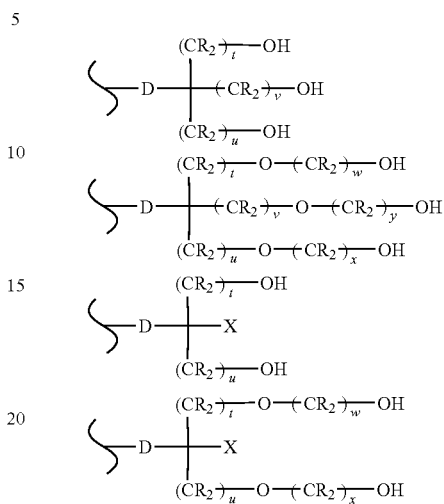

where D represents a linking group, such as linking group having the formulae —C(O)—, $-R^{20}-C(O)-R^{21}-$, $-C(O)-R^{21}-$, $-R^{20}-C(O)-$, $R^{20}-O-$, $-R^{20}-O-R^{21}-$, and/or $-R^{20}-$, in which each of $R^{20}$ and $R^{21}$ is independently selected from a substituted or unsubstituted alkyl moiety, such as a substituted or unsubstituted lower alkyl (e.g., methyl, ethyl, propyl, —CH$_2$—, —CH$_2$CH$_2$—, —CH$_2$CH$_2$CH$_2$—, etc.); t represents an integer from 1 to 9 (such as 1, 2, 3, 4, 5, 6, 7, 8, or 9), u represents an integer from 1 to 9 (such as 1, 2, 3, 4, 5, 6, 7, 8, or 9), v represents an integer from 1 to 9 (such as 1, 2, 3, 4, 5, 6, 7, 8, or 9), w represents an integer from 1 to 9 (such as 1, 2, 3, 4, 5, 6, 7, 8, or 9), x represents an integer from 1 to 9 (such as 1, 2, 3, 4, 5, 6, 7, 8, or 9), and y represents an integer from 1 to 9 (such as 1, 2, 3, 4, 5, 6, 7, 8, or 9); X is H, an alkoxy group, a hydroxy group, or a substituted or unsubstituted alkyl group (such as a methyl group, an ethyl group, a propyl group, a hydroxymethyl group, an acylalkyl group etc.); and each R is independently selected from H or a substituted or unsubstituted alkyl group (such as a methyl group, an ethyl group, a propyl group, a hydroxymethyl group, an acylalkyl group etc.). In certain embodiments, all R's are hydrogen.

In certain embodiments, the number of atoms linearly arranged in the linking moiety L, taken together with the number of atoms linearly arranged in the polyol moiety P (i.e., the total number of atoms separating the fused aromatic moiety and at least one of the polyol hydroxyl groups) (not including the ring atom of the fused aromatic moiety to which the linker is bound and not including the oxygen atom of the polyol hydroxyl group) is from 2 to 40, such as 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40. In certain other embodiments, the number of atoms linearly arranged in the linking moiety L, taken together with the number of atoms linearly arranged in the polyol moiety P (i.e., the total number of atoms separating the fused aromatic moiety and at least two of the polyol hydroxyl groups (not including the ring atom of the fused aromatic moiety to which the linker is bound and not including the oxygen atom of the polyol hydroxyl group) is from 2 to 40, such as 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40

8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40. In certain other embodiments, the number of atoms linearly arranged in the linking moiety L, taken together with the number of atoms linearly arranged in the polyol moiety P (i.e., the total number of atoms separating the fused aromatic moiety and at least three of the polyol hydroxyl groups (not including the ring atom of the fused aromatic moiety to which the linker is bound and not including the oxygen atom of the polyol hydroxyl group) is from 2 to 40, such as 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40. In certain other embodiments, the number of atoms linearly arranged in the linking moiety L, taken together with the number of atoms linearly arranged in the polyol moiety P (i.e., the total number of atoms separating the fused aromatic moiety and at least four of the polyol hydroxyl groups (not including the ring atom of the fused aromatic moiety to which the linker is bound and not including the oxygen atom of the polyol hydroxyl group) is from 2 to 40, such as 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40. In certain other embodiments, the number of atoms linearly arranged in the linking moiety L, taken together with the number of atoms linearly arranged in the polyol moiety P (i.e., the total number of atoms separating the fused aromatic moiety and at least five of the polyol hydroxyl groups (not including the ring atom of the fused aromatic moiety to which the linker is bound and not including the oxygen atom of the polyol hydroxyl group) is from 2 to 40, such as 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40. In certain other embodiments, the number of atoms linearly arranged in the linking moiety L, taken together with the number of atoms linearly arranged in the polyol moiety P (i.e., the total number of atoms separating the fused aromatic moiety and at least six of the polyol hydroxyl groups (not including the ring atom of the fused aromatic moiety to which the linker is bound and not including the oxygen atom of the polyol hydroxyl group) is from 2 to 40, such as 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40.

By way of further illustration, in certain embodiments, the photosensitizers of the present invention have the following formula:

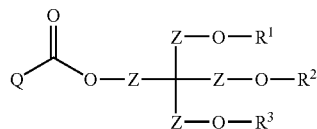

wherein Q represents a fused aromatic moiety (such as a 1-naphthyl moiety); each Z's is independently selected from optionally-substituted aliphatic chains which optionally contain one or more —O— moieties and/or one or more —C(O)O— moieties within the aliphatic chains' backbones; and $R^1$, $R^1$, and $R^3$ are independently selected from H or a branched alkyl moiety bearing at least 2 hydroxyl groups. In certain embodiments, all Z's are the same. In other embodiments, some or all of the Z's are different.

In certain embodiments, each of $R^1$, $R^2$, and $R^3$ is H.

In other embodiments, $R^1$, $R^2$, and $R^3$ are independently selected from branched alkyl moieties bearing at least 2 hydroxyl groups.

In still other embodiments, $R^1$, $R^2$, and $R^3$ are independently selected from H or branched alkyl moieties having the following formulae:

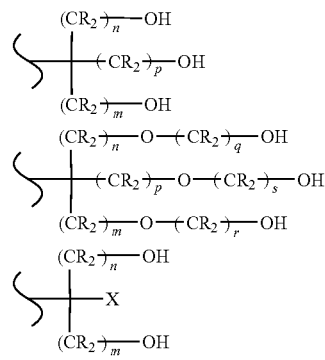

where n represents an integer from 1 to 9, m represents an integer from 1 to 9, p represents an integer from 1 to 9, q represents an integer from 1 to 9, r represents an integer from 1 to 9, and s represents an integer from 1 to 9; X is H, an alkoxy group, a hydroxy group, or a substituted or unsubstituted alkyl group; and each R is independently selected from H or a substituted or unsubstituted alkyl group. Illustratively, each R can be a hydrogen atom; and, additionally or alternatively, each of $R^1$, $R^2$, and $R^3$ can be selected so as not to be a hydrogen atom. By way of further illustration, each R can be a hydrogen atom; and, additionally or alternatively, each of $R^1$, $R^2$, and $R^3$ can be selected so to be the same but not a hydrogen atom.

In still other embodiments, $R^1$, $R^2$, and $R^1$ are independently selected from H or branched alkyl moieties having the following formulae:

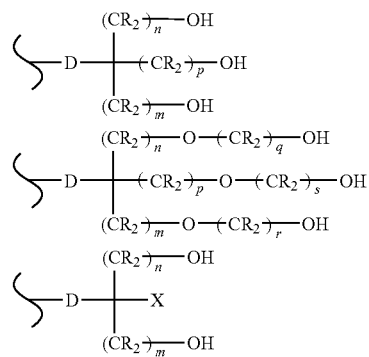

where D represents a linking group, such as linking group having the formulae —C(O)—, —$R^{20}$—C(O)—$R^{21}$—, —C(O)—$R^{21}$—, —$R^{20}$—C(O)—, and/or —$R^{20}$—, in which each of $R^{20}$ and $R^{21}$ is independently selected from a substituted or unsubstituted alkyl moiety, such as a substituted or unsubstituted lower alkyl (e.g., methyl, ethyl, propyl, —$CH_2$—, —$CH_2CH_2$—, —$CH_2CH_2CH_2$—, etc.); n represents an integer from 1 to 9, m represents an integer from 1 to 9, p represents an integer from 1 to 9, q represents an integer from 1 to 9, r represents an integer from 1 to 9, and s represents an integer from 1 to 9; X is H, an alkoxy group, a hydroxy group, or a substituted or unsubstituted alkyl group; and each R is independently selected from H or a substituted or unsubstituted alkyl group. Illustratively, each R can be a hydrogen atom; and, additionally or alternatively, each of $R^1$, $R^2$, and $R^3$ can be selected so as not to be a hydrogen atom. By way of further illustration, each R can be a hydrogen atom; and, additionally or alternatively, each of $R^1$, $R^2$, and $R^3$ can be selected so to be the same but not a hydrogen atom. By way of still further illustration, in certain embodiments, each R is a hydrogen atom; each of $R^1$, $R^2$, and $R^3$ is selected so to be the same branched alkyl having one of the formulae set forth above; D is a substituted or unsubstituted lower alkyl (e.g., methyl, ethyl, propyl, —$CH_2$—, —$CH_2CH_2$—, —$CH_2CH_2CH_2$—, etc.); n is 1, 2, or 3; n is 1, 2, or 3; p is 1, 2, or 3; q is 1, 2, or 3; r is 1, 2, or 3; s is 1, 2, or 3; and X is a substituted or unsubstituted lower alkyl, (e.g., methyl, ethyl, propyl, —$CH_2$—, —$CH_2CH_2$—, —$CH_2CH_2CH_2$—, etc.)

As noted above, the various Z's are optionally-substituted aliphatic chains which optionally contain one or more —O— moieties and/or one or more —C(O)O— moieties within the aliphatic chains' backbones. Examples of suitable Z moieties include those having one of the following formulae:

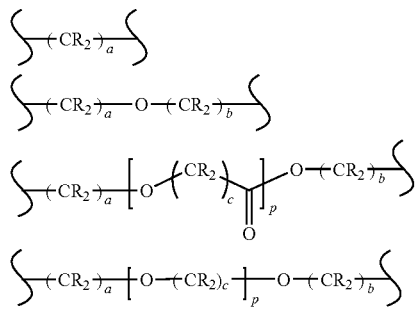

where a represents an integer from 1 to 9, b represents an integer from 1 to 9, c represents an integer from 1 to 9, and p represents an integer from 1 to 9; and each R is independently selected from H or a substituted or unsubstituted alkyl group.

Illustratively, the Z's can be selected from the above-recited formulae wherein each R is H. Additionally or alternatively, a can represents an integer from 1 to 5, b can represent an integer from 1 to 5, c can represent an integer from 1 to 5, and/or p can represent an integer from 1 to 3. For example, the Z's can be selected from the above-recited formulae wherein each R is H; and, additionally or alternatively, a can be an integer from 1 to 3, b can be an integer from 1 to 3, c can be an integer from 1 to 3, and/or p can be an integer from 1 to 2.

The photosensitizers of the present invention can be prepared, for example, using the methods described in the Examples section of the present application of the present application.

These photosensitizers can be used in cationic UV curable systems, such as cycloaliphatic epoxide based UV curable systems and cationic UV curable systems like those described the Examples section of the present application of the present application.

The present invention, in another aspect thereof, relates to a cationic UV curable coating formulation (or other composition) that includes a photosensitizer of the present invention. In this regard, it should be noted that, as used herein, "coating formulation" is meant to include (i) a composition which can be used to produce a coating, typically on a substrate; (ii) a composition which has been coated onto a substrate but not yet cured; and (iii) a composition which has been coated onto a substrate and which has been partially cured. It will be understood that the cationic UV curable coating formulations of the present invention can further include a second, third, fourth, etc. photosensitizer of the present invention. Illustratively, the cationic UV curable coating formulations of the present invention can include two different photosensitizers of the present invention.

In addition to containing a photosensitizer of the present invention, the cationic UV curable coating formulation can contain any monomers and other materials suitable for use in cationic UV curable coating formulations. For example, the cationic UV curable coating formulation can further include difunctional cycloaliphatic epoxides, oxetane or oxirane diluents, photoinitiators (e.g., sulphonium photoinitiators), and the like.

As an example of a suitable difunctional oxetane/oxirane resin that can be used in such coating formulations of the present invention, there can be mentioned 3,4-epoxycyclohexylmethyl-3,4-epoxycyclohexane carboxylates, such as a difunctional cycloaliphatic epoxide having the following formula:

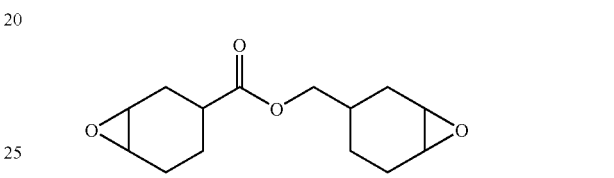

which is available from Dow Chemical Company as CRYACURE™ UVR 6110. Other suitable difunctional oxetane/oxirane resin that can be used in such coating formulations include various commercially available difunctional oxetane reactive diluents, such as bis([1-ethyl(3-oxetanyl)]methyl) ether, which is available from Toagosei Co. Ltd. (Tokyo, Japan) as OXT-221.

Examples of monofunctional oxetane/oxirane resins that can be used in such coating formulations of the present invention include various commercially available monofunctional oxetane reactive diluents (such as 3-ethyl-3-hydroxymethyl oxetane, which is available from Dow Chemical Company as CRYACURE™ UVR 6000) and various commercially available monofunctional oxirane reactive diluents (such as a methyl or other ester of 3,4-epoxycyclohexane carboxylic acid, the methyl ester of which is available from Dow Chemical Company as ERL-4140).

As one skilled in the art will appreciate, the selection and amounts of difunctional oxetane/oxirane resins, monofunctional oxetane/oxirane resins, and/or compounds bearing a single hydroxyl function, relative to the amount of photosensitizer of the present invention can depend on the desired characteristics of the cationic UV curable coating formulation and the desired characteristics of the polymer to be produced by polymerization of the cationic UV curable coating formulation. For example, the various components and their respective amounts can be chosen based on the desired characteristics of the coating formulation (e.g., rheology, stability, etc.) and the desired characteristics of the coating to be produced by polymerization of the coating formulation (e.g., hardness, stability, etc.).

As discussed above, the cationic UV curable coating formulation can further include a photoinitiator, such as a cationic photoinitiator. Examples of suitable photoinitiators include sulphonium-containing cationic photoinitiator, such as a triarylsulfonium hexafluoroantimonate salt (e.g., mixed triarylsulfonium hexafluoroantimonate salt in propylene carbonate, available from Dow Chemical Company).

Additionally or alternatively, the cationic UV curable coating formulations of the present invention can further include sensitizers and/or other materials that enhance laser ablation characteristics of polymers produced from the coating formulations.

The aforementioned cationic UV curable coating formulations can be used in a method for preparing polymers, and the present invention, in another aspect thereof, relates to polymers produced by such a polymerization process. The method includes providing such a cationic UV curable coating formulation and exposing the coating formulation to electromagnetic radiation under conditions effective to polymerize the coating formulation. Prior to polymerization, the coating formulation can be cast into a film by a variety of techniques, including spraying, brushing, spin casting, or through the use of a Doctor blade or similar applicator. The thickness of the film can be from about 1 micron to about 250 microns, such as from about 1 micron to about 5 microns, from about 2 microns to about 4 microns, from about 1 micron to about 10 microns, from about 2 microns to about 10 microns, about 2 microns, from about 3 microns to about 4 microns, about 3.5 microns, from about 2 microns to about 200 microns, from about 10 microns to about 190 microns, from about 50 microns to about 180 microns, about 90 microns, about 100 microns, about 110 microns, about 120 microns, and/or about 130 microns.

Polymers produced in accordance with the above-described method (e.g., photopolymerization of a cationic UV curable coating formulation of the present invention) can be used to prepare electronic devices, and the present invention, in yet another aspect thereof, relates to such electronic devices.

More particularly, such electronic devices of the present invention include an electronic chip that has at least one substantially planar surface and a polymeric coating disposed on the electronic chips substantially planar surface, where the polymeric coating includes a polymer prepared by photopolymerization of a cationic UV curable coating formulation of the present invention. The electronic device may include other electronic components, such as resistors, capacitors, transistors, diodes, integrated circuits or other electronic chips, and power supplies. Where the electronic device includes other electronic components, these other electronic components can either be coated with a polymeric coating as described above or not.

In certain embodiments, the polymeric coating is laser ablatable. In other embodiments, the polymeric coating is not laser ablatable.

The electronic device can further include a hole disposed through the polymeric coating and a signal transmitting element (e.g., a wire, solder ball, or other electrically conductive element; an optical waveguide or other an optically conductive element; etc.) disposed through the hole and connected (e.g., by solder, by an suitable adhesive, such as a conducting epoxy adhesive, etc.) to the electronic chip. It will be appreciated that "a hole", as used herein, is meant to refer to one or more holes, and that "a signal transmitting element", as used herein, is meant to refer to one or more signal transmitting elements (which can be of the same type or different types).

In certain embodiments (e.g., those in which the polymeric coating is laser ablatable), the aforementioned hole (or holes) can be conveniently formed by laser ablation, for example by using a laser having a UV output, such as a UV output of from about 300 nm to about 400 nm, from about 310 nm to about 390 nm, from about 320 nm to about 380 nm, from about 330 nm to about 370 nm, and/or from about 340 nm to about 360 nm. Illustratively, a solid tripled pulsed YAG laser having an output of 355 nm can be employed. The number of pulses can be adjusted to ablate the polymeric coating to the desired depth. For example, where the polymeric coating is disposed on the surface of an electronic chip, the depth of ablation is usually equal to the thickness of the coating.

The aforementioned cationic UV curable coating formulations of the present invention can also be used in a method for producing film on a surface of a substrate. The method includes coating the substrate with a coating formulation of the present invention and polymerizing the coating formulation. Suitable substrates include one or more surfaces of electronic chips; suitable methods for coating the substrate with the coating formulation include those described above in regard to coating electronic chips; and suitable methods for polymerizing the coating formulation include those described above in regard to coating electronic chips.

In certain embodiments (e.g., those in which the polymeric coating is laser ablatable), the aforementioned cationic UV curable coating formulations of the present invention can also be used in a method for producing a pre-selected pattern on a surface of a substrate. The method includes producing a laser-ablatable film on a surface of a substrate in accordance with a method according to the present invention and exposing the film to ultraviolet electromagnetic radiation under conditions effective to ablate a portion of the film to produce the preselected pattern. The preselected pattern can be a hole or a plurality of holes arranged in a particular fashion, for example, so as to permit wires, solder balls, or other signal transmitting elements to be connected with the substrate at particular locations. Alternatively, the preselected pattern can be a pattern of ridges and valleys, where the valleys can (but need not) be of a depth which exposes the substrate. Still alternatively, the preselected pattern can be a relief similar to relief wood carving but where the medium is not wood but, instead, the laser-ablatable film.

As will be evident from the above discussion, the aforementioned cationic UV curable coating formulations of the present invention can be advantageously employed, for example, in the production of electronic chips and devices. In those cases in which the films produced by polymerization of the cationic UV curable coating formulations of the present invention are laser-ablatable, such cationic UV curable coating formulations of the present invention can be used to produce electronic devices by providing a method for readily forming holes, vias, or other openings in a photopolymerized packaging layer for receiving conductive elements, such as solder balls. Examples of methods for making electronic devices in which cationic UV curable coating formulations, polymers, and methods of the present invention can be employed include those which involve fluidic self assembly (e.g., as described in U.S. Pat. No. 6,417,025 to Gengel; U.S. Pat. No. 6,417,025 to Gengel; U.S. Pat. No. 6,566,744 to Gengel, which are hereby incorporated by reference). Still other examples of methods for making electronic devices in which these coating formulations, polymers, and methods of the present invention can be employed include those which are described in U.S. Pat. No. 6,816,380 to Credelle et al., which is hereby incorporated by reference.

As noted above, the present invention, in yet another aspect thereof, relates to a method for improving UV laser ablation performance of a coating. The method includes incorporating an oxalyl-containing additive into the coating.

Examples of coatings whose UV laser ablation performance can be improved by incorporating an oxalyl-containing additive into the coating include cationic UV curable coatings, thermoplastic coatings, and other polymeric coatings.

As used herein "additive" is meant to refer to any compound which is normally used or can be used in coating formulations for producing the desired coating. For example, where the coating is a cationic UV curable coating, "additive" is meant to refer to any compound which is normally used or can be used in cationic UV curable coatings formulations. Illustratively The additive can be one which contains a hydroxyl group or a plurality of hydroxyl groups, or it can be one which can be modified so as to contain such hydroxyl group(s), so as to facilitate the bonding of an oxalyl to the additive. As used herein, "oxalyl" is meant to refer to moieties having the formula:

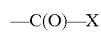
—C(O)—X where X is an ester group, such as moieties having the formula:

—C(O)—C(O)—O—R¹ where R¹ is an alkyl group or an aryl group. As used herein, "alkyl" is meant to refer to substituted alkyl groups, unsubstituted alkyl groups, C1-C12 alkyl groups, C1-C8 alkyl groups, C1-C6 alkyl groups, C1-C4 alkyl groups, lower alkyl groups, linear alkyl groups, branched alkyl groups, cyclic alkyl groups, methyl groups, ethyl groups, propyl groups, butyl groups, and the like. As used herein, "aryl" is meant to refer to substituted aryl groups, unsubstituted aryl groups, monocyclic aryl groups, polycyclic aryl groups, homocyclic aryl groups, heterocyclic aryl groups, phenyl groups, tolyl groups, and the like.

Illustratively, the oxalyl-containing additive can be an oxalyl-containing sensitizer, for example, an oxalyl-containing sensitizer having the formula:

Q-O—C(O)—C(O)—O—R¹ where Q represents a fused aromatic moiety, R¹ is an alkyl or aryl group (such as in the case where R¹ represents a methyl group or another lower alkyl group). As noted above, "fused aromatic moiety", as used herein, is meant to refer to a ring system containing at least two (e.g., 2, 3, 4, etc.) unsaturated homocyclic or heterocyclic rings that are fused together so that the ring system, as a whole, is aromatic (i.e., electrons in the fused rings are delocalized). As illustrative examples of such fused aromatic moieties, there can be mentioned ring systems such as naphthalene, anthracene, phenanthrene, azulene, pyrene, quinoline, isoquinoline, acridine, and the like. The fused aromatic moiety can unsubstituted, or it can be substituted, for example, with halogen atoms, alkyl groups, aralkyl groups, aryl groups, and the like. In certain embodiments, the fused aromatic moiety is substituted with one or more (e.g., one, two, three, etc.) additional moieties having the formula —O—C(O)—C(O)—O—R¹. Examples of suitable oxalyl-containing sensitizers include those having the following formula:

Q-(O—C(O)—C(O)—O—R¹)ₙ in which n is an integer greater than or equal to 1 (e.g., 2, 3, 4, etc.) as well as those having the following formulae:

R¹—C(O)—C(O)—O—Q—O—C(O)—C(O)—O—R¹

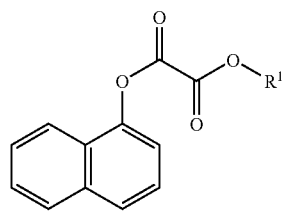

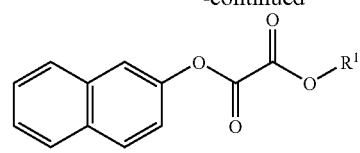

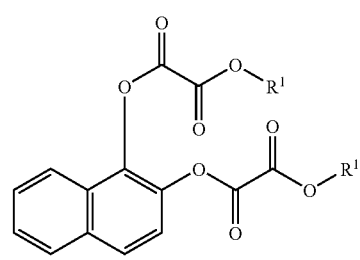

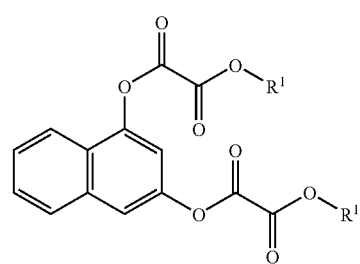

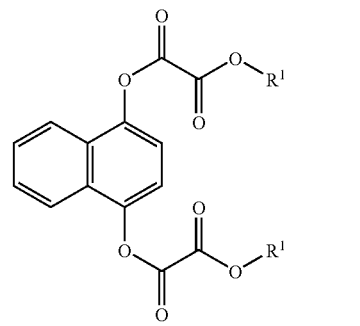

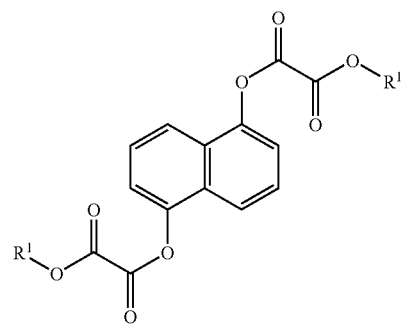

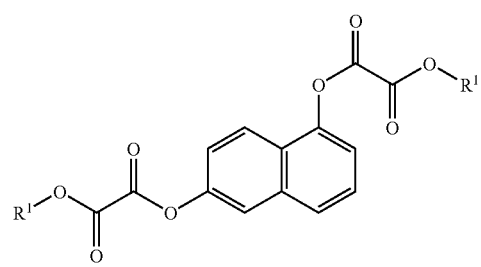

-continued

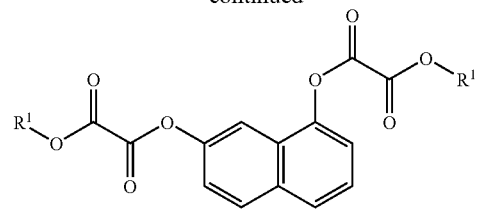

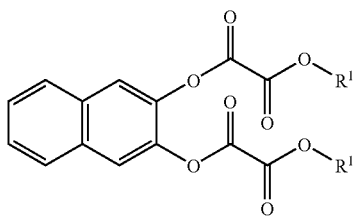

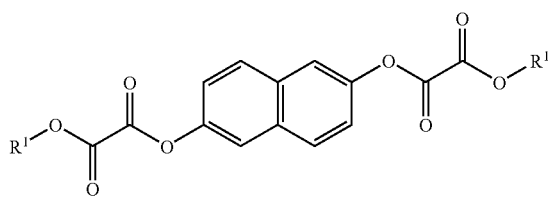

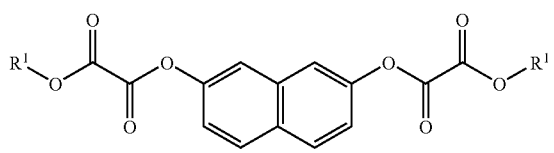

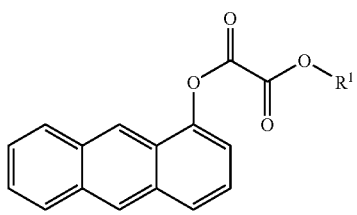

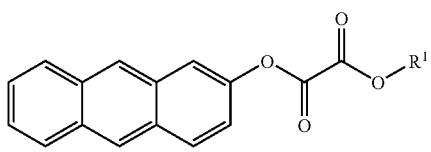

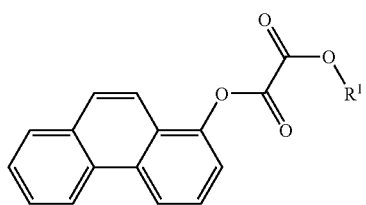

in which each $R^1$ is independently selected from an alkyl or aryl group (such as in the case where each $R^1$ is the same or different and is a methyl group or another lower alkyl group).

As further illustration, the oxalyl-containing additive can be an oxalyl-containing oxetane/oxirane resin. As used herein, oxetane/oxirane resin is meant to refer to compounds which contain an oxetane ring, an oxirane ring, or both. For example, the oxalyl-containing additive can be an oxalyl-containing oxetane/oxirane resin having the formula:

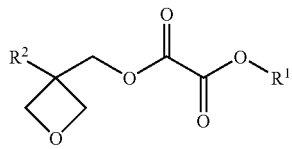

where $R^2$ represents a hydrogen atom or a substituted or unsubstituted alkyl group (such as in the case where $R^2$ represents an ethyl group or another lower alkyl group) and where $R^1$ is an alkyl or aryl group (such as in the case where $R^1$ represents a methyl group or another lower alkyl group).

As still further illustration, the oxalyl-containing additive can be an oxalyl-containing polyester polyol.

For example, the oxalyl-containing polyester polyol can be one having the formula:

$$R^3\text{-}(C(O)\text{---}C(O)\text{---}OR^1)_n$$

where $R^3$ represents a polyester polyol, where $R^1$ represents an alkyl or aryl group (such as in the case where $R^1$ represents a methyl group or another lower alkyl group), and where n is an integer equal to or greater than 1. Typically, the value of n will depend on the number of free hydroxyl groups per polyester polyol and the ratio of the reactants (e.g., monomethyl oxalyl chlodide:polyester polyol) used to prepare the oxalyl-containing polyester polyol. Generally, n will be greater than 1 (e.g., 2, 3, 4, 5, 6, one-fifth of the number of free hydroxyl groups present on the polyester polyol, one-quarter of the number of free hydroxyl groups present on the polyester polyol, one-third of the number of free hydroxyl groups present on the polyester polyol, one-half of the number of free hydroxyl groups present on the polyester polyol, etc.). Examples of suitable polyester polyols include dendritic polyester polyols, such as dendritic polyester polyol H20 and dendritic polyester polyols P1000 (each available from Perstorp Polyols, Inc.).

Additionally or alternatively, the oxalyl-containing polyester polyol can be one that is produced by a reaction of a polyester polyol and a mono-alkyl or mono-aryl oxalyl chloride.

As further illustration, the oxalyl-containing additive can be a oxalyl-containing sensitizing polyester polyol, such as oxalyl-containing sensitizing polyester polyol having the formula:

$$Q_m\text{-}R^3\text{-}(O\text{---}C(O)\text{---}C(O)\text{---}OR^1)_n$$

where Q represents a fused aromatic moiety, where $R^3$ represents a polyester polyol, where $R^1$ represents a lower alkyl group, where n is an integer equal to or greater than 1, and where m is an integer equal to or greater than 1 (e.g., 1, 2, 3, etc.). Typically, the value of m will depend on the number of free hydroxyl groups per polyester polyol and the ratio of the reactants (e.g., fused aromatic moiety acid chloride:monomethyl oxalyl chlodide:polyester polyol) used to prepare the oxalyl-containing sensitizing polyester polyol. Generally, m will less than n, and, in some cases, m can be significantly smaller than n (e.g., as in the case where m is about ¼, ⅕, ⅙, ⅛, ⅑, ⅒, etc. of the value of n).

Additionally or alternatively, the oxalyl-containing sensitizing polyester polyol can be one that is produced by a reaction of a polyester polyol, a mono-alkyl or mono-aryl oxalyl chloride, and an acid chloride of a fused aromatic moiety.

The present invention, in other aspects thereof, relates to the aforementioned oxalyl-containing sensitizers, the aforementioned oxalyl-containing oxetane resins, the aforementioned oxalyl-containing polyester polyols, and the aforementioned oxalyl-containing sensitizing polyester polyols.

The aforementioned oxalyl-containing sensitizers, oxalyl-containing oxetane resins, oxalyl-containing polyester polyols, and oxalyl-containing sensitizing polyester polyols can be produced, for example, using the methods described in the Examples section of the present application.

The aforementioned oxalyl-containing sensitizers, oxalyl-containing oxetane resins, oxalyl-containing polyester polyols, oxalyl-containing sensitizing polyester polyols, and other oxalyl-containing additives can be used in coating formulations to produce coatings having improved laser ablation performance, as described further below.

The present invention, in another aspect thereof, relates to a coating formulation that includes an oxalyl-containing additive of the present invention. As noted above, it should be noted that "coating formulation", as used herein, is meant to include (i) a composition which can be used to produce a coating, typically on a substrate; (ii) a composition which has been coated onto a substrate but not yet cured; and (iii) a composition which has been coated onto a substrate and which has been partially cured. Furthermore, it will be understood that the coating formulations of the present invention can further include a second, third, fourth, etc. oxalyl-containing additive of the present invention. Illustratively, the coating formulations of the present invention can include oxalyl-containing sensitizer of the present invention and an oxalyl-containing sensitizing polyester polyol of the present invention, or, as further illustration, the coating formulations of the present invention can include two different oxalyl-containing sensitizers of the present invention.

In addition to containing the oxalyl-containing additive or additives of the present invention, the cationic UV curable coating formulation can contain any monomers and other materials suitable for use in the coating formulations. For example, in the case where the coating formulation is a cationic UV curable coating formulation, the cationic UV curable coating formulation can further include difunctional cycloaliphatic epoxides, oxetane or oxirane diluents, and photoinitiators (e.g., sulphonium photoinitiators).

As an example of a suitable difunctional oxetane/oxirane resin that can be used in such cationic UV curable coating formulations of the present invention, there can be mentioned 3,4-epoxycyclohexylmethyl-3,4-epoxycyclohexane carboxylates, such as a difunctional cycloaliphatic epoxide having the following formula:

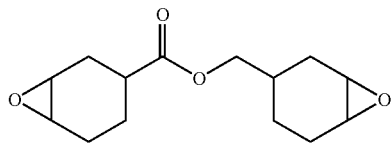

which is available from Dow Chemical, Company as CRYACURE™ UVR6110. Other suitable difunctional oxetane/oxirane resin that can be used in such cationic UV curable coating formulations include various commercially available difunctional oxetane reactive diluents, such as bis([1-ethyl(3-oxetanyl)]methyl)ether, which is available from Toagosei Co. Ltd. (Tokyo, Japan) as OXT-221.

Examples of monofunctional oxetane/oxirane resins that can be used in such cationic UV curable coating formulations of the present invention include various commercially available monofunctional oxetane reactive diluents (such as 3-ethyl-3-hydroxymethyl oxetane, which is available from Dow Chemical Company as CRYACURE™ UVR 6000) and various commercially available monofunctional oxirane reactive diluents (such as a methyl or other ester of 3,4-epoxycyclohexane carboxylic acid, the methyl ester of which is available from Dow Chemical Company as ERL-4140).

As one skilled in the art will appreciate, the selection of the various components and their respective amounts to be used in formulating the coating formulation can be chosen based on the desired characteristics of the coating formulation (e.g., rheology, stability, etc.) and the desired characteristics of the coating to be produced by polymerization of the coating formulation (e.g., hardness, stability, etc.). Illustratively, in cases where the coating formulation is a cationic UV curable coating formulation, the selection and amounts of difunctional oxetane/oxirane resins, monofunctional oxetane/oxirane resins, and/or compounds bearing a single hydroxyl function, relative to the amount of oxalyl-containing additive of the present invention can depend on the desired characteristics of the cationic UV curable coating formulation and the desired characteristics of the polymer to be produced by polymerization of the cationic UV curable coating formulation. For example, the various components and their respective amounts can be chosen based on the desired rheology, stability, and other characteristics of the cationic UV curable coating formulation, as well as on the desired hardness, stability, and other characteristics of the coating to be produced by polymerization of the cationic UV curable coating formulation.

As discussed above, in cases where the coating formulation is a cationic UV curable coating formulation, the cationic UV curable coating formulation can further include a photoinitiator, such as a cationic photoinitiator. Examples of suitable photoinitiators include sulphonium-containing cationic photoinitiator, such as a triarylsulfonium hexafluoroantimonate salt (e.g., mixed triarylsulfonium hexafluoroantimonate salt in propylene carbonate, available from Dow Chemical Company).

The cationic UV curable coating formulation and other coating formulations of the present invention can further include a fused aromatic sensitizer, such as a fused aromatic sensitizer bearing a free hydroxyl group. Illustratively, the fused aromatic sensitizer can be a hydroxy naphthalene (e.g., 1-hydroxy naphthalene).

The aforementioned coating formulations (e.g., cationic UV curable coating formulations) can be used in a method for preparing polymers, and the present invention, in another aspect thereof, relates to polymers produced by such a polymerization process. The method includes providing a coating formulation of the present invention and subjecting the coating formulation to conditions effective to polymerize the coating formulation. Illustratively, in the case where the coating formulation is a cationic UV curable coating formulation, the method would include providing a cationic UV curable coating formulation of the present invention and exposing the coating formulation to electromagnetic radiation under conditions effective to polymerize the coating formulation. Prior to polymerization, the coating formulation can be cast into a film by a variety of techniques, including spraying, brushing, spin casting, or through the use of a Doctor blade or similar applicator. The thickness of the film can be from about 1 micron to about 250 microns, such as from about 1 micron to about 5 microns, from about 2 microns to about 4 microns, from about 1 micron to about 10 microns, from about 2 microns to about 10 microns, about 2 microns, from about 3 microns to about 4 microns, about 3.5 microns, from about 2 microns to about 200 microns, from about 10 microns to about 190 microns, from about 50 microns to about 180 microns, about 90 microns, about 100 microns, about 110 microns, about 120 microns, and/or about 130 microns.

Polymers produced in accordance with the above-described method (e.g., photopolymerization of a cationic UV curable coating formulation of the present invention) can be used, for example, to prepare electronic devices, and the present invention, in yet another aspect thereof, relates to such electronic devices.

More particularly, such electronic devices of the present invention include an electronic chip that has at least one substantially planar surface and a polymeric coating disposed on the electronic chip's substantially planar surface, where the polymeric coating includes a polymer prepared by polymerization of a coating formulation of the present invention (e.g., by photopolymerization of a cationic UV curable coating formulation of the present invention). The electronic device may include other electronic components, such as resistors, capacitors, transistors, diodes, integrated circuits or other electronic chips, and power supplies. Where the electronic device includes other electronic components, these other electronic components can either be coated with a polymeric coating as described above or not.

The electronic device can further include a hole disposed through the polymeric coating and a signal transmitting element (e.g., a wire, solder ball, or other electrically conductive element; an optical waveguide or other an optically conductive element; etc.) disposed through the hole and connected (e.g., by solder, by an suitable adhesive, such as a conducting epoxy adhesive, etc.) to the electronic chip. It will be appreciated that "a hole", as used herein, is meant to refer to one or more holes, and that "a signal transmitting element", as used herein, is meant to refer to one or more signal transmitting elements (which can be of the same type or different types). The aforementioned hole (or holes) can be conveniently formed by laser ablation, for example by using a laser having a UV output, such as a UV output of from about 300 nm to about 400 nm, from about 310 nm to about 390 nm, from about 320 nm to about 380 nm, from about 330 nm to about 370 nm, and/or from about 340 nm to about 360 nm. Illustratively, a solid tripled pulsed YAG laser having an output of 355 nm can be employed. The number of pulses can be adjusted to ablate the polymeric coating to the desired depth. For example, where the polymeric coating is disposed on the surface of an electronic chip, the depth of ablation is usually equal to the thickness of the coating.

The aforementioned coating formulations (e.g., cationic UV curable coating formulations) of the present invention can also be used in a method for producing a laser-ablatable film on a surface of a substrate. The method includes coating the substrate with a coating formulation of the present invention and polymerizing, hardening, or otherwise curing the coating formulation.

Suitable substrates include one or more surfaces of electronic chips; suitable methods for coating the substrate with the coating formulation include those described above in regard to coating electronic chips; and suitable methods for polymerizing the coating formulation include those described above in regard to coating electronic chips.

The aforementioned coating formulations (e.g., cationic UV curable coating formulations) of the present invention can also be used in a method for producing a pre-selected pattern on a surface of a substrate. The method includes producing a laser-ablatable film on a surface of a substrate in accordance with a method according to the present invention and exposing the film to ultraviolet electromagnetic radiation under conditions effective to ablate a portion of the film to produce the pre-selected pattern. The preselected pattern can be a hole or a plurality of holes arranged in a particular fashion, for example, so as to permit wires, solder balls, or other signal transmitting elements to be connected with the substrate at particular locations. Alternatively, the preselected pattern can be a pattern of ridges and valleys, where the valleys can (but need not) be of a depth which exposes the substrate. Still alternatively, the preselected pattern can be a relief similar to relief wood carving but where the medium is not wood but, instead, the laser-ablatable film.

As will be evident from the above discussion, the aforementioned coating formulations (e.g., cationic UV curable coating formulations) of the present invention can be advantageously employed in the production of electronic chips and devices by providing a method for readily forming holes, vias, or other openings in a photopolymerized packaging layer for receiving conductive elements, such as solder balls. Examples of methods for making electronic devices in which cationic UV curable and other coating formulations, polymers, and methods of the present invention can be employed include those which involve fluidic self assembly (e.g., as described in U.S. Pat. No. 6,417,025 to Gengel; U.S. Pat. No. 6,417,025 to Gengel; U.S. Pat. No. 6,566,744 to Gengel, which are hereby incorporated by reference). Still other examples of methods for making electronic devices in which these coating formulations, polymers, and methods of the present invention can be employed include those which are described in U.S. Pat. No. 6,816,380 to Credelle et al., which is hereby incorporated by reference.

The present invention is further illustrated by the following examples.

EXAMPLES

Example 1

Synthesis and Study of Novel Polyol Bound Photosensitizers for Cationic UV Curable Systems In this Example 1 and in the Following Examples 2 and 3, we describe the synthesis of a group of novel polyol bound cationic UV photosensitizers which possess multiple internal hydroxyl groups near the UV absorbing chromophore molecule. It is believed that the proximity of the multiple internal hydroxyl groups to the UV absorbing chromophore molecule allows for an intramolecular interaction between at least some of these hydroxyl groups and the chromophore. It is believed that this unique structural feature of these polyol bound photosensitizers results in a pronounced cationic photosensitization effect. An Intramolecular Hydrogen Abstraction Photosensitization ("IHAP") mechanism is proposed in order to account for the experimental observations. The photosensitizers that function through the proposed IHAP mechanism are called Intramolecular Hydrogen Abstraction Photosensitizer ("IHA-PS") in these Examples 1, 2, and 3. To investigate the proposed mechanism, a simplified photosensitizer was synthesized which has the structural features believed to be conducive to operation by the proposed mechanism; and the same photosensitization effect is observed with this simplified photosensitizer.

Example 2

Details of the Synthesis of Novel Polyol Bound Photosensitizers and Preparation of Coating Formulations The chemicals used in the photosensitizer synthesis and coating formulations are listed in Table 1. HPLC grade tetrahydrofuran ("THF") and acetone, triethylene amine ("TEA"), and AMBERLYST™ 15-sulfonic acid functionalized ion exchange resin were obtained from Aldrich. All materials were used as received.

TABLE 1

| Name | Abbreviation | Source | Chemical Structure/Description |
|---|---|---|---|
| UVI 6974 | PI | Dow | Mixed triarylsulfonium hexafluoroantimonate salt in propylene carbonate |
| UVR 6110 | ECC | Dow | (3,4-epoxycyclohexylmethyl 3,4-epoxycyclohexanecarboxylate structure) |
| UVR 6000 | EHMO | Dow | (3-ethyl-3-hydroxymethyloxetane structure) |
| Tone 31 | PCL | Dow | (trimethylolpropane tri-polycaprolactone structure) MW 300; 3 primary —OH |
| OXT-221 | DOX | Toagosei Co. Ltd. | (bis[(3-ethyl-3-oxetanyl)methyl] ether structure) |
| 1-Naphthol chloride | 1-NaCl | Aldrich | (1-naphthoyl chloride structure) |

TABLE 1-continued

| Name | Abbreviation | Source | Chemical Structure/Description |
|---|---|---|---|
| Dimethyl 2,6-naphthalene dicarboxylate | NDC | Aldrich | (structure of dimethyl 2,6-naphthalene dicarboxylate) |
| P1000 | p | Perstorp Polyols Inc. | Second generation dendritic polyester polyol (shown above) blended with polyether polyol; MW 1500; 15 primary —OH |
| DPP 130 | DPP | Perstorp Polyols Inc. | MW 830; 6 primary —OH |
| PP50s | PP | Perstorp Polyols Inc. | MW 356; 4 primary —OH |

A series of polyol-bound and non-polyol bound cationic UV photosensitizers were synthesized and characterized as follows.
The structures and nomenclature of the cationic UV photosensitizers are set forth in Table 2.
TABLE 2
| Photosensitizer Synthesized | Reactant 1 | Reactant 2 | Product Purity |
|---|---|---|---|
| 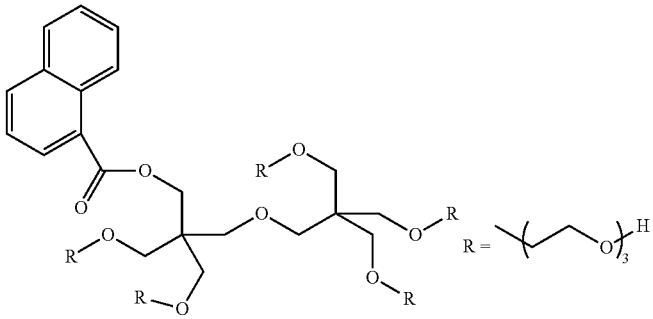<br>DPP-Na | DPP | 1-Na Cl | 96.4% (HPLC) |
| 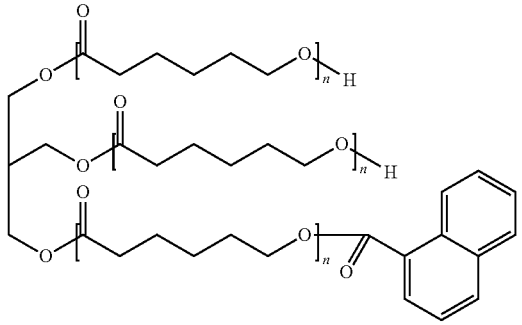<br>PCL-Na | PCL | 1-Na Cl | 81.4% (HPLC) |
| 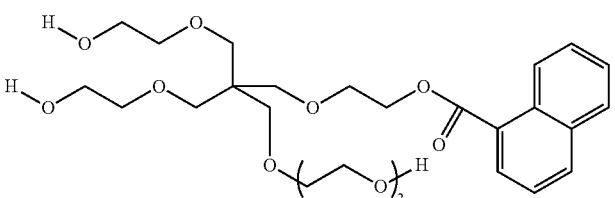<br>PP-Na | PP | 1-Na Cl | 94.0% (HPLC) |

TABLE 2-continued
| Photosensitizer Synthesized | Reactant 1 | Reactant 2 | Product Purity |
|---|---|---|---|
| 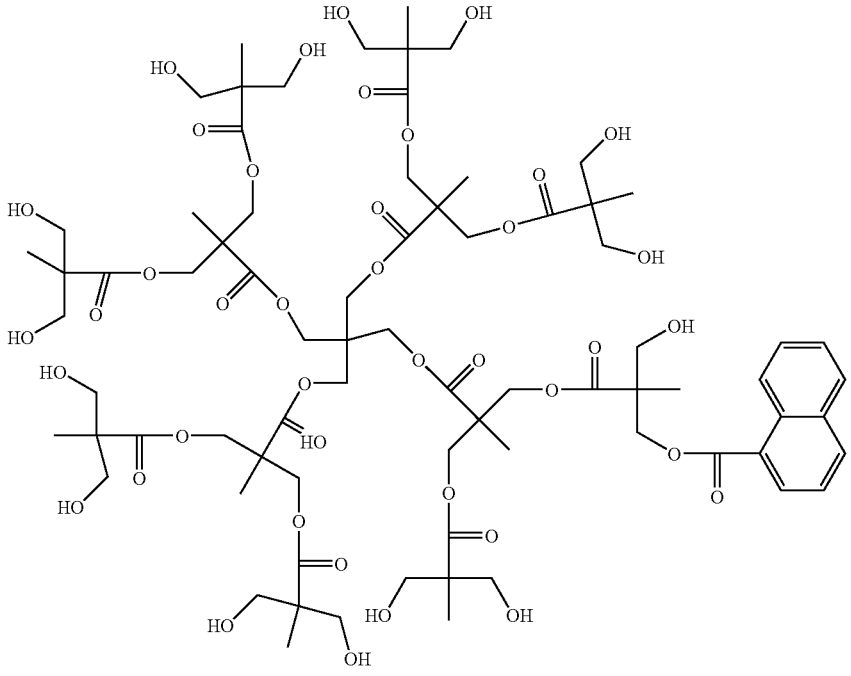<br>P-Na | P | 1-Na Cl | 95.5% (HPLC) |
| 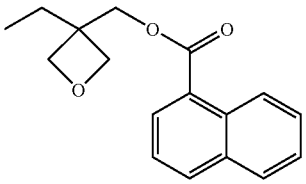<br>OXT-Na | EHMO | 1-Na Cl | 100% (GC-MS) |
| 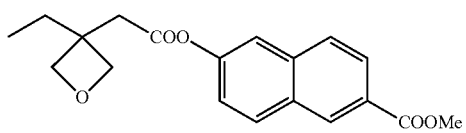<br>NDC-OX | EHMO | NDC | 71.8% (GC-MS) |
| 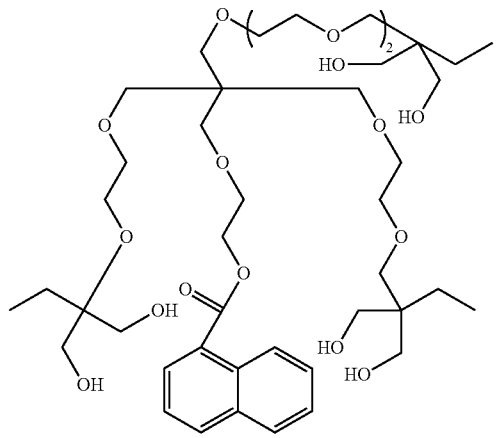<br>PP-Na-ol | PP-Na | EHMO | 95.7% (GC-MS) |

The synthesis of NDC—OX was carried out by transesterification using a procedure that has been described previously (Chen et al., "Study of Cationic UV Curing and UV Laser Ablation Behavior of Coatings Sensitized by Novel Sensitizers," *Polymer*, 47(11):3715-3726 (2006) ("Chen"), which is hereby incorporated by reference). The product was obtained as a white solid powder.

The synthesis of photosensitizers P—Na, PP—Na, DPP—Na, PCL-Na, and OXT-Na are based on the reaction between hydroxyl groups and 1-naphthol chloride ("1-Na Cl") as shown in the following Scheme 2A.

SCHEME 2A

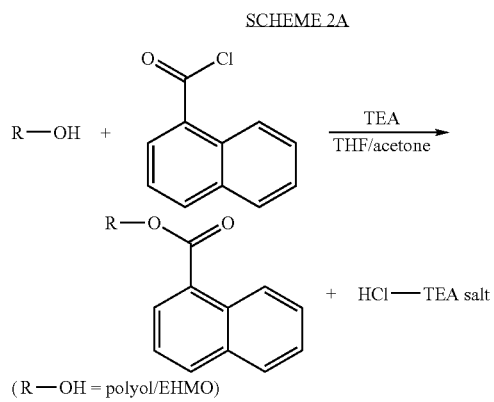

The general procedure of the synthesis is as follows. The hydroxyl containing compound R—OH (polyol or EHMO) was dissolved in ~5 g HPLC grade THF or acetone in a 20 ml glass vial. Then, an equal molar amount of 1-Na Cl was added into the vial. The mixture was stirred using a magnetic stir bar for ~5 minutes in an ice-water bath, followed by the dropwise addition of TEA in twice the molar amount required to neutralize the HCl generated in the reaction. The white TEA-HCl salt soon precipitated. When the addition of TEA (~2 minutes) was completed, the mixture was stirred for another 10 minutes, followed by the addition of 10 g THF or acetone. The mixture was then filtered twice to remove the TEA-HCl salt. The filtered solution was heated on a hotplate at about 100° C. under $N_2$ purge for ~1 hour, followed by vacuum (30 mm Hg) at room temperature for 1 hour to remove residual solvent and TEA. P—Na, PP—Na, DPP—Na, PCL-Na, and OXT-Na were obtained as pale yellow oils, and their respective purities and methods of characterization are set forth in Table 2.

The synthetic route for obtaining photosensitizer PP—Na-ol is shown in Scheme 2B.

SCHEME 2B

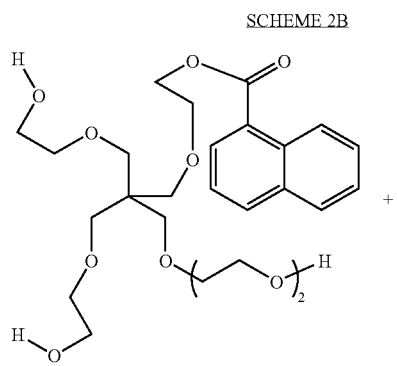

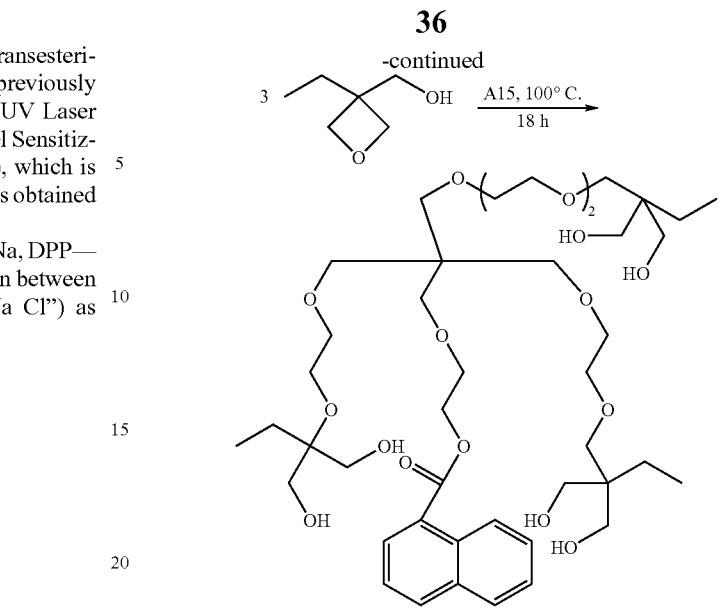

Briefly, the synthesis was carried out by mixing 1.02 g PP—Na, 0.696 g EHMO (mole ratio 1:3), and 0.09 g A15 (~5 wt % of total resin) in a 20 ml glass vial. The mixture was then heated at 100° C. with magnetic stirring for 16 hours. Then, 10 g of mixed solvent of THF and acetone was added, and the solution was filtered to remove the solid catalyst. The filtrate was then heated at 100° C. under $N_2$ purge for 1 hour, followed by vacuum at ~65° C. for 3 hours to remove the residual solvent. PP—Na-ol was obtained as a light brown liquid, and its purity and method of characterization are set forth in Table 2.

The synthesized photosensitizers were characterized by high performance liquid chromatography (HPLC) and GC-MS. The HPLC analysis was performed on an Agilent 1100 series HPLC utilizing the diode array detector ("DAD") for UV-Vis characterization. Chromatographic separation was achieved on a reversed-phase ZORBAX C-18 (4.6×250 mm, 5 μm) column (Agilent) with a C4 guard column (Thermo Electron). The mobile phase consisted of two solvents: Solvent A (HPLC grade water) and solvent B (acetonitrile). Column temperature was maintained at 40° C. throughout the analysis. A 1 μl injection volume was used for all samples. The column was eluted with the following gradient: 0 min., 10% B; 30 min., 100% B; 40 min., 100% B; 40.1 min., 10% B. Flow rate was 1.5 ml/min with a 45 minute runtime per injection. The GC-MS analysis was performed on HP 6890 gas chromatograph and HP 5973 mass selective detector utilizing EI (electron ionization) with filament energy of 69.9 kev. The front inlet was in split mode with inlet temperature of 250° C. and pressure 8.24 psi; split ratio was 50:1. Initial GC oven temperature was 70° C. for 2 minutes; then, the temperature was ramped to 300° C. at a rate of 20° C./min and was held there for 16.5 minutes. Total run time was 30 minutes. Separation was achieved on a ZEBRON ZB-35 capillary column operated in a constant flow mode with flow rate of 1.0 ml/min. The average velocity was 36 cm/s. The mass spectrometer was in scan mode with m/z range from 10 to 800. The temperature for MS source and MS Quad were set at 230° C. and 150° C., respectively.

The synthesized polyol-bound and non-polyol bound cationic UV photosensitizers added into three different cationic UV curable coating formulations to examine their photosensitization effect. These formulations were chosen since they are realistic and representative of coating systems used in commercial applications. In order to reduce variation, a master base ("MB") for each system was made and named EHMO MB, DOX MB, and PCL MB respectively. The compositions of these coating formulation systems are shown in Table 3.

TABLE 3

| Formulation Systems/ Ingredients | ECC | PI | Reactive Diluent |
|---|---|---|---|
| ECC-EHMO MB | 80 wt % | 4 wt % | EHMO 15 wt % |
| ECC-DOX MB | 80 wt % | 4 wt % | DOX 15 wt % |
| ECC-PCL MB | 80 wt % | 4 wt % | PCL 15 wt % |

Because of the different reactive diluents, these three formulation systems have different crosslink density ("XLD") and mobility. For the system ECC-DOX, its reactive monomers are all difunctional, and, as a result, it has the highest XLD and earliest vitrification point among the three systems. For the system ECC-PCL, it has the lowest XLD and highest mobility due to the existence of PCL. As to the system ECC-EHMO, its XLD and mobility are between the other two (Chen, which is hereby incorporated by reference). Sensitized coating formulations were made by adding $1\times10^{-4}$ mole of photosensitizer (theoretical MW of photosensitizers was used for this calculation) to 5 g master base coating: this amounts to the addition of ~1-3 wt % of photosensitizer. The mixture was then heated on a hotplate for ~15 minutes to dissolve the photosensitizer in the coating. Because of the different crosslink densities and mobilities of the three formulation systems, the same photosensitizer was expected to exhibit different photosensitization effects since the mobility of a coating system is closely related to the photosensitization ability of a photosensitizer (Chen; and Moorjani et al., "Effect of Viscosity on the Rate of Photosensitization of Diaryliodonium Salts by Anthracene," pp. 95-106 in Scranton et al., eds., *Photopolymerization: Fundamentals and Applications. No. 673, ACS Symposium Series*, New York: Oxford University Press (1997), which are hereby incorporated by reference).

The UV curing behavior of the sensitized coatings was monitored in real time FTIR (RTIR) and PhotoDSC experiments. The real time FTIR experiments were performed using a Nicolet Magna-IR 850 spectrometer Series II with detector type DTGS KBr, with a UV optic fiber mounted in a sample chamber in which humidity was kept constant at ~20% by Drierite®. The light source was a LESCO Super Spot MK II 100W DC mercury vapor short-arc lamp. Coating samples were spin coated onto a KBr plate at 3000 rpm for ~15 s, and they were then exposed to UV light for 60 s. Scans were taken over a 120 s period at 2 scan/s. The UV source was adjusted to ~3.6 mW/cm², and the experiments were performed in air. The oxirane conversion of ECC was monitored at 789 cm⁻¹; the oxetane conversion of EHMO and DOX was monitored at 976-977 cm⁻¹. The RTIR was considered as a more direct and sensitive monitoring technique since it specifically monitors the reaction of the photo reactive functional groups upon lower UV light intensity. The average standard deviation for the RTIR measurement was ±2%. A typical reactive functional group conversion vs. time plot obtained in the RTIR experiment is shown in FIG. 1.

For the RTIR experiment results, the reactive functional group conversion after 3 s and 120 s reaction (abbreviated as 3 s conversion and 120 s conversion) are presented in FIG. 1. It was reported that the photopolymerization will not be interfered by the vitrification at the initial stage, and the slope of the conversion versus time plot in the initial linear portion is directly proportional to the rates of photopolymerization (Hua, which is hereby incorporated by reference). From FIG. 1, it can be seen that within 3 seconds the conversion versus time plot is still in the linear range; thus, the 3 s conversion is used here as a simplified representation of the slope and the unperturbed photopolymerization rate. On the other hand, FIG. 1 shows that the 120 s conversion data lies in the plateau portion of the conversion-time plot; thus, it is used to represent the ultimate conversion of the photo reactive functional groups.

The PhotoDSC experiments were performed using a TA Instruments Q1000 DSC modified with the photocalorimetric accessory ("PCA"); the UV light intensity was ~50 mW/cm². The sample size used was 4.5-5.5 mg. Sample was irradiated by UV light for 5 minutes in air followed immediately by a temperature ramp from 0° C. to 200° C. at 10° C./min in $N_2$ to determine the residual heat of reaction. The conversion during photopolymerization was calculated according to the formula:

$$\text{conv. \%} = \frac{\Delta H_{photopolymerization}}{\Delta H_{photopolymerication} + \Delta H_{residual}}$$

Example 3

Results and Discussion of the Synthesis of Novel Polyol Bound Photosensitizers and Experiments Involving their Use in Coating Formulations In previous work, the synthesis of bound UV laser ablation sensitizers was reported (Chen, which is hereby incorporated by reference). In that work it was demonstrated that, if a UV chromophore is attached to the components that form the polymer network, UV photopolymerization is not deterred. In Examples 1 and 2 and in this Example 3, we describe the synthesis of a series of polyol bound sensitizers (e.g., P—Na and DPP—Na). The synthesis was motivated, in part, to improve the solubility of the UV laser energy absorbing chromophore (e.g., a naphthalene moiety) in the coating matrix. In order to study the effect of the sensitizers on the photopolymerization behavior, cationic UV curable coatings containing these sensitizers were examined with RTIR experiments in order to determine if these sensitizers would deter the UV curing of the coatings. No such deterrence was observed, and, moreover, to our surprise, the RTIR result of the coating sensitized by one of these polyol bound sensitizers showed an enhancement in the photopolymerization rate. This led to an in-depth investigation of these sensitizing compounds and the mechanism of their sensitization.

The synthetic procedure, characterization, purity, and nominal structure of the photosensitizers synthesized and studied in this work are summarized in Table 2, in Schemes 2A and 2B, and in Example 2. The synthesis product purity was obtained by peak area integration from HPLC or GC-MS chromatograms of the synthesis products. The formation of OXT-Na was confirmed by GC-MS characterization. The P—Na, DPP—Na, PP—Na, and PCL-Na all had similar HPLC chromatograms, with a peak at around 6.75 min being attributed to 1-naphthalene carboxylic acid, a by-product of the hydroxyl-carbonyl acid chloride reaction. All of the peaks after 10 min are believed to be product peaks and have a characteristic UV-Vis absorption around 300 nm, similar to that of PP—Na-ol, which is believed to indicate the attachment of naphthalene to the polyol molecule. The HPLC chromatogram of PP—Na-ol showed a peak at around 7.2 min (attributed to a 1-naphthalene carboxylic acid by-product) and a peak at 9.5 min (attributed to unreacted EHMO). All of the peaks after 10 min are believed to be product peaks and have a characteristic UV-Vis absorption around 300 nm of naphthalene, indicating the presence of naphthalene in the PP—Na-ol structure.

Performance of the polyol-bound photosensitizers in cationic UV curable systems was assessed as described in Example 2.

Two of the synthesized polyol bound sensitizers (P—Na and DPP—Na) and the synthesized PCL-Na were added into three different coating formulation systems (ECC-EHMO, ECC-DOX, and ECC-PCL). RTIR and PhotoDSC were then used to monitor the UV curing behavior of these sensitized coatings, and the results are presented in FIGS. 2A-2F.

In all of the coating formulation systems, the sensitized coatings exhibit higher initial photopolymerization rate and final conversion than the blank samples (master base formulations) as revealed by the RTIR 3 s and 120 s conversion data. It was also noted that in the system ECC-EHMO and ECC-PCL, one particular photosensitizer, P—Na, exhibited a much more pronounced photosensitization effect than the other two polyol based photosensitizers, both in terms of a much higher initial photopolymerization rate and in terms of a much higher final functional group conversion. This result was particularly unexpected. It is believed that, in system ECC-DOX, because of the lower system mobility and earlier vitrification point, the photosensitization effect is compromised and, thus, not much difference is observed between the different formulations. In the PhotoDSC experiments, due to the much higher intensity UV input, the difference between the sensitized and blank formulations is much less appreciable, but still it shows that the P—Na sensitized coatings have more complete curing than all of the other coatings.

While not wishing or intending to be bound by any theory explaining the aforementioned observations, we propose an Intramolecular Hydrogen Abstraction Photosensitization ("IHAP") mechanism which may explain these observations, as discussed below.

The better photosensitization effect of P—Na was considered, and the differences in the molecular structures of these polyol based photosensitizers were thought to be a major cause. Consequently, it was thought that the P—Na must possess some particular structural features that endow it with a more pronounced photosensitization effect. In the cationic UV photoinitiation process, after the photodecomposition of the photoinitiator, the released anion often abstracts a hydrogen from surrounding hydrogen donors (water in air, solvents and monomers in the coating system, etc.) to generate a super acid $H^+MtX_n^-$. The super acid then protonates the monomers to initiate polymerization (Crivello I, which is hereby incorporated by reference). When a photosensitizer is present, the photoinitiation follows a different route as shown in eq. 3 of Scheme 1. The excited photosensitizer first aids the decomposition of photoinitiator through an electron transfer mechanism. Then the anion species ($MtX_n^-$) that is originally paired to the photoinitiator cation will be paired with the photosensitizer cation radical (Crivello II, which is hereby incorporated by reference). Consequently, it is possible for this new ion pair to abstract a surrounding hydrogen to form a super acid species.

By understanding this photosensitization mechanism and the molecular structure of P—Na, we propose an Intramolecular Hydrogen Abstraction Photosensitization ("IHAP") mechanism to explain the experimental observations. The proposed mechanism is illustrated in Scheme 3.

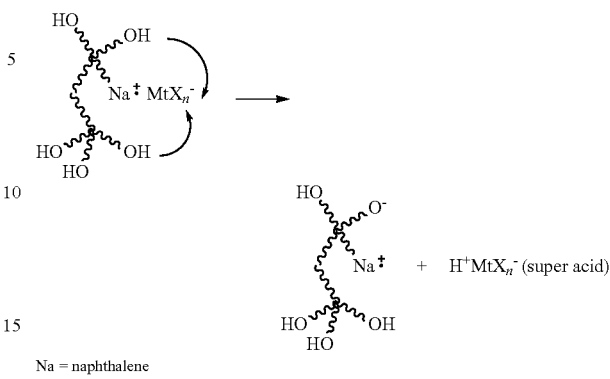

SCHEME 3

Na = naphthalene

Briefly, in a P—Na aided photoinitiation process, a new ion pair $Na^{\cdot+}MtX_n^-$ is formed first (eq. 3, Scheme 1). This new ion pair is attached to one of the branch ends of a globular dendritic polyol molecule (polyol P) which has a large number of hydroxyl groups on the surface (16 hydroxyls, theoretically, in this case); the distance between any of the adjacent branches is therefore short. This relative spatial position of $Na^{\cdot+}MtX_n^-$ and the dense surrounding hydroxyl groups provides a greater chance for $Na^{\cdot+}MtX_n^-$ to interact and abstract a hydrogen intramolecularly from the polyol molecule to generate the super acid species $H^+MtX_n^-$. Since an intramolecular process is much faster than an intermolecular one, the super acid generation rate is consequently faster. As a result, the whole photoinitiation process is faster, which eventually induces a faster photopolymerization and higher ultimate reactive functional group conversion. A photosensitizer that functions through the proposed IHAP mechanism is therefore called an Intramolecular Hydrogen Abstraction—Photosensitizer ("IHA-PS").

In contrast to P—Na, the IHAP mechanism has less of a chance of occurring in the photosensitization process involving PCL-Na and polyol photosensitizer DPP—Na, considering their nominal molecular structures.

For PCL-Na, only two internal hydroxyls are near the ion pair $Na^{\cdot+}MtX_n^-$. Moreover, the interaction of the ion pair and the hydroxyls relies on the movement of a relatively rigid ester bond and hydrocarbon chain. These factors are believed to result in a generally poorer photosensitization effect of PCL-Na. As to polyol photosensitizer DPP—Na, the distance between the ion pair and internal hydroxyls is actually longer than that in the PCL-Na molecule, but the flexibility of the ether linkage and higher hydroxyl content in the molecule seem to compensate for the distance disadvantage well. Thus, polyol photosensitizer DPP—Na has a better photosensitization effect than PCL-Na in general. The poorer photosensitization effect of polyol photosensitizer DPP—Na when compared to polyol photosensitizer P—Na may be attributed to its lower hydroxyl group density.

In order to further verify the effect of IHA-PS, two other non-polyol type photosensitizers, OXT-Na and NDC—OX, were synthesized and compared with P—Na for cationic UV photosensitization behavior. The results are shown in FIG. 3A-3F. Again, it was found that in system ECC-EHMO and system ECC-PCL, P—Na has a better photosensitization effect. In system ECC-DOX, though the 120 s conversion for all the coatings are similar, the 3 s conversion of P—Na is still higher than the coatings sensitized by OXT-Na and NDC—OX, indicating the effectiveness of P—Na in the initial photopolymerization stage. When comparing the results of OXT-Na and NDC—OX with PCL-Na and polyol photosensitizer DPP—Na, it is noticed that PCL-Na and polyol photosensitizer DPP—Na generally have a better photosensitization effect than OXT-Na and NDC—OX. This may be attributed to the IHAP mechanism involving polyol type photosensitizers and the hydroxyl group density in IHA-PSs.

Furthermore, by examining the results obtained from all the photosensitizers examined so far, an additional piece of evidence that supports the IHAP mechanism may be noted. That is, in system ECC-EHMO and ECC-PCL, although there are a large number of abstractable external hydrogen donors provided by the hydroxyl groups on EHMO and PCL molecules, the typical IHA-PS (e.g., P—Na) still exhibited a better photosensitization effect. This again corroborates the proposed IHAP mechanism.

From the discussion on the relationship between polyol based photosensitizers and their corresponding photosensitization effects, two features appear to be important to optimize the likelihood of intramolecular hydrogen abstraction occurring. The first is the amount of internal abstractable hydrogens sources (hydroxyl groups in this case) around the chromophore (naphthalene in this case). The more the internal hydroxyls, the higher the chance for the ion pair $Na^{*+}MtX_n^-$ to interact and abstract a hydrogen intramolecularly. The second feature is the relative spatial position of the ion pair and the internal hydroxyls. Optimally, these hydroxyls should be in a position (as in the case of P—Na) or should be able to move to a position (e.g., through facile chain movement, as in the case of DPP—Na) where the collision of the ion pair with the hydroxyl can occur so as to facilitate intramolecular hydrogen abstraction and super acid generation. These two features can be used in order to design and synthesize other IHA-PSs, such as a more simplified version of IHA-PS (relative to P—Na). The motivation to obtain a simplified version of IHA-PS is that the P—Na seems too "clumsy" with a MW of 1650. Also, it was suspected that only the hydroxyl groups on the same hemisphere as the $Na^{*+}MtX_n^-$ function as an effective abstractable hydrogen source, the other hydroxyl groups (e.g., those on the other hemisphere of the molecule) being redundant. Consequently, we hypothesize that it is possible for a molecule to exhibit the same photosensitization effect as P—Na with fewer internal hydroxyls, as long as there are sufficient internal hydroxyls around the $Na^{*+}MtX_n^-$. Additionally, if a simplified version of an IHA-PS molecule having an equal photosensitization effect to P—Na can be designed and synthesized by applying the two proposed principles, it would be a further validation of the proposed IHAP mechanism. So the objective of this simplified IHA-PS project was to synthesize a photosensitizer molecule that exhibits effective IHAP with a low number of internal hydroxyl groups and a low molecular weight.

Figure 4:
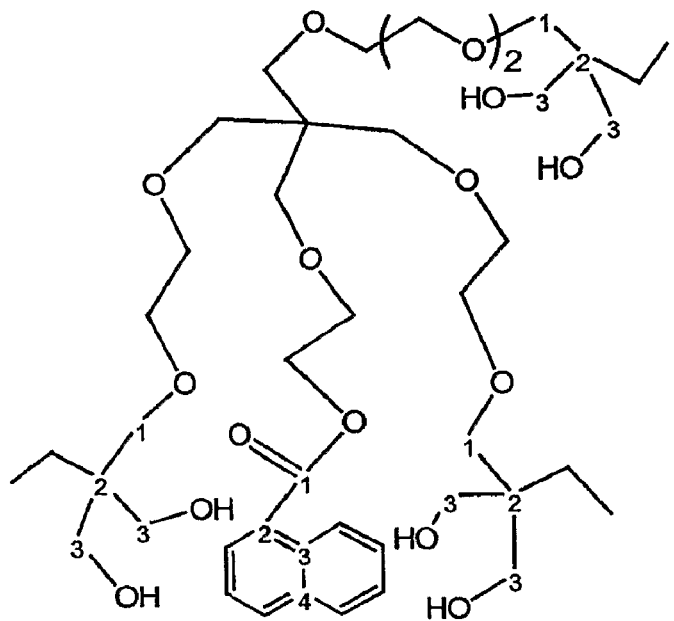
FIG. 4 is a structure of a polyol photosensitizer according to the present invention.

The first step of this molecule design and synthesis project was to determine the topology of the photosensitizer molecule. After consideration of possible molecule topologies (such as linear topology, comb topology, and even crown ether-like topology) as well as synthesis feasibility and simplicity, it was decided that an effective topology would be a hyperbranched structure with the polynuclear aromatic compound semi-buried in the branches functionalized with hydroxyl groups. This way the chromophore still has a chance to interact with the photoinitiator molecule, and, at the same time, the generated super acid species still has a chance to escape from the IHA-PS molecule to initiate polymerization. More importantly, this topology should provide a better chance for the ion pair $Na^{*+}MtX_n^-$ to interact with and abstract a hydrogen from the surrounding hydroxyl groups. A feasible synthesis route for the molecule having this topology is a divergent synthesis scheme. For example, the synthetic strategy can begin with a multifunctional core with a low MW, followed by the attachment of the polynuclear aromatic compound to one of the functional arms of the core. Then, the other hydroxyl functionalized arms around the polynuclear aromatic compound are "grown" through the reaction of the remaining functional arms. Because of the convenience and high yield of hydroxyl-acid chloride reaction, it was again chosen as a method to react the polynuclear aromatic compound onto the core; and, consequently, polyols can be the best choice for the multifunctional core. It was thought that the most ideal polyol core is pentaerythritol or di-pentaerythritol due to their branched topology and low hydroxyl equivalent weight. However, in our initial trial, it was found that these two solid polyols were difficult to handle in practice because of their poor solubility and high melting point. An ethoxylated version of pentaerythritol, polyol PP, was then chosen as an alternative. As the result of ethoxylation, the polyol PP is a low viscosity liquid at room temperature, but with a higher hydroxyl equivalent weight than pentaerythritol. As the first synthesis step, PP—Na was successfully obtained by attaching 1-naphthol chloride to PP (see Table 2). The next challenge was how to attach hydroxyl groups around the attached naphthalene starting from PP—Na. One way was to react a highly functional polyol molecule with the remaining hydroxyl groups of PP—Na. It was also estimated that the backbone length of the polyol molecule should be around 5 atoms, and the primary hydroxyl groups should be attached to atom 3 or 4 so that the hydroxyls can semi-surround the naphthalene and have a higher chance to collide and interact with it. This consideration is illustrated in FIG. 4 by the nominal structure of the "designed" IHA-PS.

Figure 5:
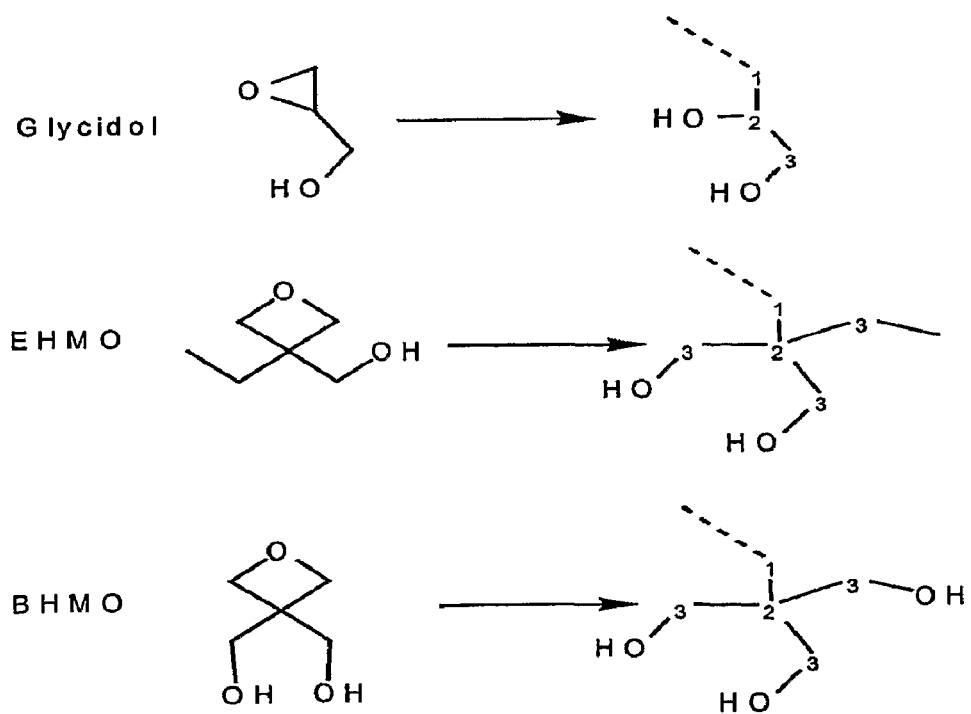
FIG. 5 is a series of three reaction schemes showing theoretical ring-opening products, by a hydroxyl group, of three illustrative reactants (glycidol, EHMO, and BHMO) that can be used in the preparation of polyol-containing photosensitizers of the present invention.
Figure 6A:
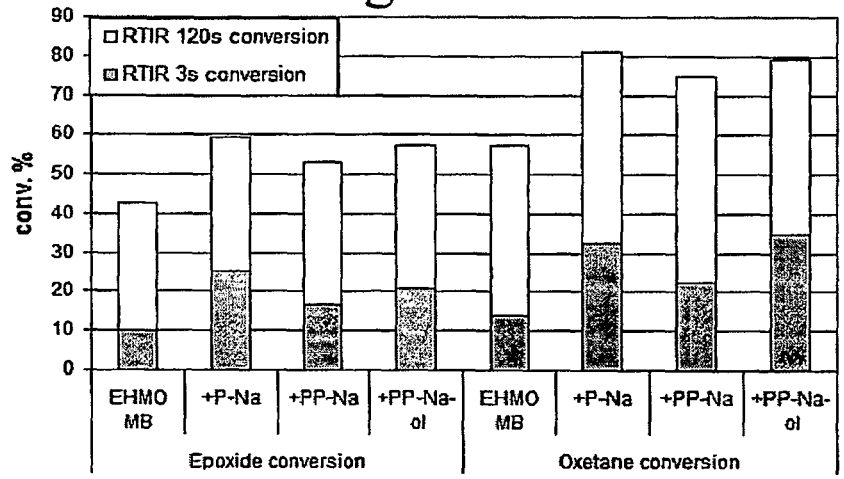
FIGS. 6A-6C are bar graphs of the results of real time FTIR experiments showing functional group conversion of coatings sensitized by polyol photosensitizers of the present invention (P—Na, PP—Na, and PP—Na-ol) in system ECC-EHMO (FIG. 6A), system ECC-DOX (FIG. 6B), and system ECC-PCL (FIG. 6C).
Figure 6B:
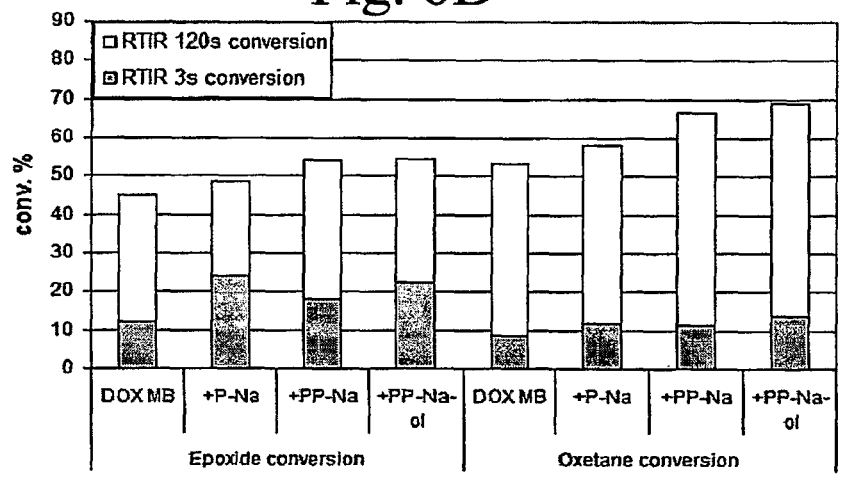
Figure 6C:
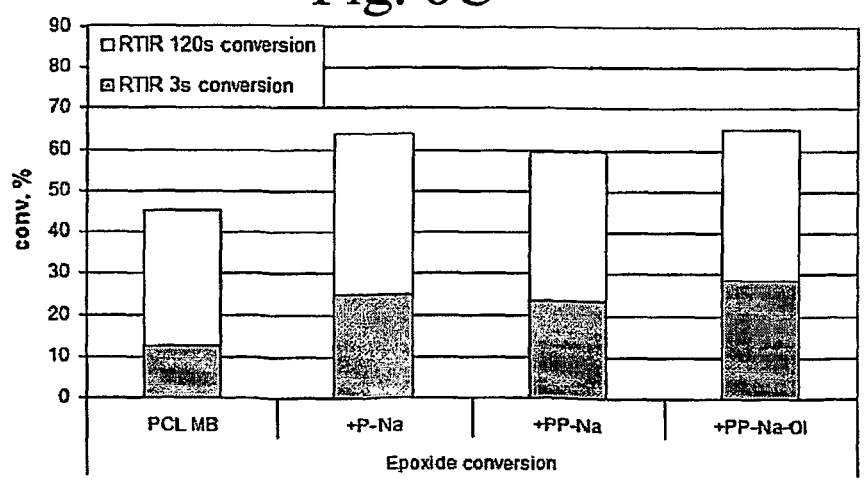
Figure 6D:
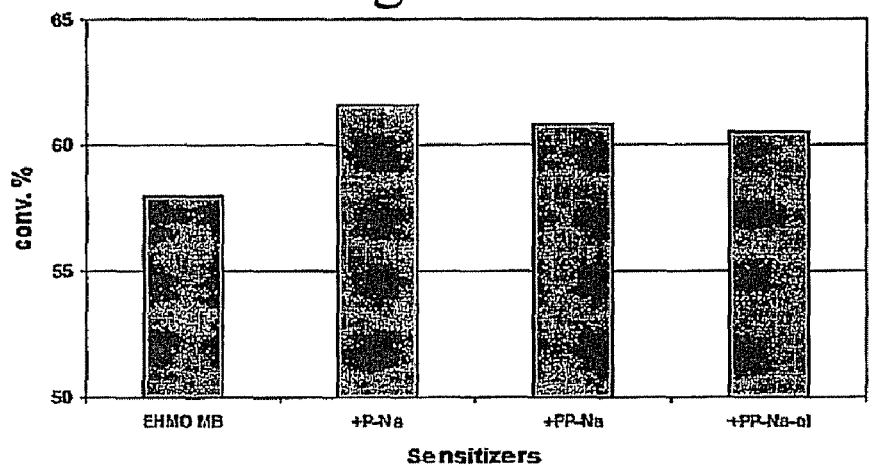
FIGS. 6D-6F are bar graphs of the results of PhotoDSC experiments showing functional group conversion of coatings sensitized by polyol photosensitizers of the present invention (P—Na, PP—Na, and PP—Na-ol) in system ECC-EHMO (FIG. 6D), system ECC-DOX (FIG. 6E), and system ECC-PCL (FIG. 6F).
Figure 6E:
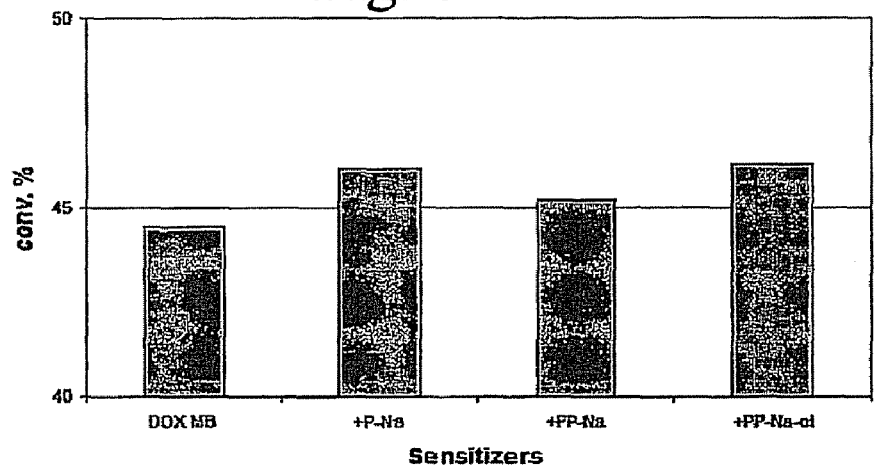
Figure 6F:
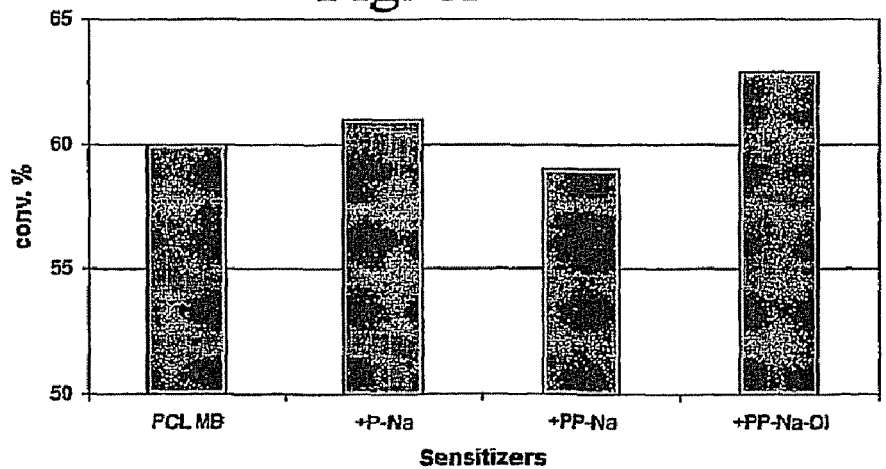

On the other hand, a key factor for the attachment reaction is the functional group that the highly functional polyol molecule should have in order to react with the hydroxyl groups of PP—Na. It was thought that the ideal polyol molecule should have an oxygen containing heteroatom ring which is linked to multiple hydroxyl groups, so the attachment of the polyol molecule to PP—Na can be accomplished through a ring opening reaction via the hydroxyl groups of PP—Na. An added advantage of a ring opening reaction is that an additional hydroxyl group would be generated. Based on the above thoughts, three molecules, glycidol, EHMO, and 3,3-(bis)-hydroxymethyloxetane ("BHMO"), were selected as possible candidates. Their theoretical ring opened products by reaction with the hydroxyl group are shown in FIG. 5, from where it can be seen that, after ring opening, all of these molecules will generate at least one hydroxyl group at atom 3. For glycidol, one of the two hydroxyls in the product is the less, reactive secondary hydroxyl on atom 2. As to EHMO, two primary hydroxyls will be generated on atom 3. Moreover, the EHMO has low viscosity and is readily available. For BHMO, it is the best candidate since 3 primary hydroxyls will be generated on atom 3, but it is not readily available (Chen et al., "Synthesis of Multihydroxyl Branched Polyethers by Cationic Copolymerization of 3,3-Bis(hydroxymethyl)oxetane and 3-Ethyl-3-(Hydroxy-methyl)oxetane," *Journal of Polymer Science, Part A: Polymer Chemistry* 40(12):1991-2002 (2002), which is hereby incorporated by reference). Also, BHMO is not easy to handle due to its solid form and strong hydrogen bonding. For these reasons, EHMO was selected for a trial synthesis. The synthesis and characterization of the simplified IHA-PS is described in Example 2 and in this Example 3, respectively; its nominal structure is shown in FIG. 4; and the product was named PP—Na-ol.

The PP—Na-ol and PP—Na were added into aforementioned three formulation systems to make sensitized coatings. The UV curing behavior of these coatings was then monitored by RTIR and PhotoDSC and was compared with a blank formulation and P—Na. The results are shown in FIGS. 6A-6F. From FIGS. 6A-6F it can be seen that PP—Na-ol exhibits a similar photosensitization effect to that of P—Na in all of the formulation systems, and is better than other photosensitizers studied in this work. Moreover, it should be noted that the theoretical molecular weight of PP—Na-ol (858 g/mol) is only half that of P—Na (1655 g/mol) and that its theoretical number of hydroxyls is only about one third of P—Na (6 vs. 15). As a result, PP—Na-ol has higher hydroxyl equivalent weight (143 g/mol of hydroxyl) than P—Na (118 g/mol of hydroxyl). So it can be concluded that by utilizing the proposed principles in the IHAP mechanism, a more simplified version of IHA-PS can be synthesized by placing a sufficient number of internal hydrogen donors in the correct relative spatial position to the polynuclear aromatic chromophore. This "designed" IHA-PS has a more efficient IHAP effect in terms of the hydroxyl equivalent weight and molecular weight of the photosensitizer. This result further confirms the proposed IHAP mechanism.

Since it is well known that the addition of diluents containing hydroxyl groups can increase the reaction rate and conversion in cationic photopolymerization through chain transfer reactions, the possibility that the enhanced photopolymerization rate observed with these photosensitizers is due to the hydroxyl groups on these sensitizer molecules must also be considered. However, this effect appears to be minimal for a number of reasons. First, since the amount of the photosensitizer added to the formulation is low, the amount of added hydroxyl groups is also low, especially when compared to the hydroxyl groups already present in two of the controls (ECC-EHMO and ECC-PCL) without the photosensitizers. Thus, the added hydroxyl groups are not expected to make a significant contribution to chain transfer processes. For the system ECC-DOX, which does not contain a hydroxyl-functional diluent, it is noted that the sensitization effect for the sensitizers in this system is comparable to that of the other two controls. If the increase in conversion was due solely to the addition of the hydroxyl groups to the system, it would be expected that the effect on the ECC-DOX system would be greater than for the systems already containing hydroxyl groups. Second, the initial photopolymerization rate (3 second conversion) is higher for the systems containing the photosensitizers. The initial photopolymerization rate is believed to be more closely related to the initiation step than the propagation and chain transfer reactions. Third, the "designed" IHA-PS (PP—Na-ol) has only half of the hydroxyls of P—Na, but it has a comparable photosensitizing effect. Thus, it is believed that the proposed mechanism of photosensitization is the most likely explanation for the enhanced photopolymerization rate observed.

Example 4

Synthesis and Study of Carrier Gas UV Laser Ablation Sensitizers for Photopolymerized Thin Films As discussed above, the use of cycloaliphatic epoxide based cationic UV curable coatings can be advantageous in microelectronic packaging materials, for example, due to their good electrical properties and low shrinkage rate during UV curing. Although use of a 355 nm laser to ablate through vias in such coatings is one of the steps in a specific microelectronic fabrication process, few reports can be found on either 355 nm laser ablation of polymers or laser ablation of UV curable materials. Previously, we successfully improved the 355 nm laser ablation performance of cationic UV curable coatings by incorporating ~1 wt % of reactive laser ablation sensitizers as an additive. In our subsequent research aiming to further improve the UV laser ablation performance of these coatings, this additive approach was again adopted, because it was shown in our lab that the addition of laser ablation sensitizers did not significantly change the basic coating properties. In this Example 4 and in the following Examples 5 and 6, we describe the design, synthesis, and characterization of novel UV laser ablation sensitizers that greatly enhance the UV laser ablation performance of coating materials.

Further details regarding the materials and experiments described in this Example 4 and in the following Examples 5 and 6 can be found in Chen et al., "Carrier Gas UV Laser Ablation Sensitizers for Photopolymerized Thin Films," *J. Photochem. Photobiol. A: Chemistry,* 185(2-3):115-126 (2007), which is hereby incorporated by reference.

Example 5

Details of the Synthesis of Carrier Gas UV Laser Ablation Sensitizers for Photopolymerized Thin Films and Preparation of Coating Formulations CYRACURE™ UVR 6110 difunctional cycloaliphatic epoxide (3,4-epoxycyclohexylmethyl-3-4-epoxycyclohexane carboxylate) ("ECC"), UVR 6000 oxetane diluent (3-ethyl-3-hydroxymethyl oxetane) ("OXT"), and UVI 6974 photoinitiator (mixed triarylsulfonium hexafluoroantimonate salt in propylene carbonate ("PI") were obtained from Dow Chemical Company. AMBERLYST™ 21 ion-exchange resin with tertiary amine functionality ("A21"), tetrahydrofuran (HPLC grade) ("THF"), triethylene amine ("TEA"), 1-naphthol ("1-Na—OH"), 2-naphthol ("2-Na—OH"), 9-anthracene methanol ("A-OH"), dimethyl oxalate ("DMO"), 1-naphthalene chloride ("1-Na Cl"), and mono-methyl oxalyl chloride ("MOC") were obtained from Aldrich. Hyperbranched polyester polyols H20 ("H") and P1000 ("P") were obtained from Perstorp Polyols Inc. The polyol P1000 is in liquid form, which is H20 (solid material) diluted with a polyether type polyol, according to Perstorp Polyol Inc. All materials were used as received.

Schemes 4A and 4B show the synthesis routes for designed carrier gas sensitizers. More particularly, Scheme 4A shows the synthesis of OXT-DMO by transesterification between OXT and DMO; and Scheme 4B shows syntheses involving the reaction of hydroxyl groups and acid chlorides. In Scheme 4B, $R^1$—OH refers to hydroxyl containing compounds (e.g., polyols, 2-Na—OH, etc.) and $R^2$—C(O)—Cl refers to an acid chloride (e.g., MOC, 1-Na Cl, etc.). Table 4 shows the nominal structures of the "carrier gas" laser ablation sensitizers, and Table 5 shows the sensitizers' synthesis and purification details.

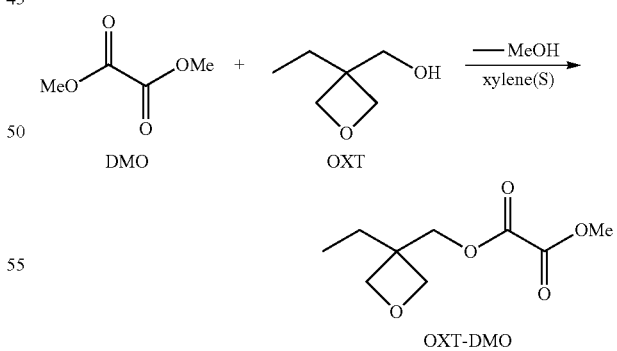

SCHEME 4A

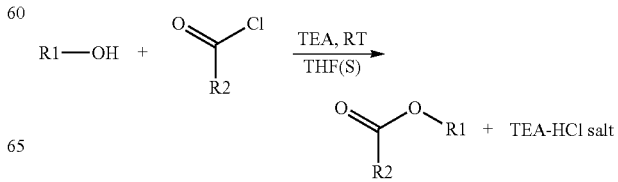

SCHEME 4B

TABLE 4
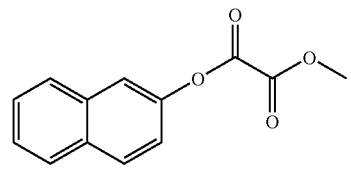
Na-MOC
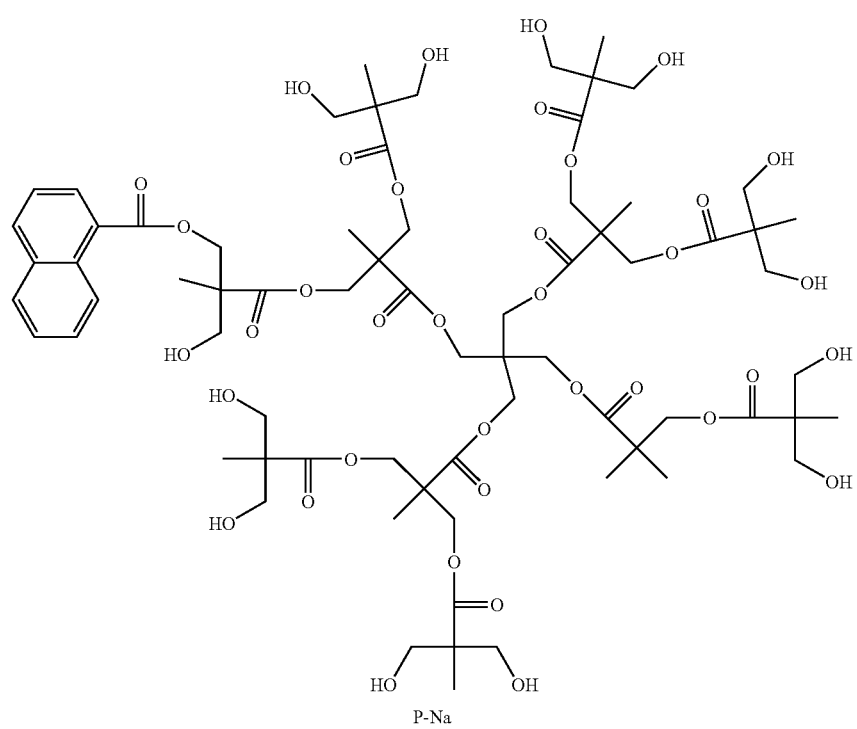
P-Na

TABLE 4-continued
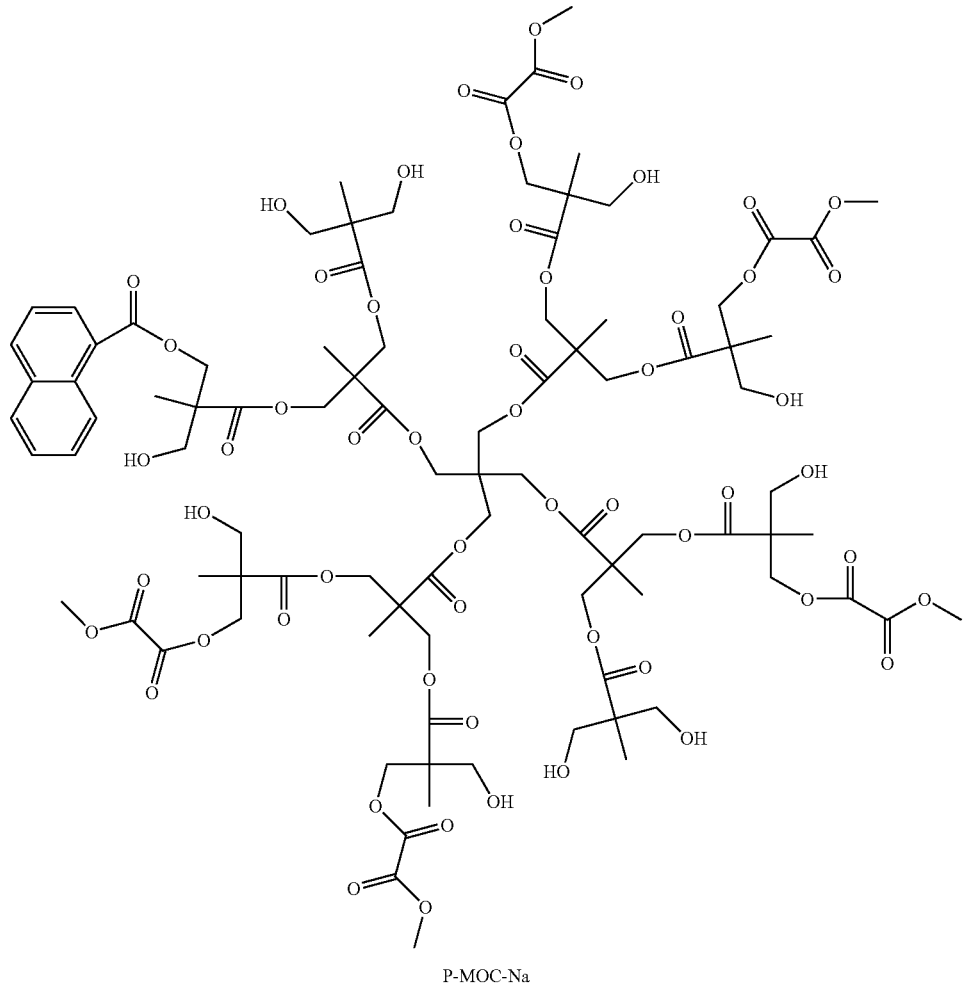
P-MOC-Na
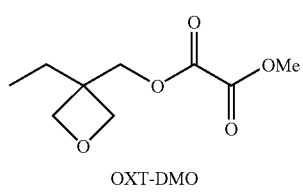
OXT-DMO

TABLE 4-continued
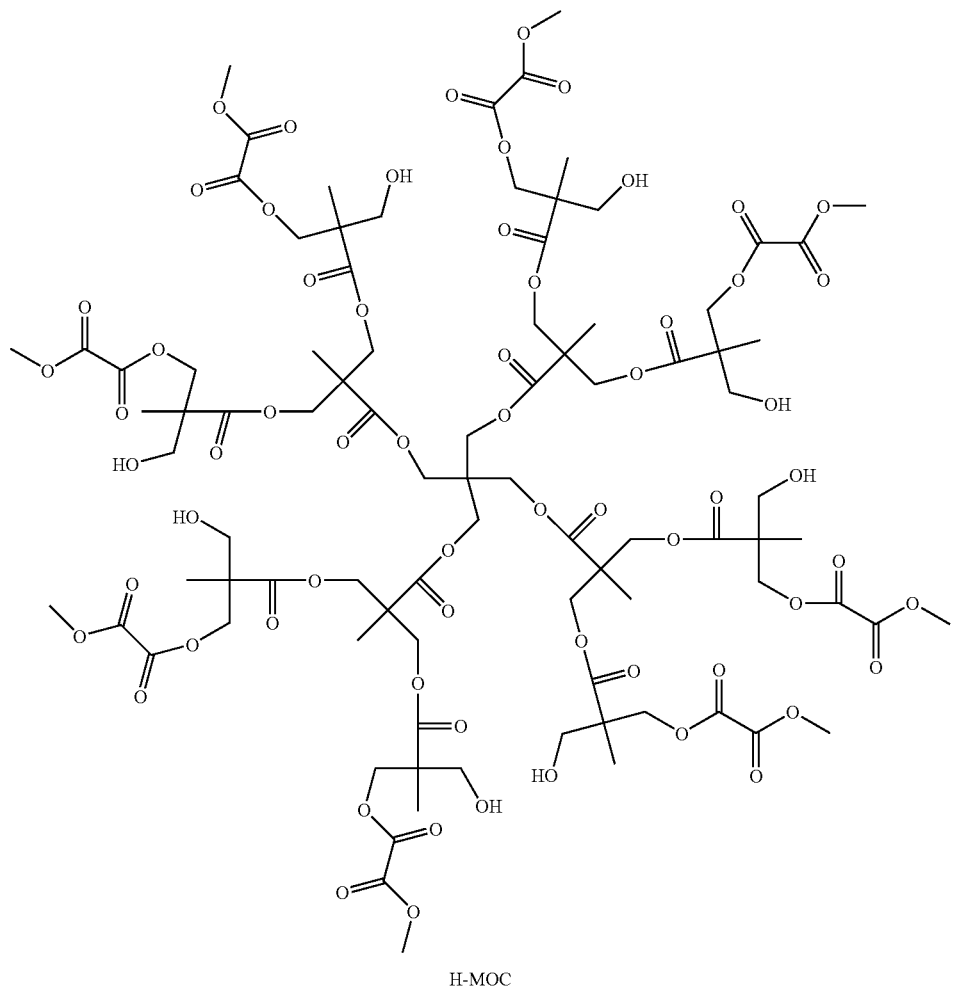
H-MOC

TABLE 4-continued

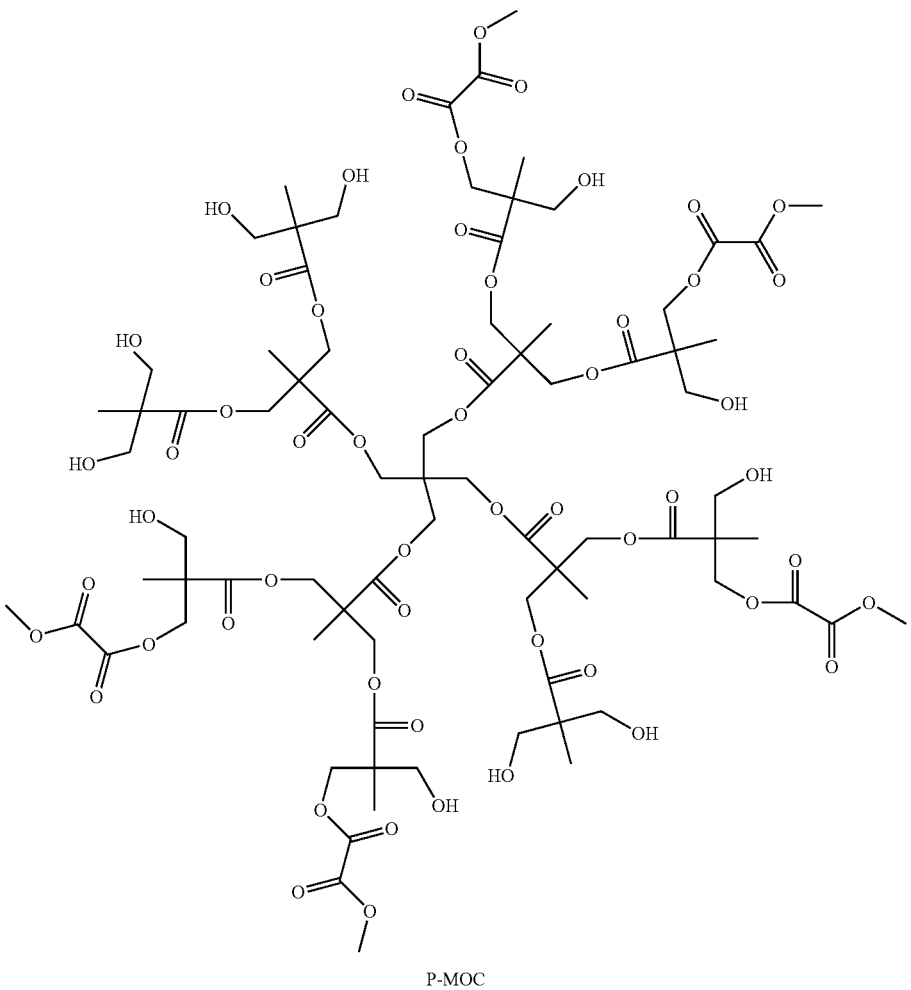

P-MOC

TABLE 5

| Sensitizer | Reactants (Mole Ratio) | Catalyst/ Neutralizer | Synthesis and purification procedure | Characterization | Product appearance |
| --- | --- | --- | --- | --- | --- |
| OXT-DMO | OXT:DMO (1:1) | A21 (~10 wt % of total reactants) | See Note A | GC-MS | Viscous clear colorless liquid |
| Na-Moc | 2-Na OH:MOC (1:1.2) | TEA (2-3 times of the theoretical amount needed to neutralize the HCl generated during the reaction) | See Note B | GC-MS, UV-Vis | Deep brown solid |
| H-MOC | H:MOC (1:8) | | | FTIR, UV-Vis | Light yellow paste |
| P-MOC-Na | P:MOC:1-Na Cl (1:5:1) | | | FTIR, UV-Vis | Light yellow clear paste |
| P-MOC | P:MOC (1:5) | | | FTIR, UV-Vis | Light yellow clear paste |

TABLE 5-continued

| Sensitizer | Reactants (Mole Ratio) | Catalyst/ Neutralizer | Synthesis and purification procedure | Character- ization | Product appearance |
|---|---|---|---|---|---|
| P—Na | P:1-Na Cl (1:1) | | | HPLC, FTIR, UV-Vis | Clear paste |

NOTE A:
The synthesis was carried out using Scheme 4A. Charge reactants in a three neck round bottom flask, reaction under 100° C. in xylene for 12 hours with a magnetic stirrer, $N_2$ purge, and water condenser.
NOTE B:
The synthesis was carried out using Scheme 4B. Charge reactants in a 20 ml glass vial with THF, stir in water bath with magnetic stirrer for ~10 min, charge TEA dropwise, then filter product solution using filter paper to remove the HCl-TEA salt.

A series of sensitized coatings were formulated in order to investigate the effect of carrier gas sensitizers. To avoid variation, a master base ("MB") formulation (also serves as the control formulation) is made and composed of 80 wt % ECC, 16 wt % OXT, and 4 wt % PI. This formulation was expected to be ablated with more difficulty due to its high $T_g$ and crosslink density (Jang et al., "Synthesis and Cationic Photopolymerization of Epoxy-Functional Siloxane Monomers and Oligomers," *Journal of Polymer Science: Part A: Polymer Chemistry*, 41(19):3056-3073 (2003) ("Jang"), which is hereby incorporated by reference). In using such a formulation it was hoped to differentiate the ablation sensitization performance between the sensitizers. Sensitizers were mixed into the MB formulation under slight heating (~50° C.) to make different sensitized coatings, and the compositions are given in Table 6. In Table 3, except for OXT-DMO, all the other sensitizers were added at the ratio of 0.0001 mol per 5 g MB. In those cases where two sensitizers were added, then each of them was added at the ratio of 0.0001 mol/5 g MB. In all cases, the theoretical molecular weight of the sensitizer was used for the calculations.

TABLE 6

| Formulations | | Compositions | | |
|---|---|---|---|---|
| Control | | Master Base (MB) - (80 wt % ECC, 16 wt % OXT, 4 wt % PI) | | |
| CG-16 | | All of the OXT (16 wt %) in MB was replaced by the reaction product in Scheme 4A | | |
| CG-18 | | Half of the OXT (8 wt %) in MB was replaced by the reaction product in Scheme 4A | | |
| CG-(A-OH) | | +A-OH | 0.0208 g | ~0.42 wt % |
| Group A | CG-(Na—OH) | +Na—OH | 0.0144 g | ~0.29 wt % |
| | CG-(Na-MOC) | +Na-MOC | 0.023 g | ~0.46 wt % |
| | CG-(H-MOC) | +H-MOC | 0.2188 g | ~4.4 wt % |
| | CG-(H-MOC+1-Na—OH) | +H-MOC & 1-Na—OH | 0.2188 g + 0.0144 g | ~4.7 wt % |
| Group B | CG-(P-MOC) | +P-MOC | 0.193 g | ~3.9 wt % |
| | CG-(P—Na) | +P—Na | 0.1655 g | ~3.3 wt % |
| | CG-(P-MOC+1-Na—OH) | +P-MOC & 1-Na—OH | 0.193 g + 0.0144 g | ~4.1 wt % |
| | CG-(P-MOC-Na) | +P-MOC-Na | 0.208 g | ~4.2 wt % |

The above materials were characterized as described below.

GC-MS analysis was performed on an HP 6890 gas chromatograph with an HP 5973 mass selective detector utilizing EI (electron ionization) with filament energy of 69.9 keV. The front inlet was in split mode with inlet temperature of 250° C. and pressure of 8.24 psi.; the split ratio was 50:1. Initial GC oven temperature was 70° C. for 2 minutes; then the temperature was ramped to 300° C. at a rate of 20° C./min; and the temperature was then held for 16.5 minutes. Total run time was 30 minutes. Separation was achieved on a ZEBRON ZB-35 capillary column operated in a constant flow mode with flow rate of 1.0 ml/min. The average velocity was 36 cm/s. The mass spectrometer was in scan mode with m/z range from 10 to 800. The temperatures for MS source and MS Quad were set at 230° C. and 150° C., respectively.

The FTIR and real time FTIR ("RTIR") experiments were performed using a Nicolet Magna-IR 850 Spectrometer Series II with detector type DTGS KBr. For the RTIR experiments, a UV optic fiber was mounted in a sample chamber in which the humidity was kept around 20% by DRIERITE™. The light source was a LESCO Super Spot MK II 100W DC mercury vapor short-arc lamp. This setup directly monitors the functional group conversion as the photo polymerization reaction proceeds. Coating samples were spin coated onto a KBr plate at 3000 rpm for about 15 s, followed by exposure to UV light for 60 s. Scans were taken over a 120 s period at 2 scans/s. The UV intensity was adjusted to ~3.6 mW/cm$^2$, and the experiment was performed in air. The oxirane conversion of ECC was monitored at 789 cm$^1$ and the oxetane conversion of EHMO was monitored at 976-977 cm$^1$ The average conversion at 120 s is presented below. The average standard deviation of this experiment was ±2%.

Cured coating films were prepared by casting the liquid sample onto an aluminum panel (Q panel) with a Gardco 70# wire drawdown bar, followed by UV curing for 60 s in air using a Dymax light source with a 200 EC silver lamp (UV-A, 365 nm). The intensity was ~35 mW/c$^2$mas measured by a NIST Traceable Radiometer, International Light model IL1400A. Cured coating films were ~80-100 μm thick as measured by MICROMASTER™ micrometer. The purpose of preparing such an unusually thick film was to monitor the laser ablation progress inside the coating film as the pulses increased. Free coating films were peeled off from aluminum panel using a razor blade for thermogravimetric analysis ("TGA") and laser ablation experiments.

UV laser ablation on cured coating films was done using a Continuum Surelite II Nd:YAG laser in a single shot mode.

Figure 7:
FIG. 7 is a schematic representation of via arrays created by 355 nm YAG laser ablation of a coating produced with a coating formulation in accordance with the present invention.

The laser beam was passed through a Pellin-Brocca light prism into a Newport Model 935-5 attenuator, and then was focused on the sample surface using a Newport U-27X objective lens. Free coating films were taped on ZAP-IT laser calibration panel and mounted on a 3D sample mount. The distance between the laser output and the sample film was 80 cm. The laser wavelength was 355 nm with a beam spot size of approximately 40 μm. The pulse energy was adjusted to a lower value of ~0.93 mJ (measured using Molectron J9LP pyroelectric detector before lens) in order to better differentiate the sensitized samples. Each sample film was ablated under the same conditions, and the ablation experiment was performed in air. Two rows of vias were ablated on each sample film as shown in FIG. 7; vias in each row were ablated by laser pulses of 1, 2, 4, 8, 16, and 32, respectively, with the second row as a repetition of the first one. The via depth and volume data are based on the average value of these two identically ablated vias.

Wyko NT3300 Optical Profilometry from VEECO was used to obtain profile data of ablated vias. VSI (vertical scanning interferometry) mode and a magnification of 5×0.5 were used. Back scan length was set at 15 μm, and scan length was varied from 100 to 150 μm as pulses increases. Vision 32 for NT-2000 software, version 2.303, was used to process the dimension data for ablated vias. Scanning electron microscopy ("SEM") images were obtained using a JEOL JSM-6300 Scanning Electron Microscope. Samples were mounted using carbon sticky tabs on aluminum mounts and coated with gold/palladium using a Balzers SCD 030 sputter coater.

UV-Vis spectra were obtained on a Varian Cary 5000 UV-Vis-NIR spectrophotometer operating in absorption mode.

The scanning rate was 600 nm/min, and the scanning range was 200-600 nm. The compounds were dissolved in acetonitrile for the UV-Vis experiments. Thermogravimetric analysis ("TGA") was performed using a TA Instruments TGA Q500 under nitrogen purging. The temperature was ramped from 25° C. to 650° C. at a ramping rate of 10° C./min, and the inflection point of the major degradation transition is presented as $T_d$.

Example 6

Results and Discussion of the Synthesis of Carrier Gas UV Laser Ablation Sensitizers and Experiments Involving Their Use in Coating Formulations The first trial involved the synthesis and effect of OXT-DMO, and this is described below.

The use of "carrier gas" laser ablation sensitizers to improve the UV laser ablation performance of photopolymerized thin film materials is a novel approach. In order to realize this concept and obtain a "carrier gas" laser ablation sensitizer, rational molecular design followed by tailored synthesis was viewed as being indispensable. In the design stage for these novel sensitizers, two key aspects were taken into consideration. The first one was the choice of the "carrier gas" generation functional group in the sensitizer molecule. Though nitrogen containing functional groups, such as triazene, have been reported to be effective in generating carrier gas ($N_2$) upon photolysis (Lippert I; and Nuyken, which are hereby incorporated by reference), the basicity of such groups may inhibit the cationic photopolymerization of the oxirane and oxetane (Jang, which is hereby incorporated by reference). The oxalyl group was then chosen over the ester group as the best candidate for the "carrier gas" generating functional group due to its dense ester structure and the tendency to decompose into small molecule gases such as CO and $CO_2$. The second consideration was that it seemed advantageous to chemically attach the oxalyl group to the monomers in the coating composition, so that the resulting sensitizer will have better compatibility with the coating matrix and be uniformly distributed throughout the material. Based on these thoughts, synthesis was carried out to attach the oxalyl group to the hydroxyl oxetane monomer through transesterification as shown in Scheme 4A. The reaction product was named OXT-DMO.

The synthesis and purification of OXT-DMO was found to be a time consuming process. The reaction product was dried in a vacuum oven and then characterized by GC-MS; The GC chromatogram showed 3 min peaks (attributed to residual DMO and xylene), a 5.5 min peak (attributed to unreacted OXT), and 8.5 and 10 min peaks (attributed to the desired mono transesterification product (OXT-DMO). Other peaks were attributed to by-products. The purified product contained over 50% of unreacted OXT and only about 30% of the desired product (OXT-DMO). The MS spectrum of 8.5 and 10 min peaks showed a molecular ion of OXT-DMO with m/z=202/203 and lower m/z peaks that were attributed to fragmentation of OXT-DMO starting from the DMO side. For example, a peak at m/z=187 indicated the loss of —$CH_3$ peak at m/z=171/172 indicated the loss of —$OCH_3$ and a peak at m/z=143 indicated the loss of —$COOC_3H$ Two conclusions are drawn from the GC-MS results: (1) the route for the synthesis of OXT-DMO results in a low product yield; and (2) the oxalyl group will readily decompose and release the desired gaseous products upon high energy input.

Although the content of OXT-DMO in the reaction product (30% OXT-DMO, >50% OXT) is low, it was incorporated into formulations (CG-16 and CG-8) for an initial assessment of the three important coating properties: UV curing behavior, thermal stability, and laser ablation performance, as compared to the control samples. The other minor impurities (such as DMO) were not expected to have a major impact on the coating properties. The RTIR and TGA results for coating sample CG-16, CG-8 and two control samples are presented in Table 7. No major change was observed in the UV curing behavior and thermal stability of coatings after substituting the OXT with OXT-DMO.

TABLE 7

| Formulations | RTIR 120s conversion (%) | | $T_d$ |
| --- | --- | --- | --- |
| | Epoxide | Oxetane | (° C.) |
| Control | 43 | 66 | 394 |
| CG-16 | 48 | 62 | 393 |
| (contains 5 wt % OXT-DMO) | | | |
| CG-16 | 42 | 63 | 388 |
| (contains 2.4 wt % OXT-DMO) | | | |
| CG-(A-OH) | 45 | 63 | 393 |

The laser ablation experimental results are shown in FIGS. 8A-8D, and the laser ablation data of these samples is given in Table 8.

TABLE 8

| Laser Pulses | Control | CG-16 | CG-8 | CG-(A-OH) |
|---|---|---|---|---|
| 1 | N | C (62.5) | N | B (53.5) |
| 2 | N | T (101.0) | N | B (54.3) |
| 4 | N | | N | B (56.8) |
| 8 | N | | N | B (75.0) |
| 16 | B (35.0) | | B (74.4) | T (114.0) |

Figure 8A:
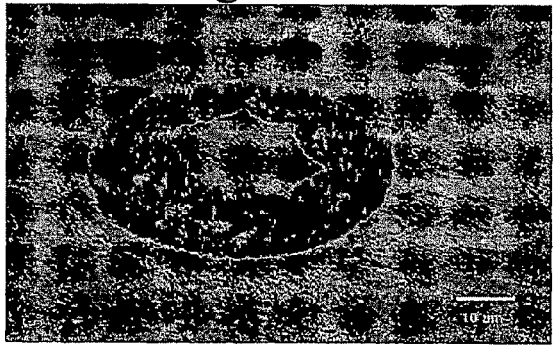
FIGS. 8A-8D are SEM images (FIGS. 8A and 8C) and cross-sectional histograms (FIGS. 8B and 8D) of holes formed by laser ablation of coatings containing ~5 wt % of an carrier gas additive (oxalyl-containing oxetane resin) of the present invention (FIGS. 8A and 8B) and control coatings (FIGS. 8C and 8D).
Figure 8B:
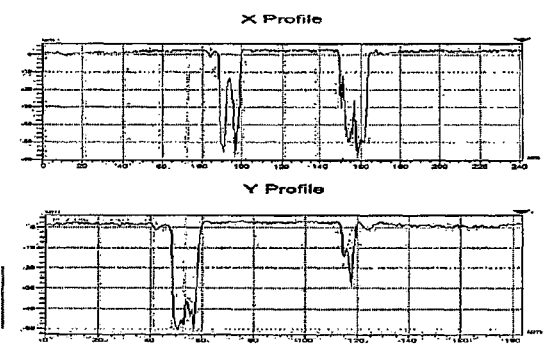
Figure 8C:
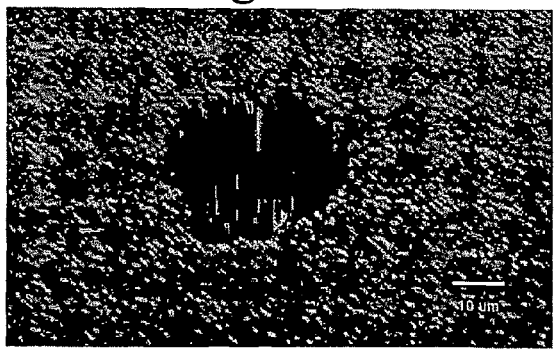
Figure 8D:
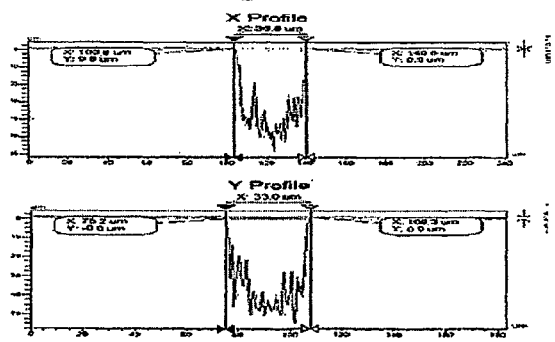

In Table 8, the letter "N" denotes no ablation, the letter "T" denotes that a through hole was ablated in the coating film, the letter "B" stands for the scenario that bulk coating material still exists in the center of the hole while the surrounding material has been removed (illustrated in FIG. 8A), and the letter "C" denotes that a relatively clean hole is ablated (illustrated in FIG. 8B). Here the ablation scenario graded by letter "B" is considered a less efficient removal of material by laser ablation than the scenario graded by letter "C". The numbers in Table 8 are the deepest via depth (in μm) data obtained from the "filtered histogram" analysis. The diameters of the ablated vias were around 30-50 μm.

From Table 8, it is apparent that the coating CG-16 has much better ablation than the other samples, especially the control and CG-8, for which the ablation starts only at 16 pulses. As to the coating CG-(A-OH), with the addition of anthracene methanol that absorbs at around 355 nm, its ablation starts as early as CG-16, but the removal of material is less complete. As laser pulses increase, the ablation depth for coating CG-(A-OH) increases and the central material bulk decreases in size due to laser ablation, but only at 16 pulses does the central bulk material disappear. These preliminary results suggest the efficacy of the "carrier gas" generating oxalyl group. However, it appears that a relatively large amount of OXT-DMO is needed to achieve optimal ablation. As to the difference observed between coating CG-(A-OH) and CG-16, the explanation may be that, for materials doped by polyaromatic compounds (such as the anthracene methanol), ablation is based on a photothermal mechanism: the material is heated up by the thermal energy converted from the laser photon energy absorbed by those absorbent chromophores (Lippert et al., "Chemical and Spectroscopic Aspects of Polymer Ablation: Special Features and Novel Directions," Chem. Rev., 103(2):453-485 (2003); and Fukumura et al., "The Mechanism of Dopant-Induced Laser Ablation. Possibility of Cyclic Multiphotonic Absorption in Excited States," Chem. Phys. Lett., 221(5-6):373-378 (1994), which are hereby incorporated by reference). On the other hand, although the ablation of OXT-DMO sensitized samples is also most probably based on the photothermal mechanism since the OXT-DMO and the coating material has no absorption at 355 nm, the laser energy utilization may follow a different route. It was reported that during laser ablation, unlike pyrolysis, where the sample temperature is raised in a relative slow fashion and the decomposition of the sample is characterized by cleaving the weakest bond, the ablative thermal decomposition will raise the sample temperature almost instantaneously to a value that is high enough to activate most possible decomposition paths simultaneously (Blanchet, J. Appl. Phys., "Laser Ablation and the Unzipping of Addition Polymer," 80(7):4082-4089 (1996), which is hereby incorporated by reference). Therefore, for the ablation of OXT-DMO containing films, due to the decomposition tendency of the oxalyl group, the OXT-DMO may easily and simultaneously decompose into several gaseous fragments during the laser ablation process. Consequently, the released "carrier gases" such as CO and $C_2O$ may effectively eject more film material from the ablation site to create a cleaner hole.

While the initial UV laser ablation result after incorporating OXT-DMO was encouraging, the synthesis and purification of OXT-DMO was lengthy and gave low yields. On the other hand, it was thought that it might be possible to achieve better laser ablation with a sensitizer molecule having a 355 nm UV absorbing chromophore (such as anthracene or naphthalene) and oxalyl groups chemically linked together. It was thought that, perhaps, in such a structure, the laser energy absorbed by the chromophore can be efficiently transferred to the oxalyl groups intramolecularly and, consequently, induce the decomposition of oxalyl groups into carrier gases either thermally or photochemically. It was also thought that, if these two functional groups are linked closely enough, they might synergistically respond to the incident laser energy and decompose photochemically, thus minimizing energy loss during energy transfer process.

Thus, subsequent synthesis efforts were focused on the design of sensitizer molecules embodying the above considerations. Since the synthesis trials using transesterification and esterification routes were not promising, the hydroxyl-acid chloride reaction shown in Scheme 4B was chosen as an alternative. With this chemistry, a series of "carrier gas" laser ablation sensitizers with UV absorbing chromophores and oxalyl groups bound to one molecule were systematically designed and synthesized. Table 5 provides the synthesis and purification details for these sensitizers and their nominal structures are shown in Table 4. Their characterization information is given below.

Na-MOC was characterized by GC-MS analysis and UV-Vis spectroscopy. The GC chromatogram showed a 9.73 min peak. This peak was attributed to unreacted 2-Na—OH, and this attribution was confirmed by a GC-MS experiment with the pure 2-Na—OH sample. The GC chromatogram also showed a 11.80 min peak (attributed to Na-MOC). The MS spectrum of Na-MOC showed its molecular ion peak m/z=230 (the theoretical molecular weight of Na-MOC being 230.22). The product contained >80% Na-MOC. The UV-Vis spectrum of Na-MOC has more extended absorption (up to 400 nm) than that of naphthalene, which is believed to be the result of the linkage of two conjugated groups (the naphthalene group and the oxalyl group). Consequently, Na-MOC not only has naphthalene and oxalyl group directly bound to each other in one sensitizer molecule as desired, it also has the extra advantage of extended UV absorption covering the incident laser wavelength at 355 nm.

The synthesis of P—Na is described hereinabove in Example 2. It had a purity of 95.5% as indicated by HPLC peak area integration.

For the synthesis of H-MOC, P-MOC, and P-MOC—Na, the concept was to attach multiple oxalyl groups to one polyol molecule, so that more gaseous product would be generated upon the decomposition of the sensitizer molecule. The hyperbranched polyester type polyols H and P proved to be the suitable starting materials for further chemical "decoration" due to their multiple hydroxyl functional groups (16 and 15 theoretical hydroxyl groups per molecule for polyol H and P, respectively). The H-MOC, P-MOC, and P-MOC—Na were characterized using FTIR and UV-Vis. Compared to the starting polyols P and H, a distinct feature in the FTIR spectra of these products is the decrement of the hydroxyl peak at 3300-3400 cm$^1$ and the increment of carbonyl peak at ~1750 cm$^1$, indicating the attachment of oxalyl group by reacting some of the polyol hydroxyl groups. The UV-Vis spectra of these synthesis products are all different from the starting material (H or P), which has only a weak absorption around 250 nm. Also, it is noticed that, after the attachment of naphthalene, as in the case of P-MOC—Na, the UV-Vis absorption of the sensitizer molecule is extended to around 350 nm.

The effect of "carrier gas" laser ablation sensitizers in photopolymerized films was studied and the results are presented below.

The designed "carrier gas" sensitizers were added into the master base ("MB") formulation to make sensitized coatings; the addition amount was ~3-5 wt % for H and P based sensitizers and <0.5 wt % for the others. For better comparison, these formulations were divided into groups A and B as shown in Table 6. Group A includes coatings with H derivatized sensitizers and other formulations, and Group B includes all coatings containing P derivatized sensitizers. These coatings, together with the control sample, were then characterized by RTIR and TGA followed by UV laser ablation to examine the effect of the added sensitizers.

Figure 9A:
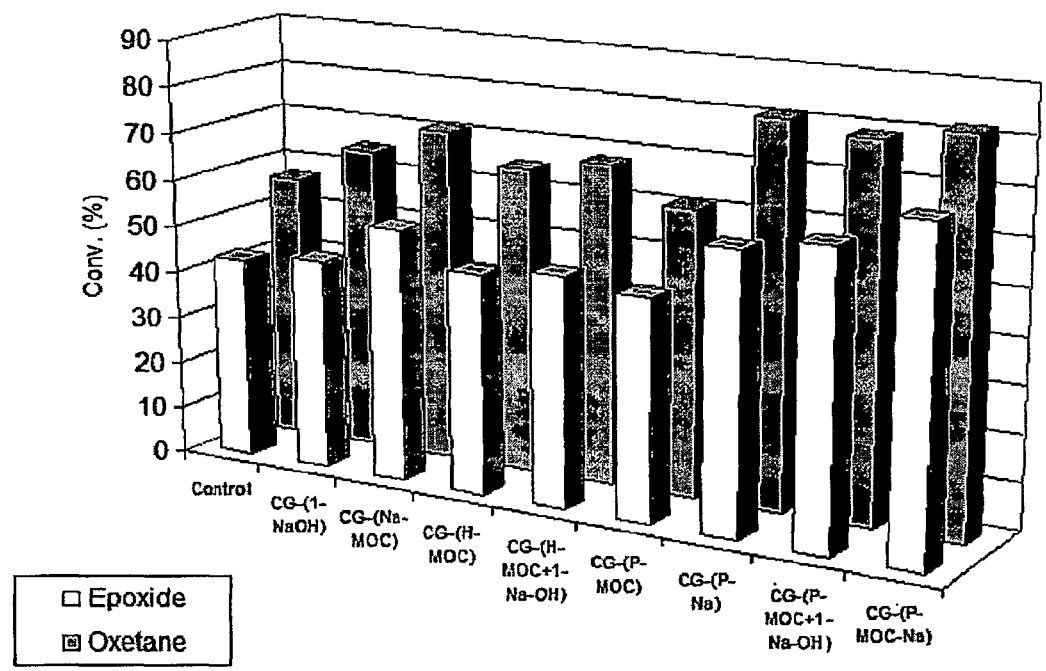
FIGS. 9A-9B are bar graphs showing reactive functional group conversion at 120 s as determined by real time FTIR experiments (FIG. 9A) and showing $T_g$s (FIG. 9B) for sensitized coatings containing various carrier gas additives of the present invention and for control coatings.
Figure 9B:
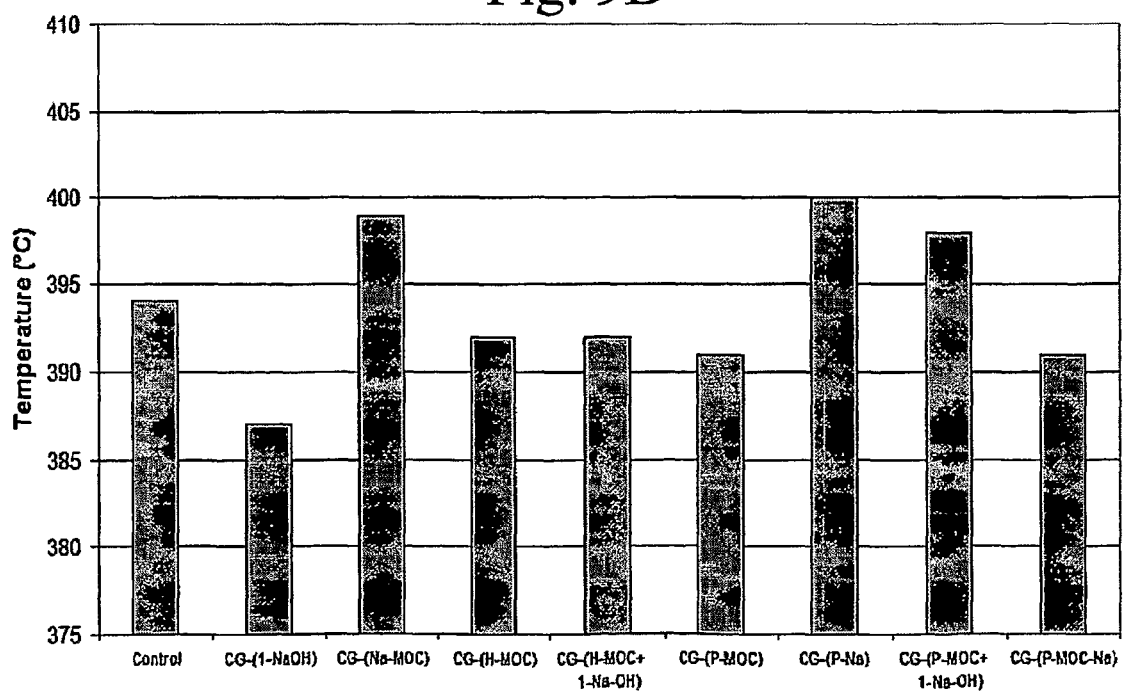

The RTIR experimental results are shown in FIG. 9A, where it can be seen that none of the sensitized coatings exhibit deterred UV curing compared to the control sample. A slight increase in reactive functional group conversion is observed after the addition of H-MOC or P-MOC, while an appreciable increase in reactive functional group conversion after the addition of naphthalene derivatives is noticed (which is attributed to their photosensitizing effect (Crivello et al., "Development of Pyrene Photosensitizers for Cationic Photopolymerizations," *Chem. Mater.*, 14 (11):4858-4866 (2002); Nelson et al., "Photosensitization of Cationic Photopolymerizations by Anthracene and its Derivatives," *Polymeric Materials Science and Engineering* 69:363-364 (1993); Cho et al. "Dual Curing of Cationic UV-Curable Clear and Pigmented Coating Systems Photosensitized by Thioxanthone and Anthracene" *Polymer Testing*, 22 (6):633-645 (2003); and Hua, which are hereby incorporated by reference)). The extended. UV absorption may account for the extraordinary photosensitizing effect of Na-MOC. It should also be noticed that, when the naphthalene is chemically bound to a polyol species, the resultant sensitizer provides a much more pronounced photosensitization effect (as can be seen in the case of P—Na and P-MOC—Na). This phenomenon can be explained by the Intramolecular Hydrogen Abstraction Photosensitization mechanism as proposed and discussed hereinabove in Example 3, while the even better photosensitization effect of P-MOC—Na (relative to P—Na) may due to the strengthened UV absorption of P-MOC—Na molecule caused, perhaps, by the conjugated oxalyl groups. As to the thermal stability, the TGA results are set forth in FIG. 9B and showed no significant change of $T_d$ for sensitized samples as compared to control sample: all of the $T_d$s varied within a 15° C. range around 390° C.

The variation in chemistry and molecular structure of the sensitizer molecules resulted in a significant difference in the UV laser ablation performance of the sensitized coatings. Tables 9A and 9B summarize the via's deepest depth for the Group A and Group B coatings, respectively. In Tables 9A and 9B, the designations "B", "C", and "T" have the meanings set forth above in connection with Table 8. As in Table 8, the numbers in Tables 9A and 9B are the deepest via depth (in μm), as obtained from the "filtered histogram" analysis.

TABLE 9A

| Pulses/ Sensitized Coatings | CG-(1-Na—OH) | CG-(Na-MOC) | CG-(H-MOC) | CG-(H-MOC+1-Na—OH) |
|---|---|---|---|---|
| 1 | B | B (55.1) | B (44.9) | C (55.6) |
| 2 | B (55.9) | C (76.3) | B (54.3) | C (56.3) |
| 4 | B (39.5) | T (113.5) | C (68.2) | C (79.2) |
| 8 | B (63.0) | | T (105.5) | T (104.0) |
| 16 | T (94.0) | | | |

TABLE 9B

| Pulses/ Sensitized Coatings | CG-(P—Na) | CG-(P-MOC-Na) | CG-(P-MOC) | CG-(P-MOC+1-Na—OH) |
|---|---|---|---|---|
| 1 | B (61.7) | C (71.3) | B (23.3) | C (72.4) |
| 2 | B (59.0) | C (72.3) | B (24.0) | T (99.5) |
| 4 | C (69.6) | C (85.1) | B (95.0) | |
| 8 | T (124.0) | C (85.3) | T (103.0) | |
| 16 | | C (113) | | |

Figure 10A:
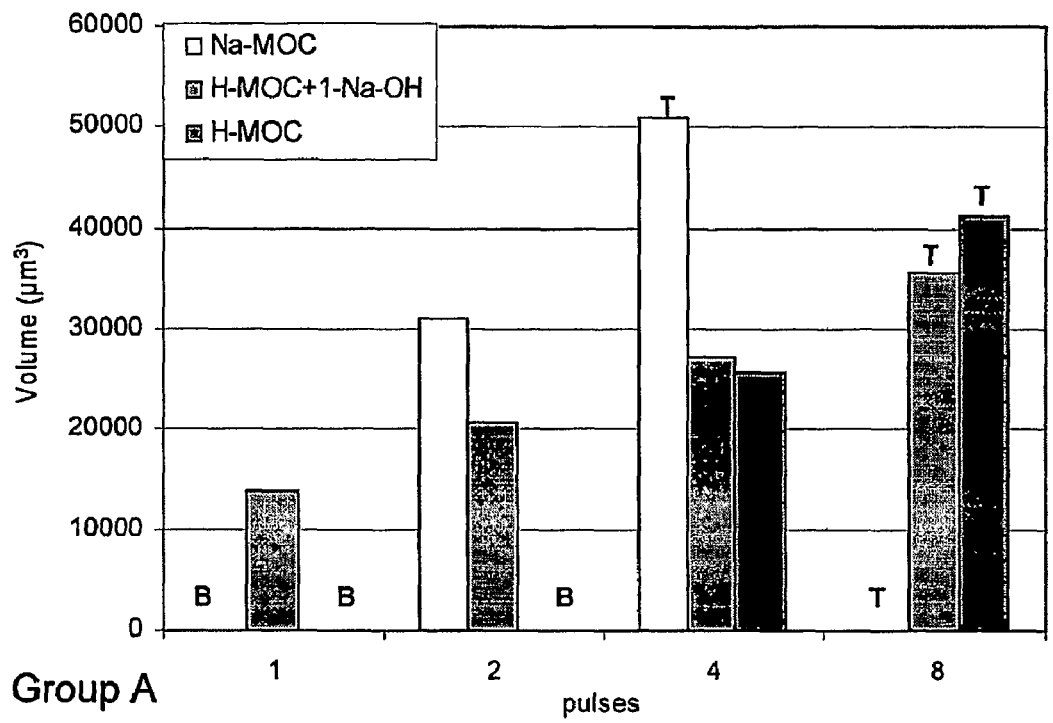
FIGS. 10A-10B are bar graphs showing volumes of vias formed by laser ablation of some sensitized Group A (FIG. 10A) and Group B (FIG. 10B) coatings containing various carrier gas additives of the present invention as a function of the number of laser pulses. The letter "B" indicates the presence of bulk materials in the center of the via, and the letter "T" indicates a through hole ablated in the coating film.
Figure 10B:
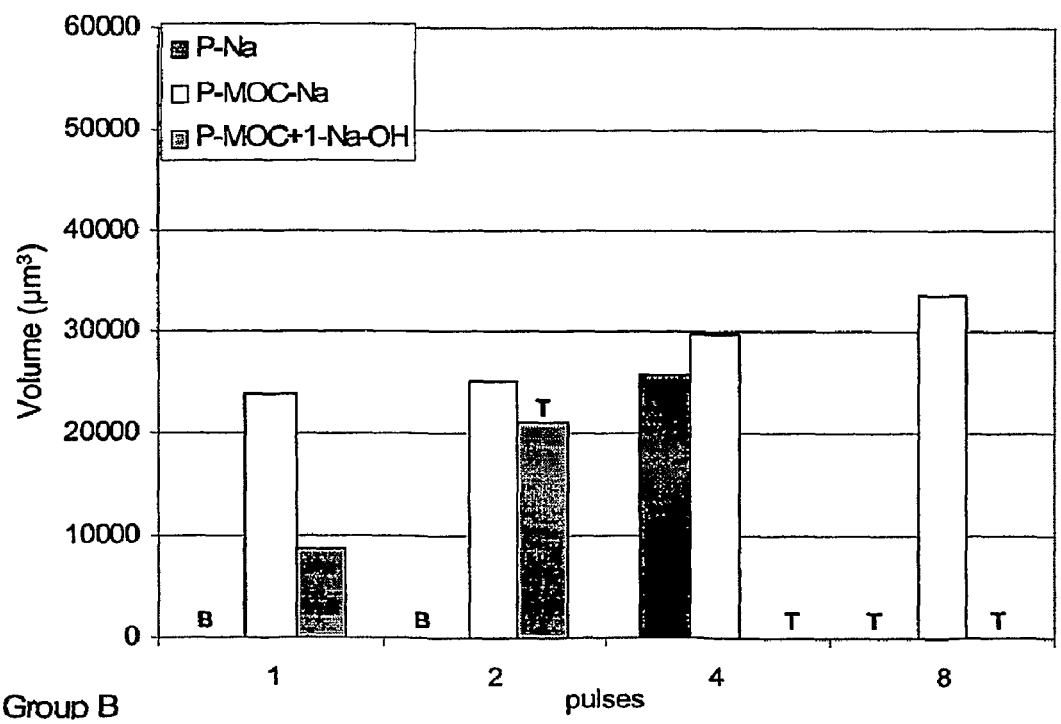

The volume data of some better ablated vias in Group A and Group B were also obtained using the "multiple region analysis" tool in the Vision 32 software, and these data are presented in FIGS. 10A and 10B. The via volume data may be a better representation of how well the via is ablated.

From the ablation data, it is first noticed that the UV laser ablation performance of all sensitized samples is much better than the control sample for which the ablation does not start until 16 pulses (as shown in Table 8), while all the sensitized samples begin to be ablated within two pulses. For the Group A coatings, in terms of laser ablation performance, they can be ranked in the following order (from better to worse): CG-(Na-MOC)>CG-(H-MOC+1-Na—OH)>CG-(H-MOC)>CG-(1-Na—OH). The addition of the naphthalene derivative alone (CG-(1-Na—OH)) gives the least efficient removal of material at the ablation site. When the carrier gas generation moiety is added (CG-(H-MOC)), a cleaner and deeper via (compared to CG-(1-Na—OH)) is achieved at 4 pulses. When both naphthalene and oxalyl groups are present in the formulation, as in the case of CG-(Na-MOC) and CG-(H-MOC+1-Na—OH), a synergistic effect that gives much better laser ablation can be observed: both formulations achieved a clean, deep hole within 2 pulses. A scenario can be envisioned to explain the better ablation of these two samples: the more "vulnerable" oxalyl functional group utilizes the energy absorbed by the laser energy absorber (e.g., the naphthalene moiety), either thermally or photochemically, and decomposes into carrier gases which then create a larger and cleaner via. Furthermore, by comparing the ablation data for coating CG-(Na-MOC) and CG-(H-MOC+1-Na—OH), it is noticed that the ablated holes of CG-(Na-MOC) are deeper and larger than that of CG-(H-MOC+1-Na—OH). Therefore, it seems the synergistic effect is more effective when the two functional groups (e.g., a naphthalene moiety and an oxalyl group) are chemically bound to each other instead of just physically blended. The explanation for this may be that, for sensitizer Na-MOC, since its naphthalene and oxalyl group are directly linked to each other, it has a more extended UV absorption than 1-Na—OH (e.g., as a result of conjugation). It is also very possible that the oxalyl group can directly utilize the laser energy absorbed by the whole Na-MOC molecule to decompose into carrier gases, so energy loss during energy transfer is minimized. The decomposition of Na-MOC is most probably a photochemical process. As to the physical blend of H-MOC and 1-Na—OH, a plausible energy utilization route is as follows: the absorbed laser photon energy is converted to thermal energy by naphthalene first; and the thermal energy is then transferred though the coating medium to the H-MOC molecule and thermally decomposes it. This process is less efficient considering the loss during energy transportation. The other difference between sample CG-(Na-MOC) and CG-(H-MOC+1-Na—OH) is that the sample CG-(H-MOC+1-Na—OH) contains 7 times more oxalyl groups than CG-(Na-MOC). Also, the Polyol H in H-MOC brings in additional ester groups. The existence of a large number of potential carrier gas generation moieties will likely compensate for its less efficient energy utilization process during laser ablation of the coating, which may account for the difference observed at the first ablation pulse for these two formulations.

Sensitized coating samples in Group B are all Polyol P based derivatives. Their ablation performance can be ranked as follows (from better to worse): CG-(P-MOC—Na)>CG-(P-MOC+1-Na—OH)>CG-(P—Na)>CG-(P-MOC). The effect of P—Na is better than 1-Na—OH and P-MOC, which may be due to the fact that naphthalene is attached to a polyester polyol, so it is easier for the ester groups to intramolecularly utilize the laser energy absorbed by naphthalene to decompose and generate carrier gases. However, such utilization may not be photochemical. The better laser ablation performance of CG-(P-MOC—Na) and CG-(P-MOC+1-Na—OH) is understandable because of the decomposition tendency of the oxalyl group and its synergistic effect with naphthalene (as discussed above in connection with the Group A results). Ablated vias of CG-(P-MOC—Na) are larger in volume than those of CG-(P-MOC+1-Na—OH), and this may be due to the more efficient intramolecular energy utilization process.

When comparing the best samples from Groups A and B, it is found that the via volume for CG-(Na-MOC) is larger than that of CG-(P-MOC—Na), even though both are considered to have an intramolecular synergistic effect. However, by envisioning the theoretical structure of P-MOC—Na as shown in Table 4, this observation can be accounted for. The hyperbranched core of P-MOC—Na is Polyol H, which is the main ingredient of Polyol P. It has 8 branches with 16 hydroxyl groups on one molecule. For the synthesis of P-MOC—Na, the reactant ratio is Polyol P:MOC:1-Na Cl=1:5:1. Therefore, statistically, naphthalene is still not that close to the oxalyl groups, and, consequently, the energy transfer may not be as facile and efficient as in Na-MOC. It is believed that, if more oxalyl groups are attached, the intramolecular synergistic effect may be more pronounced. However, in spite of this, it is obvious that the combination of the carrier gas generation group and UV absorber results in much better laser ablation.

Figure 11A:
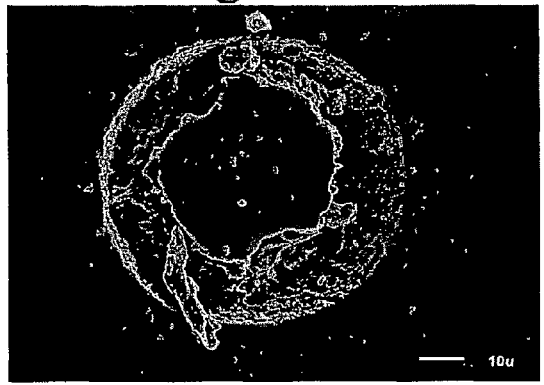
FIGS. 11A-11E are SEM images of vias formed by laser ablation of some sensitized coatings containing various carrier gas additives of the present invention.
Figure 11B:
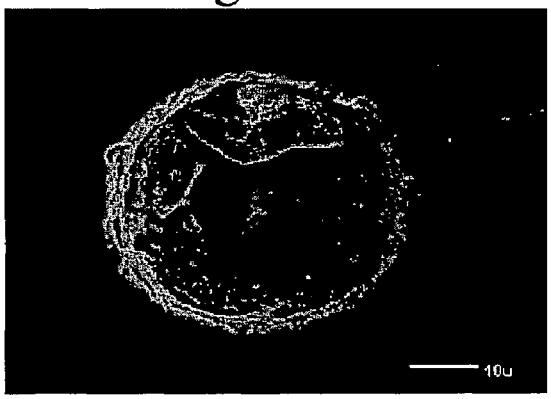
Figure 11C:
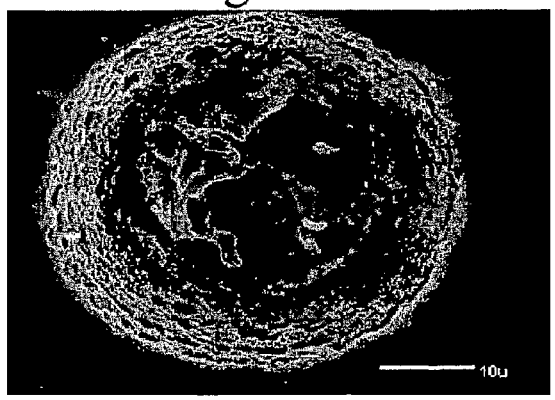
Figure 11D:
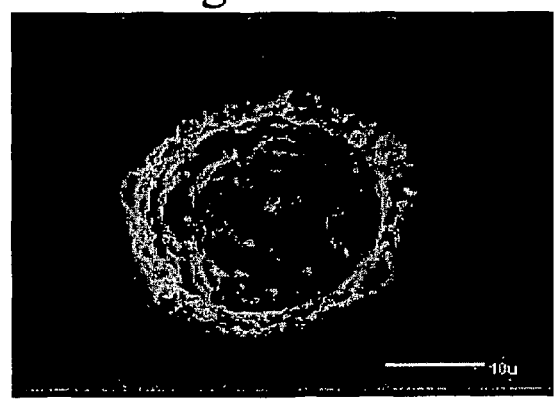
Figure 11E:
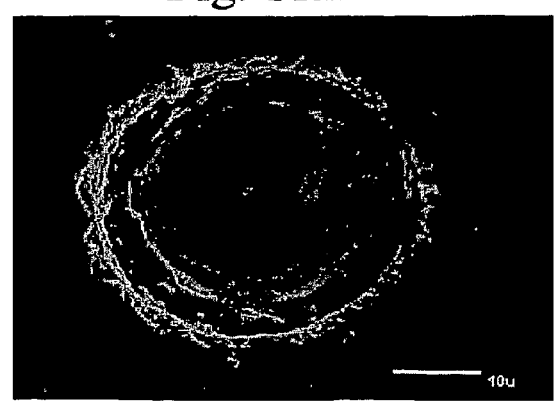

SEM images were taken for some of the ablated vias, and these are shown in FIGS. 11A-11E. These images further corroborate the results obtained from profilometry. For sample CG-(1-Na—OH), even at 16 pulses, the material is not completely removed at the ablation site, and ablation debris can be seen deposited at and around the ablation site. As for the CG-(Na-MOC) and CG-(P—Na) samples, the ablation of CG-(Na-MOC) at 2 pulses gives cleaner material removal inside the ablated via than the ablation of sample CG-(P—Na) at 4 pulses. A more amazing scenario is observed for samples CG-(P-MOC+1-Na—OH) (FIG. 11D) and CG-(P-MOC—Na) (FIG. 11E). Even at 1 pulse, the ablation of both samples gives a much cleaner ablated via than any of the samples shown in FIGS. 11A, 11B and 11C. These SEM images provide direct visual evidence that further confirm the effect of the carrier gas sensitizers and the synergistic effect during laser ablation.

Example 7

Preparation and Characterization of Additional Carrier Gas Laser Ablation Sensitizers and Studies of Their Enhancement of Laser Ablation Performance As described in Examples 4-6, a series of novel "carrier gas" laser ablation sensitizers were designed and synthesized by utilizing naphthalene as the UV laser energy absorber and the oxalyl group as the carrier gas generator. These sensitizers were then characterized by GC-MS, HPLC, FTIR, and UV-Vis. The synthesis and purification of OXT-DMO was difficult though enhanced laser ablation of a cationic UV curable coating was observed. The hydroxyl-acid chloride chemistry provided a facile, high yield route for the synthesis and purification of "carrier gas" sensitizers. Sensitizers were added into a master base formulation with the ratio of 0.0001 mol/5 g master base to formulate different sensitized coatings. Compared to the control sample, the sensitized coatings had no deterred UV curing and no significant change of thermal stability as revealed by RTIR and TGA respectively, while optical profilometry and SEM revealed that all the sensitized coating samples were much better ablated than the control in 355 nm laser ablation experiments. Furthermore, it was shown that the addition of naphthol or oxalyl modified polyols alone did not greatly enhance the material removal during UV laser ablation, either due to the thermal effect or lack of absorption of the laser energy. On the other hand, the combination of both naphthalene and oxalyl groups, either blended or chemically bonded, showed a synergistic effect that results in much deeper, larger, and cleaner ablated vias. One particular sensitizer, Na-MOC, with naphthalene and oxalyl group bound directly in one molecule, was found to be especially effective considering its low addition level (<0.5 wt %) and the resultant laser ablation enhancement. This result can be accounted for by Na-MOC's extended UV absorption and more efficient intramolecular utilization of the absorbed laser energy to generate carrier gases.

In this Example 7, we describe the synthesis and of two additional carrier gas laser ablation sensitizers, 9-Ph-OX and 2-OX—Na, and their effect on laser ablation performance.

The chemical structures of 9-Ph-OX and 2-OX—Na are set forth below:

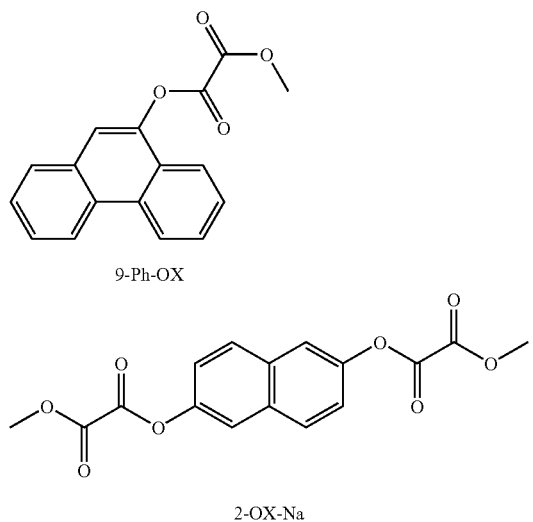

9-Ph-OX

2-OX-Na

The synthesis of 9-Ph-OX was carried out by adding 0.388 g of 9-phenanthrol, 0.4 g mono-methyl oxalyl chloride, and 10 g THF together. The mixture was chilled in an ice/water bath with nitrogen purge and magnetic stirring. 2 g of TEA was then added into the mixture dropwise. A white precipitate formed soon after TEA addition. The mixture was then stirred for another 15 minutes. The precipitate was filtered with filter paper, and the residual product solution was dried using air-blowing and vacuum for about 2 hours at room temperature. The product was collected as a bright yellow powder.

The synthesis of 2-OX—Na was carried out by the same procedure as was used for the synthesis of 9-Ph-OX, using 2,6-naphthalenediol in place of the 9-phenanthrol. The product was collected as a pale yellow powder.

The 9-Ph-OX and 2-OX—Na were characterized by GC-MS analysis and UV-Vis spectroscopy. GC-MS analysis showed the purity of 9-Ph-OX and 2-OX—Na to be about 70% and about 50%, respectively. UV-vis spectroscopy showed extended UV absorption in the far UV region greater than the starting material chromophores (9-phenanthrol and 2,6-naphthalenediol). The extinction coefficients at 355 nm for 9-Ph-OX and 2-OX—Na, for several of the carrier gas laser ablation sensitizers (prepared in Example 5), and for 1-naphthol were determined by UV-Vis spectroscopy. The results are presented in Table 12.

TABLE 12

| Compound | Extinction Coefficient |
| --- | --- |
| 1-naphthol | 2.2705 $M^{-1}$ |
| Na-MOC | 20.142 $M^{-1}$ |
| P—Na-MOC | 0.8394 $M^{-1}$ |
| 9-Ph-OX | 9.1817 $M^{-1}$ |
| 2-OX-Na | 143.45 $M^{-1}$ |

Laser ablation experiments were carried out as described in Examples 4 and 5. The ablated coating samples were CG06-(2-OX—Na) and CG06-(9-Ph-OX). The coating formulation was 80% UVR6110, 15% OXT101, 4% UVI6974, with the addition of 0.1 mmol sensitizer/5 g coating sample. The sensitizers used are 2-OX—Na and 9-Ph-OX. The average ablation rate (um/pulse) was calculated, and the results are presented in Table 13.

TABLE 13

| Sample | Average Ablation Rate (um/pulse) at Fluence Level of ~786 mJ/cm$^2$ |
| --- | --- |
| Kapton | 0.43 |
| CG06-(2-OX-Na) | 0.504 |
| CG06-(9-Ph-OX) | 0.64 |

The data presented in Table 13 shows that the sensitized samples have a higher ablation rate than the Kapton control under the same ablation conditions.

Figure 12A:
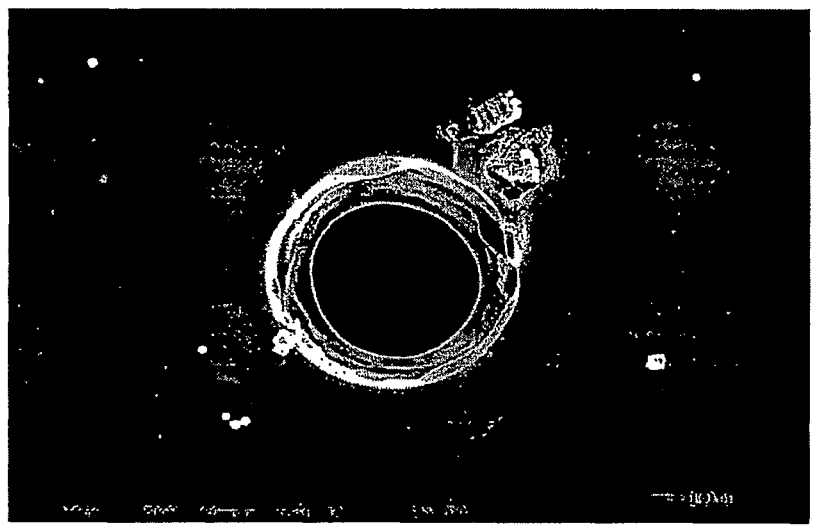
FIGS. 12A-12C are SEM images of vias formed by laser ablation of some sensitized coatings containing various carrier gas additives of the present invention (FIGS. 12A and 12B) and of a non-sensitized coating (FIG. 12C).
Figure 12B:
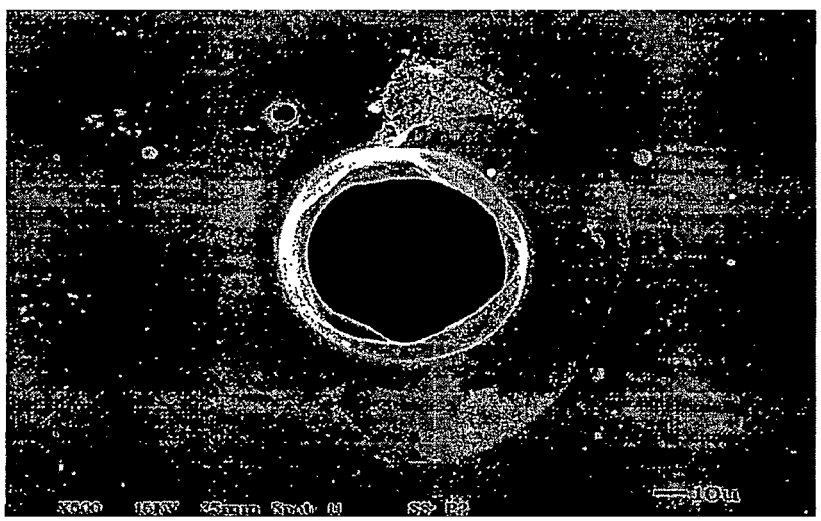
Figure 12C:

SEM images were obtained to examine ablation cleanliness. The results are set forth in FIGS. 12A, 12B, and 12C for CG06-(9-Ph-OX), CG06-(2-OX—Na), and the Kapton control, respectively. As FIGS. 12A-12C show, the non-sensitized sample (FIG. 12C) has a significant amount of ablation debris around the hole, whereas the sensitized samples (FIGS. 12A and 12B) have much less ablation debris around the hole.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention, as defined in the claims which follow.

What is claimed is:

1. An oxalyl-containing sensitizer having the formula:

Q—O—C(O)—C(O)—O—R$^1$ wherein Q represents a fused aromatic moiety and R$^1$ is an alkyl or aryl group.

2. An oxalyl-containing sensitizer according to claim 1, wherein Q represents a naphthalene moiety.

3. An oxalyl-containing sensitizer according to claim 1, wherein R$^1$ represents a lower alkyl group.

4. An oxalyl-containing sensitizer according to claim 1, wherein R$^1$ represents a methyl group.

5. An oxalyl-containing oxetane resin having the formula:

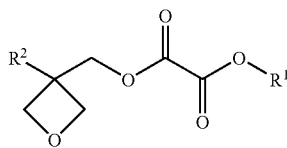

wherein $R^2$ represents a hydrogen atom or a substituted or unsubstituted alkyl group and wherein $R^1$ represents an alkyl or aryl group.

6. An oxalyl-containing oxetane resin according to claim 5, wherein $R^1$ represents a lower alkyl group and wherein $R^2$ represents a lower alkyl group.

7. An oxalyl-containing oxetane resin according to claim 5, wherein $R^1$ represents a methyl group and wherein $R^2$ represents an ethyl group.

8. An oxalyl-containing polyester polyol having the formula:

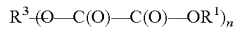

wherein $R^3$ represents a polyester polyol, wherein $R^1$ represents a lower alkyl group, and wherein n is an integer equal to or greater than 1.

9. An oxalyl-containing polyester polyol according to claim 8, wherein $R^1$ represents a lower alkyl group.

10. An oxalyl-containing polyester polyol according to claim 8, wherein $R^1$ represents a methyl group.

11. An oxalyl-containing polyester polyol according to claim 8, wherein the oxalyl-containing polyester polyol is an oxalyl-containing sensitizing polyester polyol.

12. An oxalyl-containing polyester polyol according to claim 8, wherein the oxalyl-containing sensitizing polyester polyol has the formula:

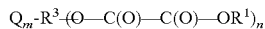

wherein Q represents a fused aromatic moiety and wherein m is an integer equal to or greater than 1.

13. A coating formulation comprising an oxalyl-containing additive selected from the group consisting of:
(a) an oxalyl-containing sensitizer having the formula:

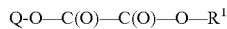

wherein Q represents a fused aromatic moiety and $R^1$ is an alkyl or aryl group;
(b) an oxalyl-containing oxetane resin having the formula:

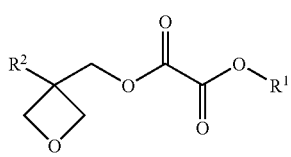

wherein $R^2$ represents a hydrogen atom or a substituted or unsubstituted alkyl group and wherein $R^1$ represents an alkyl or aryl group; and
(c) an oxalyl-containing polyester polyol having the formula:

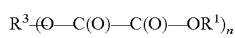

wherein $R^3$ represents a polyester polyol, wherein $R^1$ represents a lower alkyl group, and wherein n is an integer equal to or greater than 1.

14. A coating formulation according to claim 13, wherein the coating formulation is a cationic UV curable coating formulation.

15. A coating formulation according to claim 14, wherein the oxalyl-containing additive is an oxalyl-containing sensitizer.

16. A coating formulation according to claim 14, wherein the oxalyl-containing additive is an oxalyl-containing sensitizer according to claim 1.

17. A coating formulation according to claim 14, wherein the oxalyl-containing additive is an oxalyl-containing oxetane resin.

18. A coating formulation according to claim 17, wherein the coating formulation further comprises:
a fused aromatic sensitizer.

19. A coating formulation according to claim 18, wherein the fused aromatic sensitizer is a hydroxy naphthalene.

20. A coating formulation according to claim 14, wherein the oxalyl-containing additive is an oxalyl-containing oxetane resin.

21. A coating formulation according to claim 14, wherein the oxalyl-containing additive is an oxalyl-containing oxetane resin according to claim 5.

22. A coating formulation according to claim 14, wherein the oxalyl-containing additive is an oxalyl-containing polyester polyol.

23. A coating formulation according to claim 22, wherein the coating formulation further comprises:
a fused aromatic sensitizer.

24. A coating formulation according to claim 23, wherein the fused aromatic sensitizer is a hydroxyl naphthalene.

25. A coating formulation according to claim 14, wherein the oxalyl-containing additive is an oxalyl-containing polyester polyol according to claim 8.

26. A coating formulation according to claim 14, wherein the oxalyl-containing additive is an oxalyl-containing polyester according to claim 11.

27. A coating formulation according to claim 14, wherein the oxalyl-containing additive is an oxalyl-containing polyester polyol according to claim 12.

28. A coating formulation according to claim 14, wherein the coating formulation further comprises a difunctional cycloaliphatic epoxide and an oxetane diluent.

29. A coating formulation according to claim 28, wherein said coating formulation further comprises:
a photoinitiator.

30. A coating formulation according to claim 29, wherein said photoinitiator is a sulphonium initiator.

31. A polymerized coating comprising an oxayl-containing additive according to claim 13.

32. A polymerized coating comprising an oxayl-containing additive according to claim 14.

33. A method for producing a laser-ablatable film on a surface of a substrate, said method comprising:
coating the substrate with a coating formulation according to claim 13; and
polymerizing the coating formulation.

34. A method for producing a laser-ablatable film on a surface of a substrate, said method comprising:
coating the substrate with a coating formulation according to claim 14; and
polymerizing the coating formulation.

35. A method for producing a pre-selected pattern on a surface of a substrate, said method comprising:

producing a laser-ablatable film on a surface of a substrate in accordance with a method according to claim 33; and exposing the film to ultraviolet electromagnetic radiation under conditions effective to ablate a portion of the film to produce the pre-selected pattern.

36. A method for producing a pre-selected pattern on a surface of a substrate, said method comprising:

producing a laser-ablatable film on a surface of a substrate in accordance with a method according to claim 34; and exposing the film to ultraviolet electromagnetic radiation under conditions effective to ablate a portion of the film to produce the pre-selected pattern.

* * * * *